United States Patent
Nuyts et al.

(10) Patent No.: US 10,382,070 B2
(45) Date of Patent: Aug. 13, 2019

(54) COMMUNICATION APPARATUS AND METHOD

(71) Applicant: Huawei Technologies Co., Ltd., Shenzhen (CN)

(72) Inventors: Pieter Nuyts, Munich (DE); Patrick Vandenameele, Leuven (BE); Koen Cornelissens, Leuven (BE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/870,441

(22) Filed: Jan. 12, 2018

(65) Prior Publication Data

US 2018/0138928 A1 May 17, 2018

Related U.S. Application Data

(63) Continuation of application No. PCT/EP2015/067074, filed on Jul. 24, 2015.

(51) Int. Cl.
*H04B 1/00* (2006.01)
*H04B 1/12* (2006.01)
(Continued)

(52) U.S. Cl.
CPC .......... *H04B 1/0039* (2013.01); *H03J 5/0272* (2013.01); *H03L 7/185* (2013.01);
(Continued)

(58) Field of Classification Search
CPC .... H04B 1/0039; H04B 1/0028; H04B 1/005; H04B 1/126; H03J 5/0272; H03L 7/185
See application file for complete search history.

(56) References Cited

U.S. PATENT DOCUMENTS

2004/0170218 A1   9/2004  Molisch et al.
2007/0105513 A1*  5/2007  Son ...................... H04B 1/0064
                                                         455/132
(Continued)

FOREIGN PATENT DOCUMENTS

CN       1698283 A    11/2005
CN     101405946 A     4/2009
(Continued)

OTHER PUBLICATIONS

Foreign Communication From a Counterpart Application, PCT Application No. PCT/EP2015/067074, International Search Report dated Jun. 3, 2016, 7 pages.
(Continued)

*Primary Examiner* — Janice N Tieu
(74) *Attorney, Agent, or Firm* — Conley Rose, P.C.

(57) ABSTRACT

A communication apparatus including a first mixer configured to generate an analog output signal ($X_{OUT}$) from an analog input signal ($X_{IN}$) using a first mixing signal, a second mixer configured to generate an analog output signal ($Y_{OUT}$) from an analog input signal ($Y_{IN}$) using a second mixing signal, and a local oscillator configured to provide a reference frequency ($f_{REF}$), where the first mixer is configured to derive a first sampling frequency ($f_{S,1}$) from the $f_{REF}$, and where the second mixer is configured to derive a second sampling frequency ($f_{S,2}$) from the $f_{REF}$.

20 Claims, 30 Drawing Sheets

(51) Int. Cl.
*H03J 5/02* (2006.01)
*H03L 7/185* (2006.01)

(52) U.S. Cl.
CPC .......... *H04B 1/005* (2013.01); *H04B 1/0028* (2013.01); *H04B 1/126* (2013.01)

(56) References Cited

U.S. PATENT DOCUMENTS

| | | |
|---|---|---|
| 2007/0213019 A1 | 9/2007 | Devries et al. |
| 2008/0207160 A1* | 8/2008 | Toraichi .............. H03M 1/1265 455/334 |
| 2010/0159858 A1 | 6/2010 | Dent et al. |
| 2012/0322398 A1* | 12/2012 | Pullela ................. H03D 7/1466 455/302 |

FOREIGN PATENT DOCUMENTS

| | | | |
|---|---|---|---|
| CN | 102257734 | A | 11/2011 |
| EP | 3158649 | A1 | 4/2017 |
| WO | 2007104131 | A1 | 9/2007 |
| WO | 2016134750 | A1 | 9/2016 |

OTHER PUBLICATIONS

Foreign Communication From a Counterpart Application, PCT Application No. PCT/EP2015/067074, Written Opinion dated Jun. 3, 2016, 9 pages.

Foreign Communication From a Counterpart Application, Chinese Application No. 201580081889.3, Chinese Office Action dated Mar. 19, 2019, 7 pages.

\* cited by examiner

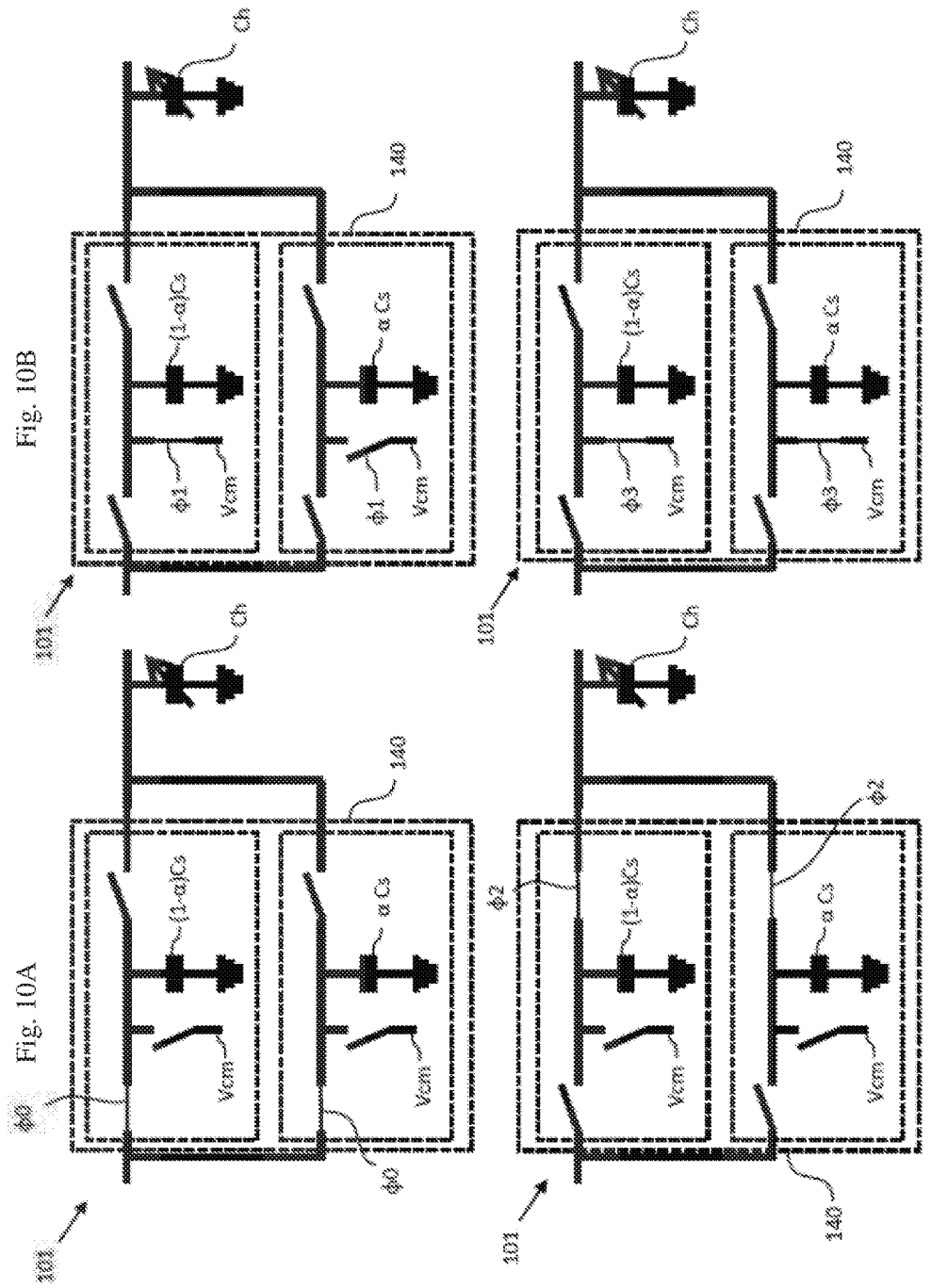

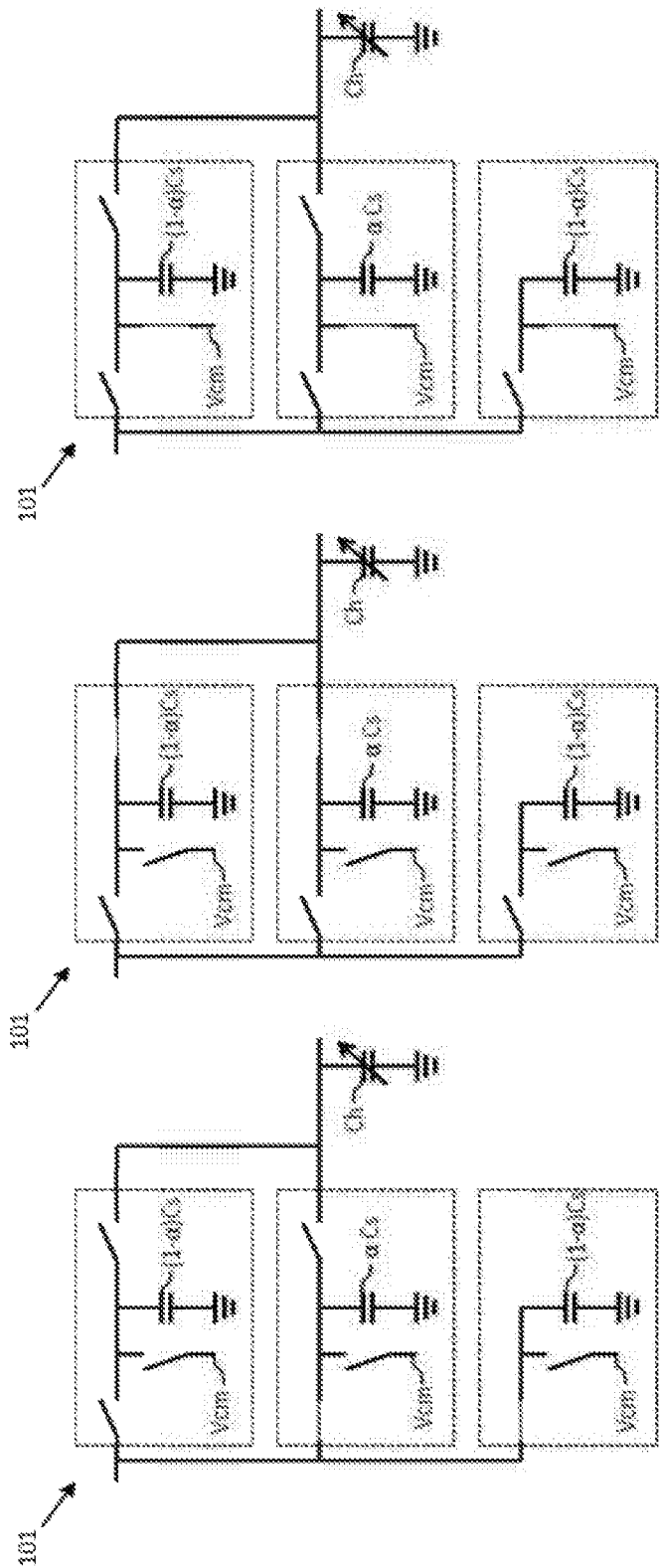

COMMUNICATION APPARATUS AND METHOD

CROSS-REFERENCE TO RELATED APPLICATION

This application is a continuation of International Patent Application No. PCT/EP2015/067074 filed on Jul. 24, 2015, the disclosure of which is hereby incorporated by reference in its entirety.

TECHNICAL FIELD

The present disclosure relates to a communication apparatus and method. In particular, the present disclosure relates to a communication receiver or a communication transmitter and a communication method.

BACKGROUND

Mobile wireless communication devices such as cellular telephones, smartphones, personal digital assistants (PDAs). etc. can be configured to communicate with other devices over a multitude of different frequencies. As such, mobile wireless communication devices are required to include communication receivers capable of receiving communication signals at a multitude of different frequencies. In some situations, it is desirable to receive and demodulate two or more communication signals in different frequency bands using a technique referred to as multi-carrier aggregation. In this way, a larger bandwidth is available so that more information can be transmitted per second to provide a more pleasing user experience.

To this end, conventional communication receivers often include mixers for performing a frequency up-conversion or a frequency down-conversion of the received communication signals using a sinusoidal mixing signal with a desired frequency. Conventionally, such mixers include a phase locked loop (PLL) for every frequency band, which, however, drastically increases area and power consumption of the communication receiver. A similar problem arises in frequency-division duplexing (FDD), where a mobile wireless communication device receives and transmits at the same time, but at different frequencies such that at last two PLLs are necessary.

Thus, there is a need for an improved communication apparatus and method, in particular an improved communication receiver or communication transmitter and communication method suitable for multi-carrier aggregation.

SUMMARY

It is an objective of the disclosure to provide an improved communication apparatus and method, in particular an improved communication receiver or communication transmitter and communication method suitable for multi-carrier aggregation.

This objective is achieved by the subject matter of the independent claims. Further implementation forms are provided in the dependent claims, the description and the figures.

According to a first aspect, the disclosure relates to a communication apparatus, comprising a first mixer configured to generate an analog output signal $X_{OUT}$ from an analog input signal $X_{IN}$ using a first mixing signal, the first mixer comprising a scaler being configured to sample the analog input signal $X_{IN}$ at a plurality of discrete points in time k with a first sampling frequency $f_{S,1}$ to obtain a sampled analog input signal $X_{IN}[k]$ having a continuous signal value, and to generate the analog output signal $X_{OUT}$ having a continuous signal value by scaling the sampled analog input signal $X_{IN}[k]$ on the basis of a plurality of scaling coefficients $A[k]$, wherein the scaling coefficients $A[k]$ are a time-discrete representation of the first mixing signal, a second mixer configured to generate an analog output signal $Y_{OUT}$ from an analog input signal $Y_{IN}$ using a second mixing signal, the second mixer comprising a scaler being configured to sample the analog input signal $Y_{IN}$ at a plurality of discrete points in time k with a second sampling frequency $f_{S,2}$ to obtain a sampled analog input signal $Y_{IN}[k]$ having a continuous signal value, and to generate the analog output signal $Y_{OUT}$ having a continuous signal value by scaling the sampled analog input signal $Y_{IN}[k]$ on the basis of a plurality of scaling coefficients $B[k]$, wherein the scaling coefficients $B[k]$ are a time-discrete representation of the second mixing signal, and a local oscillator configured to provide a reference frequency $f_{REF}$, wherein the first mixer is configured to derive the first sampling frequency $f_{S,1}$ from the reference frequency $f_{REF}$ and wherein the second mixer is configured to derive the second sampling frequency $f_{S,2}$ from the reference frequency $f_{REF}$.

In a first possible implementation form of the first aspect of the disclosure as such the first sampling frequency $f_{S,1}$ and/or the second sampling frequency $f_{S,2}$ is an integer multiple of the reference frequency $f_{REF}$, in particular equal to four times the reference frequency $f_{REF}$.

In a second possible implementation form of the first aspect of the disclosure as such or the first implementation form thereof the communication apparatus comprises a receiver or a transmitter and wherein the local oscillator is a dedicated local oscillator of the receiver or the transmitter, in particular an oscillator of a phase-locked-loop of the receiver or the transmitter.

In a third possible implementation form of the first aspect of the disclosure as such or any one of the first or second implementation form thereof the scaling coefficients $A[k]$ and/or the scaling coefficients $B[k]$ are a time-discrete representation of a sinusoidal function, a sum of multiple sinusoidal functions, a clipped sinusoidal function, a square wave function or another periodic waveform.

In a fourth possible implementation form of the first aspect of the disclosure as such or any one of the first to third implementation form thereof the scaling coefficients $A[k]$ are associated with data stored in a memory of the first mixer and the scaling coefficients $B[k]$ are associated with data stored in a memory of the second mixer.

In a fifth possible implementation form of the first aspect of the disclosure as such or any one of the first to fourth implementation form thereof the analog input signal $X_{IN}$ is equal to the analog input signal $Y_{IN}$, wherein the communication apparatus is configured to combine the analog output signal $Y_{OUT}$ of the second mixer with the analog output signal $X_{OUT}$ of the first mixer, in particular to subtract the analog output signal $Y_{OUT}$ of the second mixer from the analog output signal $X_{OUT}$ of the first mixer.

In a sixth possible implementation form of the first aspect of the disclosure as such or any one of the first to the fifth implementation form thereof the first mixing signal is associated with a first mixing frequency $f_{MIX,1}$ and the second mixing signal is associated with a second mixing frequency $f_{MIX,2}$, wherein the ratio of the first mixing frequency $f_{MIX,1}$ and the first sampling frequency $f_{S,1}$ is given by $f_{MIX,1}/f_{S,1} = A/B$ and/or the ratio of the second mixing frequency $f_{MIX,2}$ and the second sampling frequency $f_{S,2}$ is given by $f_{MIX,2}/f_{S,2}=A'/B'$, wherein A, B, A' and B' are integers.

In a seventh possible implementation form of the sixth implementation form of the first aspect of the disclosure the first sampling frequency $f_{S,1}$, is equal to the second sampling frequency $f_{S,2}$.

In an eighth possible implementation form of the sixth or seventh implementation form of the first aspect of the disclosure as such or any one of the first to seventh implementation form thereof the first mixing frequency $f_{MIX,1}$ differs from the second mixing frequency $f_{MIX,2}$.

In a ninth possible implementation form of the first aspect of the disclosure as such or any one of the first to eighth implementation form thereof the scaling coefficients A[k] of the first mixer are represented by a different number of bits than the scaling coefficients B[k] of the second mixer.

In a tenth possible implementation form of the first aspect of the disclosure as such or any one of the first to ninth implementation form thereof the communication apparatus further comprises a frequency divider being configured to reduce the reference frequency $f_{REF}$ of the local oscillator, wherein the first mixer is configured to derive the first sampling frequency $f_{S,1}$ from the reduced reference frequency and/or wherein the second mixer is configured to derive the second sampling frequency $f_{S,2}$ from the reduced reference frequency.

In an eleventh possible implementation form of the first aspect of the disclosure as such or any one of the first to tenth implementation form thereof the first mixer comprises an input terminal and an output terminal connected to the scaler of the first mixer, wherein the scaler of the first mixer comprises a plurality of unit cells connected in parallel to the input terminal, wherein each unit cell comprises a unit cell capacitor, wherein the unit cell capacitor of the $i^{th}$ unit cell has a capacitance $C_{ui}$ and wherein the sum of the capacitances of the unit cells defines a total capacitance $C_s$, and wherein each unit cell comprises a charge transfer switch for connecting the unit cell capacitor of each unit cell to the output terminal, wherein the scaler of the first mixer is configured to control the charge transfer switch of each unit cell for scaling the sampled analog input signal $X_{IN}[k]$ on the basis of the plurality of scaling coefficients A[k].

In a twelfth possible implementation form of the first aspect of the disclosure as such or any one of the first to eleventh implementation form thereof the second mixer comprises an input terminal and an output terminal connected to the scaler of the second mixer, wherein the scaler of the second mixer comprises a plurality of unit cells connected in parallel to the input terminal, wherein each unit cell comprises a unit cell capacitor, wherein the unit cell capacitor of the $i^{th}$ unit cell has a capacitance $C_{ui}$ and wherein the sum of the capacitances of the unit cells defines a total capacitance $C_s$, and wherein each unit cell comprises a charge transfer switch for connecting the unit cell capacitor of each unit cell to the output terminal, wherein the scaler of the second mixer is configured to control the charge transfer switch of each unit cell for scaling the sampled analog input signal $Y_{IN}[k]$ on the basis of the plurality of scaling coefficients B[k].

In a thirteenth possible implementation form of the eleventh or twelfth implementation form of the first aspect of the disclosure the plurality of unit cells comprises N unit cells, wherein the unit cell capacitors have the same capacitance $C_{ui}=C_u$ with $C_u$ being a constant capacitance and the total capacitance $C_s$ is given by $C_s=NC_u$.

In a fourteenth possible implementation form of the eleventh or twelfth implementation form of the first aspect of the disclosure the plurality of unit cells comprises b unit cells, wherein the unit cell capacitor of the $i^{th}$ unit cell has a capacitance $C_{ui}=2^{i-1}C_u$ with $C_u$ being a constant capacitance and the total capacitance $C_s$ is given by $C_s=(2^b-1)C_u$.

In a fifteenth possible implementation form of the eleventh or twelfth implementation form of the first aspect of the disclosure the plurality of unit cells comprises (b+K) unit cells, wherein the unit cell capacitor of the $i^{th}$ unit cell of the b unit cells of the plurality of unit cells has a capacitance $C_{ui}=2^{i-1}C_u$ with $C_u$ being a constant capacitance, and wherein the unit cell capacitors of the K remaining unit cells of the plurality of unit cells have the same capacitance $C_{ui}=2^b C_u$ and the total capacitance $C_s$ is given by $C_s=(2^b K+2^b-1)C_u$.

According to a second aspect the disclosure relates to a method for generating an analog output signal $X_{OUT}$ from an analog input signal $X_{IN}$ using a first mixing signal and an analog output signal $Y_{OUT}$ from an analog input signal $Y_{IN}$ using a second mixing signal, the method comprising the steps of providing a reference frequency $f_{REF}$, sampling the analog input signal $X_{IN}$ at a plurality of discrete points in time k with a first sampling frequency $f_{S,1}$ to obtain a sampled analog input signal $X_{IN}[k]$ having a continuous signal value and generating the analog output signal $X_{OUT}$ having a continuous signal value by scaling the sampled analog input signal $X_{IN}[k]$ on the basis of a plurality of scaling coefficients A[k], wherein the scaling coefficients A[k] are a time-discrete representation of the first mixing signal and wherein the first sampling frequency $f_{S,1}$ is derived from the reference frequency $f_{REF}$, and sampling the analog input signal $Y_{IN}$ at a plurality of discrete points in time k with a second sampling frequency $f_{S,2}$ to obtain a sampled analog input signal $Y_{IN}[k]$ having a continuous signal value and generating the analog output signal $Y_{OUT}$ having a continuous signal value by scaling the sampled analog input signal $Y_{IN}[k]$ on the basis of a plurality of scaling coefficients B[k], wherein the scaling coefficients B[k] are a time-discrete representation of the second mixing signal and wherein the second sampling frequency $f_{S,2}$ is derived from the reference frequency for.

The method according to the second aspect of the disclosure can be performed by the communication apparatus according to the first aspect of the disclosure. Further features of the method according to the second aspect of the disclosure result directly from the functionality of the communication apparatus according to the first aspect of the disclosure and its different implementation forms described above.

According to a third aspect the disclosure relates to a computer program comprising program code for performing the method according to the second aspect of the disclosure when executed on a computer.

The disclosure can be implemented in hardware and/or software.

BRIEF DESCRIPTION OF THE DRAWINGS

Further embodiments of the disclosure will be described with respect to the following figures, in which:

FIGS. 10A, 10B, 10C, and 10D show schematic diagrams illustrating the operational principle of a mixer that can be used in a communication apparatus according to an embodiment;

FIGS. 11A, 11B, and 11C show schematic diagrams illustrating the operational principle of a mixer that can be used in a communication apparatus according to an embodiment;

DETAILED DESCRIPTION OF EMBODIMENTS

In the following detailed description, reference is made to the accompanying drawings, which form a part of the disclosure, and in which are shown, by way of illustration, specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless noted otherwise.

Figure 1:
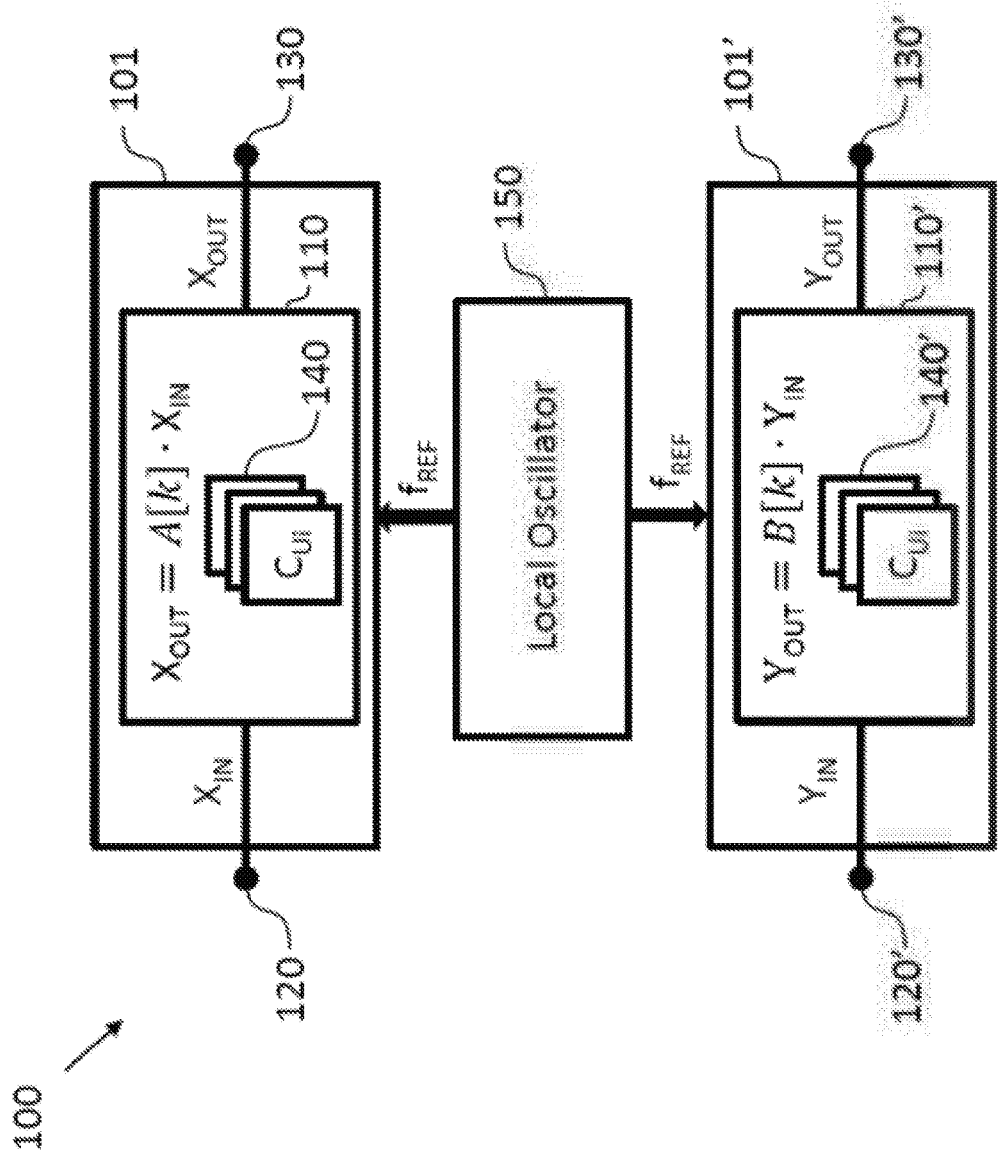
FIG. 1 shows a schematic diagram of a communication apparatus according to an embodiment.

FIG. 1 shows a schematic diagram of a communication apparatus 100 according to an embodiment. The communication apparatus 100 comprises a first mixer 101, a second mixer 101' and a local oscillator 150 providing both the first mixer 101 and the second mixer 101' with a reference frequency $f_{REF}$. In an embodiment, the communication apparatus 100 is a communication receiver or a communication transmitter. In an embodiment, the local oscillator 150 is a dedicated local oscillator of the communication receiver or the communication transmitter, in particular an oscillator of a PLL of the communication receiver or the communication transmitter.

The first mixer 101 is configured to generate an analog output signal $X_{OUT}$ from an analog input signal $X_{IN}$ using a first mixing signal. The first mixer 101 comprises a scaler 110 being configured to sample the analog input signal $X_{IN}$ at a plurality of discrete points in time k with a first sampling frequency $f_{S,1}$ to obtain a sampled analog input signal $X_{IN}[k]$ having a continuous signal value, and to generate the analog output signal $X_{OUT}$ having a continuous signal value by scaling the sampled analog input signal $X_{IN}[k]$ on the basis of a plurality of scaling coefficients A[k]. The scaling coefficients A[k] are a time-discrete representation of the first mixing signal.

The second mixer 101' is configured to generate an analog output signal $Y_{OUT}$ from an analog input signal $Y_{IN}$ using a second mixing signal. The second mixer 101' comprises a scaler 110' being configured to sample the analog input signal $Y_{IN}$ at a plurality of discrete points in time k with a second sampling frequency $f_{S,2}$ to obtain a sampled analog input signal $Y_{IN}[k]$ having a continuous signal value and to generate the analog output signal $Y_{OUT}$ having a continuous signal value by scaling the sampled analog input signal $Y_{IN}[k]$ on the basis of a plurality of scaling coefficients B[k]. The scaling coefficients B[k] are a time-discrete representation of the second mixing signal.

The local oscillator 150 is configured to provide the reference frequency $f_{REF}$, wherein the first mixer 101 is configured to derive the first sampling frequency $f_{S,1}$ from the reference frequency $f_{REF}$ and wherein the second mixer 101' is configured to derive the second sampling frequency $f_{S,2}$ from the reference frequency $f_{REF}$.

As will be described in more detail further below, in embodiments of the disclosure the communication apparatus 100 can comprises one or more additional mixers that are configured as the first mixer 101 and/or the second mixer 101' as well as one or more additional local oscillators that are configured as the local oscillator 150.

In an embodiment, the first sampling frequency $f_{S,1}$ and/or the second sampling frequency $f_{S,2}$ is an integer multiple of the reference frequency $f_{REF}$, in particular equal to four times the reference frequency $f_{REF}$.

In an embodiment, the scaling coefficients A[k] and/or the scaling coefficients B[k] are a time-discrete representation of a sinusoidal function, a sum of multiple sinusoidal functions, a clipped sinusoidal function, a square wave function or another periodic waveform, as will be described in more detail further below. For instance, the first mixing signal used by the first mixer 101 and/or the second mixing signal used by the second mixer 101' is a sinusoidal mixing signal with the scaling coefficients A[k] and B[k] given, for instance, by $A[k]=\cos(2\pi f_{MIX,1}kT_{S,1}+\theta_1)$ and $B[k]=\cos(2\pi f_{MIX,2}kT_{S,2}+\theta_2)$ with $f_{MIX,1}$ and $f_{MIX,2}$ being the mixing frequency of the first mixer 101 and the second mixer 101', $T_{S,1}$ and $T_{S,2}$ being the sampling periods corresponding to the first sampling frequency $f_{S,1}$ and the second sampling frequency $f_{S,2}$ and $\theta_1$ and $\theta_2$ being arbitrary phase angles.

In an embodiment, the scaling coefficients A[k] are associated with data stored in a memory of the first mixer 101 and the scaling coefficients B[k] are associated with data stored in a memory of the second mixer 101', as will be described in more detail further below.

In an embodiment, the analog input signal XI is equal to the analog input signal $Y_{IN}$ and the communication apparatus 100 is configured to combine the analog output signal $Y_{OUT}$ of the second mixer 101' with the analog output signal $X_{OUT}$ of the first mixer 101, in particular to subtract the analog output signal $Y_{OUT}$ of the second mixer 101' from the analog output signal $X_{OUT}$ of the first mixer 101, as will be described in more detail further below.

In an embodiment, the ratio between the mixing frequency of the first mixer 101, herein referred to as first mixing frequency $f_{MIX,1}$, and the first sampling frequency $f_{S,1}$ is given by $f_{MIX,1}/f_{S,1}=A/B$ and/or the ratio between the mixing frequency of the second mixer 101', herein referred to as the second mixing frequency $f_{MIX,2}$, and the second sampling frequency $f_{S,2}$ is given by $f_{MIX,2}/f_{S,2}=A'/B'$, wherein A, B, A' and B' are integers. In an embodiment, the first mixing frequency $f_{MIX,1}$ can differ from the second mixing frequency $f_{MIX,2}$. In an embodiment, the first sampling frequency $f_{S,1}$ used by the first mixer 101 for sampling the analog input signal $X_{IN}$ is equal to the second sampling frequency $f_{S,2}$ used by the second mixer 101' for sampling the analog input signal $Y_{IN}$.

In an embodiment, the scaling coefficients A[k] of the first mixer 101 are represented by a different number of bits than the scaling coefficients B[k] of the second mixer 101', as will be described in more detail further below.

In an embodiment, the communication apparatus 100 further comprises a frequency divider being configured to reduce the reference frequency $f_{REF}$ provided by the local oscillator 150 to obtain a reduced reference frequency, wherein the first mixer 101 is configured to derive the first sampling frequency $f_{S,1}$ from the reduced reference frequency and/or wherein the second mixer 101' is configured to derive the second sampling frequency $f_{S,2}$ from the reduced reference frequency.

In an embodiment, the first mixer 101 comprises an input terminal 120 and an output terminal 130 connected to the scaler 110 of the first mixer 101, wherein the scaler 110 of the first mixer 101 comprises a plurality of unit cells 140 connected in parallel to the input terminal 120. As will be described in more detail further below, each unit cell comprises a unit cell capacitor, wherein the unit cell capacitor of the $i^{th}$ unit cell has a capacitance $C_{ui}$ and wherein the sum of the capacitances of the unit cells defines a total capacitance $C_s$. As will be described in more detail further below, each unit cell comprises a charge transfer switch for connecting the unit cell capacitor of each unit cell to the output terminal 130, wherein the scaler 110 of the first mixer 101 is configured to control the charge transfer switch of each unit cell for scaling the sampled analog input signal $X_{IN}[k]$ on the basis of the plurality of scaling coefficients A[k].

In an embodiment, the second mixer 101' comprises an input terminal 120' and an output terminal 130' connected to the scaler 110' of the second mixer 101', wherein the scaler 110' of the second mixer 101' comprises a plurality of unit cells 140' connected in parallel to the input terminal 120'. As will be described in more detail further below, each unit cell comprises a unit cell capacitor, wherein the unit cell capacitor of the $i^{th}$ unit cell has a capacitance $C_{ui}$ and wherein the sum of the capacitances of the unit cells defines a total capacitance $C_s$. As will be described in more detail further below, each unit cell comprises a charge transfer switch for connecting the unit cell capacitor of each unit cell to the output terminal 130', wherein the scaler 110' of the second mixer 101' is configured to control the charge transfer switch of each unit cell for scaling the sampled analog input signal $Y_{IN}[k]$ on the basis of the plurality of scaling coefficients B[k].

In an embodiment, which will be described in more detail further below, the plurality of unit cells 140, 140' comprises N unit cells, wherein the unit cell capacitors have the same capacitance $C_{ui}=C_u$ with $C_u$ being a constant capacitance and the total capacitance $C_s$ is given by $C_s=NC_u$.

In an embodiment, which will be described in more detail further below, the plurality of unit cells 140, 140' comprises b unit cells, wherein the unit cell capacitor of the $i^{th}$ unit cell has a capacitance $C_{ui}=2^{i-1}C_u$ with $C_u$ being a constant capacitance and the total capacitance $C_s$ is given by $C_s=(2^b-1)C_u$.

In an embodiment, which will be described in more detail further below, the plurality of unit cells 140, 140' comprises (b+K) unit cells, wherein the unit cell capacitor of the $i^{th}$ unit cell of the b unit cells of the plurality of unit cells has a capacitance $C_{ui}=2^{i-1}C_u$ with $C_u$ being a constant capacitance, and the unit cell capacitors of the K remaining unit cells of the plurality of unit cells 140, 140' have the same capacitance $C_{ui}=2^b C_u$ and the total capacitance $C_s$ is given by $C_s=(2^b K+2^b-1)C_u$.

Figure 2:
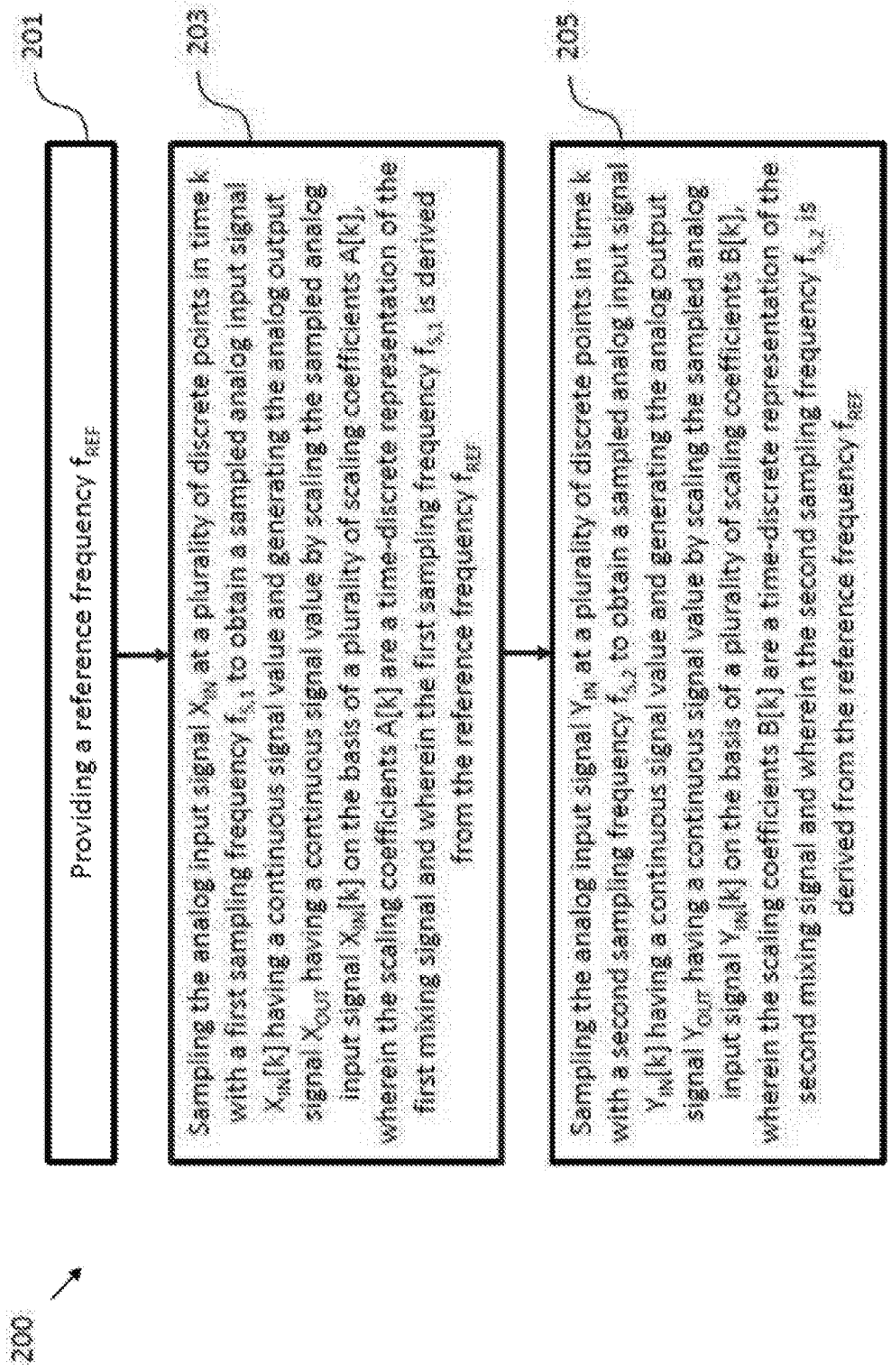
FIG. 2 shows a schematic diagram of a method for generating analog output signals from analog input signals according to an embodiment.

FIG. 2 shows a schematic diagram of a method 200 for generating an analog output signal $X_{OUT}$ from an analog input signal $X_{IN}$ using a first mixing signal and an analog output signal $Y_{OUT}$ from an analog input signal $Y_{IN}$ using a second mixing signal. The method 200 comprises the following steps.

In a step 201, a reference frequency $f_{REF}$ is provided, for instance by a local oscillator, such as the local oscillator 150 shown in FIG. 1.

In a step 203, the analog input signal $X_{IN}$ is sampled at a plurality of discrete points in time k with a first sampling frequency $f_{S,1}$ to obtain a sampled analog input signal $X_{IN}[k]$ having a continuous signal value and the analog output signal $X_{OUT}$ having a continuous signal value is generated by scaling the sampled analog input signal $X_{IN}[k]$ on the basis of a plurality of scaling coefficients A[k], wherein the scaling coefficients A[k] are a time-discrete representation of the first mixing signal and wherein the first sampling frequency $f_{S,1}$ is derived from the reference frequency $f_{REF}$.

In a step 205, the analog input signal $Y_{IN}$ is sampled at a plurality of discrete points in time k with a second sampling frequency $f_{S,2}$ to obtain a sampled analog input signal $Y_{IN}[k]$ having a continuous signal value and the analog output signal $Y_{OUT}$ having a continuous signal value is generated by scaling the sampled analog input signal $Y_{IN}[k]$ on the basis of a plurality of scaling coefficients B[k], wherein the scaling coefficients B[k] are a time-discrete representation of the second mixing signal and wherein the second sampling frequency $f_{S,2}$ is derived from the reference frequency $f_{REF}$.

As the person skilled in the art will appreciate, the steps 203 and 205 of the method 200 can be performed in any order. For instance, the steps 203 and 205 of the method 200 could be performed simultaneously or step 205 could be performed prior to step 203 of the method 200.

In the following, further implementation forms and embodiments of the communication apparatus 100 and the method 200 are described.

FIGS. 3 to 21 show different examples of how the first mixer 101 and/or the second mixer 101' shown in FIG. 1 can be implemented. In order to avoid any unnecessary repetitions the mixer embodiments shown in FIGS. 3 to 21 will be described in the context of the first mixer 101 with the understanding that the mixer embodiments shown in FIGS. 3 to 21 can also be used to implement the second mixer 101'.

Figure 3:
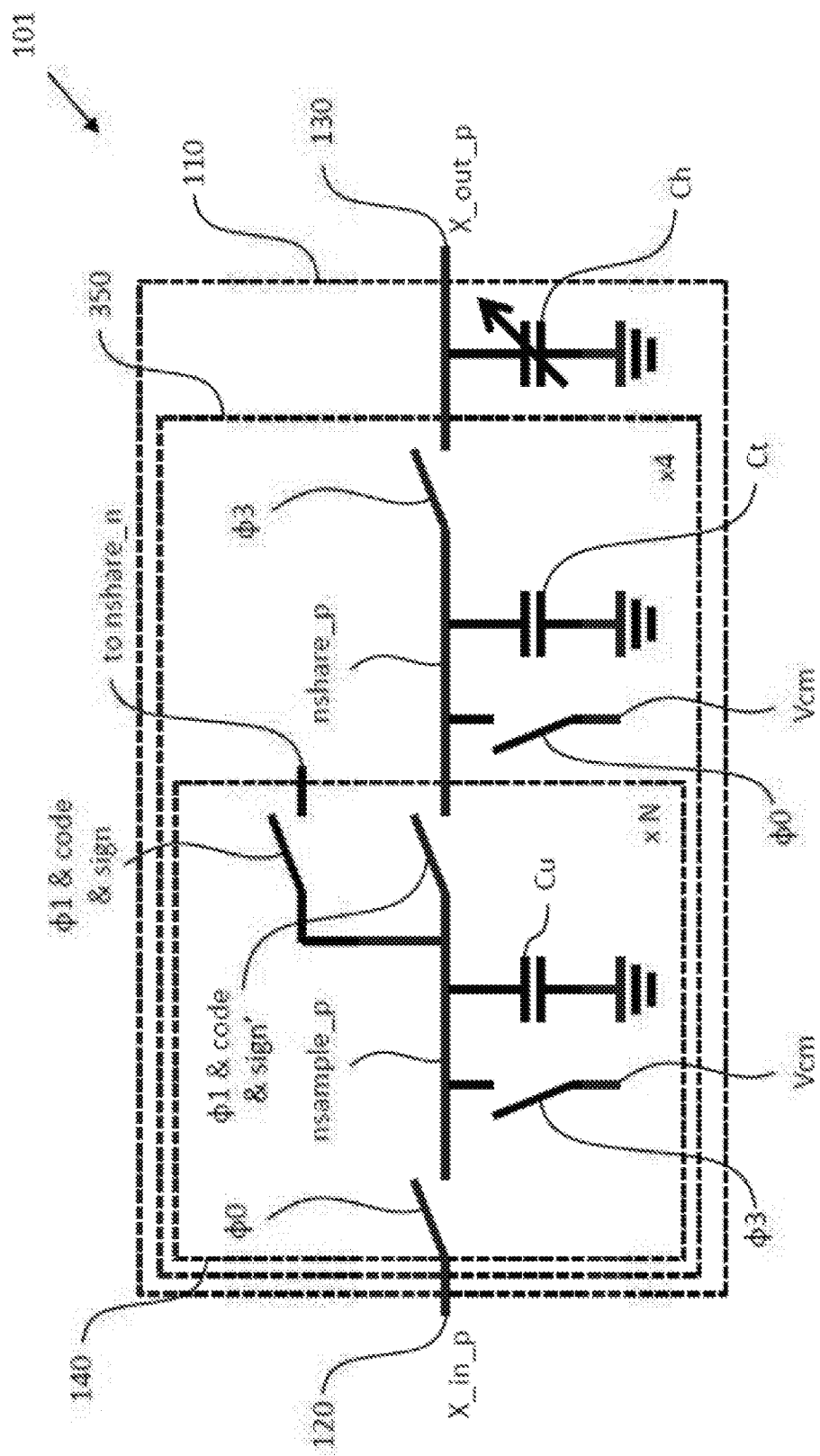
FIG. 3 shows a schematic diagram of a mixer that can be used in a communication apparatus according to an embodiment.

FIG. 3 shows a schematic diagram of a first mixer 101 for generating an analog output signal $X_{OUT}$ from an analog input signal $X_{IN}$ using a first mixing signal according to an embodiment. In the embodiment of FIG. 3 the mixer 101 is implemented differentially and for the sake of simplicity only one half of the differential mixer 101 is shown in FIG. 3 acting on the positive input signal $X_{IN,p}$ (designated as X_in_p) of the analog input signal $X_{IN}$ and generating the positive output signal $X_{OUT,p}$ (designated as X_out_p) of the analog output signal $X_{OUT}$. The mixer 101 comprises a scaler 110 being configured to sample the analog input signal at a plurality of discrete points in time k with a sampling frequency $f_{S,1}$ at an input terminal 120 of the mixer 101 to obtain a sampled analog input signal having a continuous signal value, and to generate the analog output signal at an output terminal 130 of the mixer 101 having a continuous signal value by scaling the sampled analog input signal on the basis of a plurality of scaling coefficients A[k], i.e. $X_{OUT}=A[k]\cdot X_{IN}[k]$. The scaling coefficients A[k] are a time-discrete representation of the first mixing signal.

In an embodiment, the first mixer 101 shown in FIG. 3 is configured to operate using four clock signals $\varphi_3$ to $\varphi_3$. By means of these clock signals different switches of the first mixer 101 can be controlled, which will be described in more detail further below. In an embodiment, the clock signals $\varphi_0$ to $\varphi_3$ have a frequency corresponding to the frequency $f_{REF}$ of the local oscillator 150 and are 90 degrees out of phase with duty cycles of 25%. In an embodiment, the clock signals $\varphi_0$ to $\varphi_3$ have the form as sketched in FIG. 4.

Referring back to the mixer embodiment shown in FIG. 3, the scaler 110 comprises four blocks 350 of N unit cells 140. Each unit cell 140 comprises a unit cell capacitor $C_u$ having a capacitance $C_u$. The sum of the capacitances $C_u$ of the unit cell capacitors $C_u$ of the N unit cells 140 defines a total or sum capacitance $C_s$ with $C_s=N\cdot C_u$.

Each unit cell 140 further comprises an input control switch that is referenced in FIG. 3 by "$\varphi_0$" to indicate that the input control switch of each unit cell 140 is controlled by the clock signal $\varphi_0$. When the clock signal $\varphi_0$ is high, the input control switch of each unit cell 140 connects the unit cell capacitors $C_u$ and the node "nsample_p" of all unit cells 140 with the input terminal 120 being supplied with the analog input signal $X_{IN,p}$ so that all unit cells 140 sample the analog input signal $X_{IN,p}$ with the result that all unit cell capacitors $C_u$ are charged to the same voltage $V_{IN}$ at the end of the high phase of $\varphi_0$ with $V_{IN}$ being the voltage at the input terminal 120 (relative to ground). At this point, the total charge on all unit cell capacitors $C_u$ together is given by $Q_s=C_s\cdot V_{IN}$.

When the clock signal $\varphi_1$ is high, a fraction of the total number of N unit capacitors $C_u$ is connected to a transfer capacitor $C_t$ via a charge transfer switch that is connected to the node "nshare_p" and referenced in FIG. 3 by "$\varphi_1$ & control & sign" to indicate that the charge transfer switch of each unit cell 140 is controlled by the clock signal $\varphi_1$, by a digital control code n and the inverse of the sign bit, wherein "&" denotes a logical AND operation. In the mixer embodiment shown in FIG. 3 the sign bit is assumed to be 0 for positive and 1 for negative numbers.

In an embodiment, the digital control code n determines how many of the N unit cells 140 are connected to the transfer capacitor $C_t$ while the clock signal $\varphi_1$ is high. During this phase, a fraction $\alpha=n/N$ of the total charge $Q_s$ is redistributed over a total capacitance $C_t+n\cdot C_u=C_t+\alpha\cdot C_s$. This results in a voltage:

$$V_t = \frac{\alpha C_s}{\alpha C_s + C_t} \cdot V_{IN} \quad (1)$$

on the transfer capacitor $C_t$ (as well as on all the unit cells 140 connected to the transfer capacitor $C_t$).

The mixer 101 shown in FIG. 3 is configured to change the control code n for every time step, i.e. for every sampled value of $V_{IN}$. In other words, the control code n is a function of the discrete time variable k, i.e. n[k]. Using different digital control codes n for different time steps the mixer 101 shown in FIG. 3 is configured to provide a scaling coefficient (or voltage gain):

$$A[k] = \frac{\alpha[k] C_s}{\alpha[k] C_s + C_t} \quad (2)$$

Since the mixer 101 shown in FIG. 3 can be implemented differentially, a negative voltage gain can easily be achieved by connecting the unit cell capacitors $C_u$ on the positive side of the mixer 101 to the transfer capacitor $C_t$ on the negative side of the mixer 101 and vice versa. To this end, each unit cell 140 of the mixer 101 can comprise an additional switch that is connected to the node "nshare_n" and referenced in FIG. 3 by "(s & control & sign" to indicate that the additional switch of each unit cell 140 is controlled by the clock signal $\varphi_1$, by the digital control code n and the sign bit.

In an embodiment, it is possible that the mixer 101 shown in FIG. 3 remains idle during the high phase of the clock signal $\varphi_2$, because essentially only three different clock signal phases are necessary for the mixer 101 shown in FIG. 3. This embodiment can be advantageous when the clock signal $\varphi_1$ may be delayed somewhat by the required gating on the clock signals, which could cause an overlap of the clock signal $\varphi_1$ with the clock signal $\varphi_2$.

During the high phase of the clock signal $\varphi_3$, the voltage in all unit cells 140 is reset to the common-mode direct current (DC) voltage $V_{CM}$ of the input and output signals via a reset switch, which in the embodiment shown in FIG. 3 is part of each unit cell 140 and referenced in FIG. 3 by "$\varphi_3$" to indicate that the reset switch of each unit cell 140 is controlled by the clock signal $\varphi_3$. While having a reset switch is not necessary in case of an ideal voltage input signal, it is advantageous for a current input signal, as will be described in more detail further below. Moreover, if the mixer 101 shown in FIG. 3 is driven by a voltage input signal with nonzero output impedance, a memory effect could be caused by the fact that some unit cells 140 still hold the full charge from the previous sample while others have already transferred a portion of their charge to the transfer capacitor $C_t$.

As the person skilled in the art will appreciate, the parts of the mixer 101 described so far can process one sample of the input signal per local oscillator cycle. In an embodiment, in order to achieve an effective sampling frequency $f_{S,1}$ of four times the reference frequency $f_{REF}$, i.e. $f_{S,1}=4f_{REF}$, the mixer 101 shown in FIG. 3 (or rather the scaler 110 of the mixer 101) comprises four blocks 350 of unit cells 140, wherein each block 350 comprises a transfer capacitor $C_t$ and is configured to sample the input signal $X_{IN,p}$ during a different phase of the clock signals $\varphi_3$ to $\varphi_3$. In other words, each block 350 of unit cells 140 operates 90 degrees out of phase at the reference frequency $f_{REF}$ providing for an effective sampling rate $f_{S,1}$ of $4f_{REF}$.

In order to recombine the samples of the input signal $X_{IN,p}$ taken by the four blocks 350 of the mixer 101 shown in FIG. 3 back into a single analog signal, a single hold capacitor $C_h$ is provided at the output terminal 130. The hold capacitor $C_h$ is connected via four hold capacitor switches to all four blocks 350 of the mixer 101 and hence redistributes charge with one of the phases during each clock signal phase. The hold capacitor switch of a block 350 is referenced in FIG. 3 by "$\varphi_3$" to indicate that the hold capacitor switch of each block 350 is controlled by the clock signal $\varphi_3$. The person skilled in the art will appreciate that, because of this, there is no clock signal phase during which the hold capacitor $C_h$ can be reset.

It can be shown that the four transfer capacitors $C_t$ of the four blocks 350 together with the hold capacitor $C_h$ implement an infinite impulse response (IIR) lowpass filter whose transfer function is given by $$H_{IIR}(z) = \frac{1}{1 - z^{-1} \frac{C_h}{C_t + C_h}}, \quad (3)$$

where the z-transform has to be taken at a sampling rate $f_{S,1}=4f_{REF}$. The pole of this filter is located at:

$$f_p = \frac{4 f_{ref}}{2\pi} \cdot \ln\left(1 + \frac{C_t}{C_h}\right) \quad (4)$$

In an embodiment, where the mixer 101 is implemented as a component of a communication receiver, the IIR lowpass filter can be used as a first filtering stage in the receiver lineup. In an embodiment, the hold capacitor $C_h$ can be provided by a tunable capacitor, as indicated in FIG. 3, to tune the filter pole depending on the communication band one wishes to receive.

In the embodiment shown in FIG. 3, each of the four blocks 350 of the mixer 101 uses a control code n to scale the input signal $X_{IN,p}$ sampled at an effective sampling rate $f_{S,1}=4f_{REF}$. As each block 350 scales only every fourth sample of the input signal, the control code n has to be present within a block with frequency $f_{REF}$. When considered together as one signal sampled at $f_{S,1}=4f_{REF}$, the control codes n of the four blocks 350 provide the mixing signal with the frequency $f_{MIX,1}$. If the ratio $f_{MIX,1}/f_{S,1}$ is some rational number A/B, only a finite set of control code samples is needed which can be repeated forever, as will be described in more detail further below. For cellular bands, the number of required control code samples is usually below 30, so the samples can easily be stored in a local lookup table (LUT) or shift register of the mixer 101.

Figure 5:
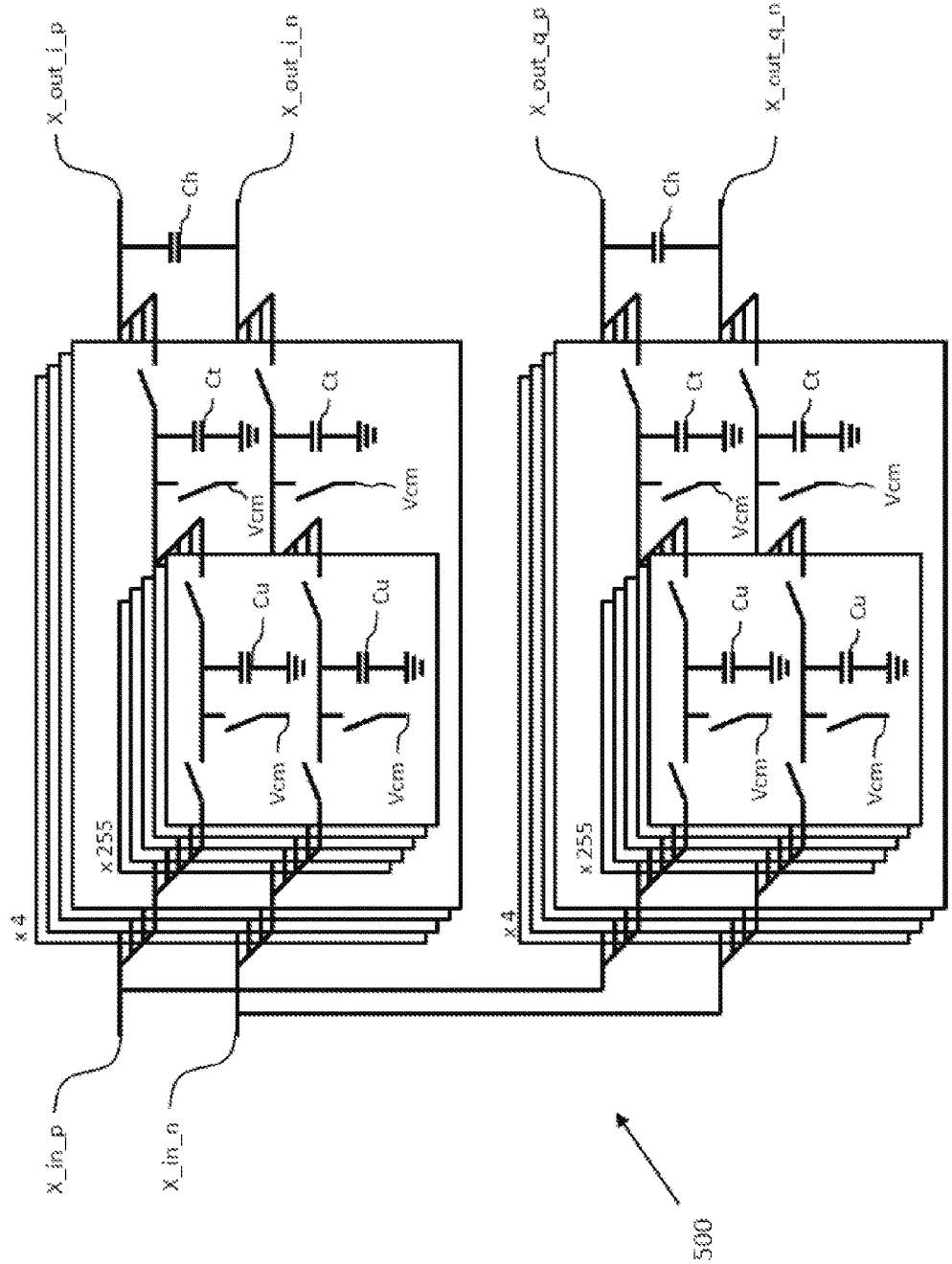
FIG. 5 shows a schematic diagram of a quadrature mixer that can be used in a communication apparatus according to an embodiment.

FIG. 5 shows a schematic diagram of a mixer 500 for generating an analog output signal from an analog input signal using a mixing signal according to an embodiment. In the embodiment of FIG. 5 the mixer 500 is implemented in form of a quadrature mixer by connecting two of the above described mixers 101 in parallel. Each mixer 101 of the quadrature mixer 500 is controlled by a different set of control codes n, which define respective mixing signals that are 90 degrees out of phase.

Figure 4:
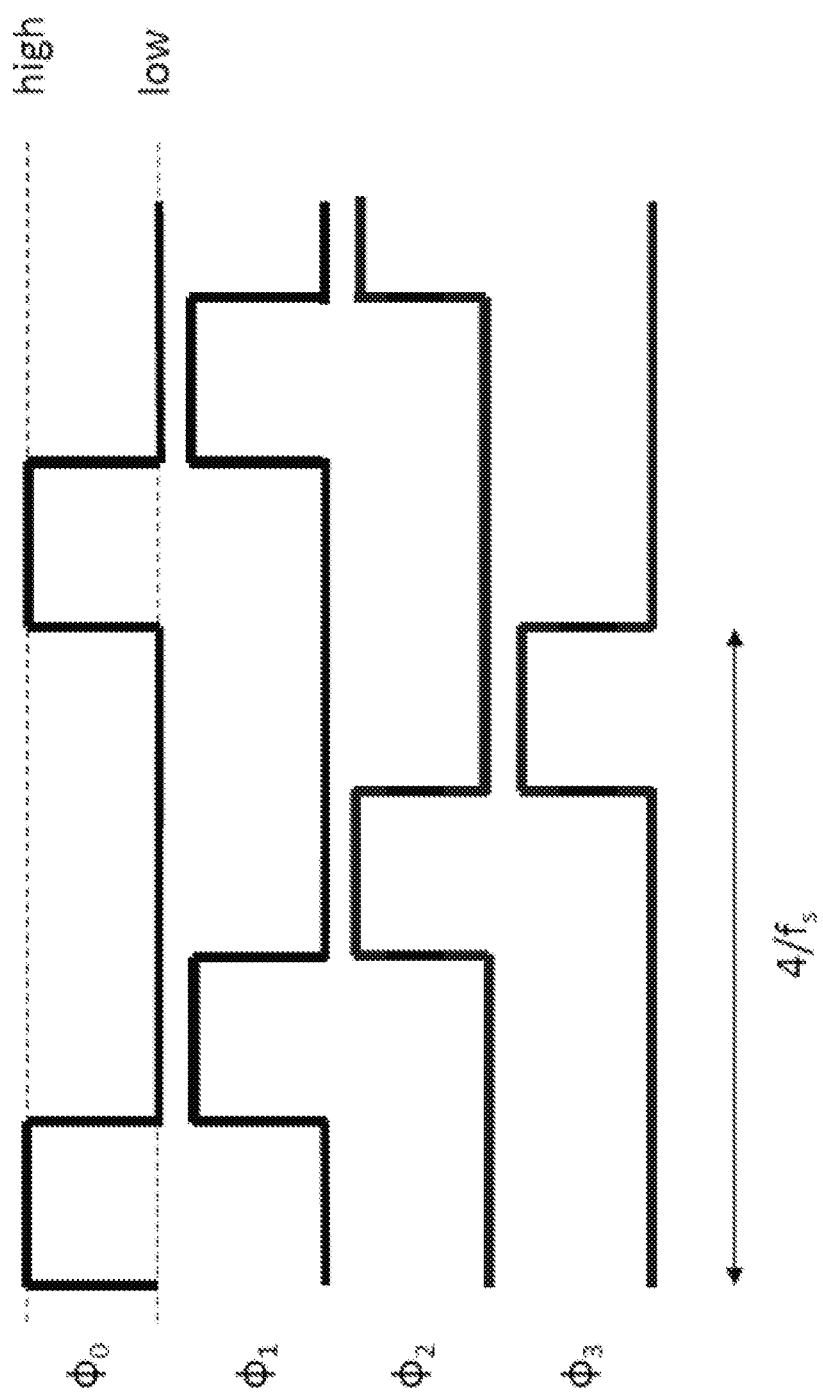
FIG. 4 shows a schematic diagram of a plurality of clock signals for driving a mixer that can be used in a communication apparatus according to an embodiment.

As FIG. 5 and the following Figs. contain several elements that already have been described in detail in the context of FIGS. 1 and 4, these elements generally will be described in the below only in the case that their meaning cannot be easily derived from the above detailed description of the embodiments of FIGS. 1 and 4, in order to avoid unnecessary repetitions.

The embodiments of the mixer 101 shown in FIGS. 3 and 5 provide a unary mixer implementation, i.e. a mixer 101 having at least one block 350 of identical unit cells 140 with identical capacitances $C_u$. This solution involves relatively little layout work and is best suited for matching between the unit cells 140.

As already mentioned above, the mixer 101 can be provided in form of a binary mixer implementation, wherein binary implementation means that the capacitance $C_{ui}$ of the unit cell capacitor of the $i^{th}$ unit cell 140 has a capacitance $C_{ui}=2^{i-1}C_u$ with $C_u$ being a constant capacitance. In case of a binary implementation of the mixer 101 the total capacitance $C_s$ is given by $C_s=(2^b-1)C_u$, where b is the total number of binary unit cells 140.

By employing a binary implementation of the mixer the most significant bits (MSBs) can be implemented with much less area and parasitics, which can improve power consumption and input capacitance at the expense of degraded matching properties.

As already mentioned above, the mixer 101 can be implemented as a combination of a unary and a binary implementation having (b+K) unit cells 140, wherein the unit cell capacitor of the i-th unit cell of the b unit cells of the (b+K) unit cells has a capacitance $C_{ui}=2^{i-1}C_u$ with $C_u$ being a constant capacitance, and wherein the unit cell capacitors of the K remaining unit cells of the (b+K) unit cells have the same capacitance $C_{ui}=2^b C_u$ and the total capacitance $C_s$ is given by $C_s=(2^b K+2^b-1)C_u$. This combination of binary and unary unit cells provides an optimal tradeoff between parasitics and matching properties.

In an embodiment, the mixer 101 is configured to process an analog voltage signal $V_{IN}$ or an analog current signal $I_{IN}$ as the analog input signal $X_{IN}$ or an analog voltage signal $V_{OUT}$ or an analog current signal $I_{OUT}$ as the analog output signal $X_{OUT}$.

In an embodiment, where the analog input signal $X_{IN}$ is an analog voltage signal $V_{IN}$, the total capacitance $C_S$ of the mixer embodiment 101 shown in FIGS. 3 and 5 will be charged until the voltage over it is equal to the analog voltage signal $V_{IN}$ and, thus, the mixer embodiment 101 shown in FIGS. 3 and 5 will sample the input signal. In this case the mixer embodiment 101 shown in FIGS. 3 and 5 is sensitive to variations of the time at which the input control switch controlled by clock signal $\varphi_0$ is opened, since this determines when the input signal is sampled. In addition, the resistance of the input control switch (when conducting) of a unit cell 140 of the mixer embodiment shown in FIG. 3 should be low enough to allow good settling, i.e. to allow $C_s$ to be charged to the correct voltage during the time the input control switch is closed.

In an embodiment, where the analog input signal $X_{IN}$ is an analog current signal $I_{IN}$, the current will be integrated on $C_s$ during the time the input control switch is closed. When the input control switch is opened by the clock signal $\varphi_0$ going from "high" to "low," the voltage on $C_s$ will represent the integral of the analog current signal $I_{IN}$ over this period. By means of such an embodiment, an integrate-and-dump low-pass filter is realized, which provides some advantageous anti-aliasing filtering. In this case the mixer embodiment 101 shown in FIGS. 3 and 5 is sensitive to variations of both the time the input control switch is closed and the time it is opened, because the difference between these times determines the period over which the input signal is integrated and the times also determine when exactly the input signal is sampled.

Each of the capacitors $C_s$, $C_t$ and/or $C_h$ can be implemented either as a single-ended capacitor or a differential capacitor with half the capacitance of the single-ended capacitor. Using differential capacitors has the following advantages. A differential capacitor can replace two single-ended capacitors such that four times less chip area is used. Implementing the capacitors $C_s$ or $C_t$ as differential capacitors results in a strong common-mode rejection. Common-mode signals can only be passed by being sampled on the parasitic capacitance to the substrate or to other nets. Using single-ended capacitors has the following advantages. Since for single-ended capacitors four times more physical capacitance is used, the standard deviation on the effective differential capacitance will be two times lower. Implementing the hold capacitor $C_h$ as a single-ended capacitor has the effect that the IIR filter will also filter out high-frequency common-mode signals.

In the embodiment shown in FIG. 5, the hold capacitor $C_h$ is implemented differentially to save area. The total capacitance $C_s$ or rather the unit capacitors $C_u$ of the unit cells 140 are implemented as single-ended capacitors in order to have better matching between the unit cells. The area impact of this is usually less large since the area of the unit cells 140 is not only determined by the unit cell capacitors $C_u$ but also by the switches of a unit cell 140 and by routing overhead.

As can be seen from above equation (2), for the mixer embodiments shown in FIGS. 3 and 5 the maximum value of the scaling coefficient or voltage gain A[k] is achieved when $\alpha=1$ and is given by:

$$A_{max} = \frac{C_s}{C_s + C_t} \tag{5}$$

The choice of the size of the capacitance of the transfer capacitor $C_t$ relative to the total capacitance $C_s$ is a trade-off between quantization noise and voltage loss. This can be seen as follows.

If $C_t$ tends towards infinity, the term $\alpha \cdot C_s$ in the denominator of equation (2) becomes negligible and the scaling coefficient A[k] converges to:

$$A[k] \to \frac{\alpha C_s}{C_t} (C_T \to \infty) \tag{6}$$

This means that the scaling coefficient A[k] becomes directly proportional to $\alpha$. This is beneficial, because the quantization levels for $\alpha$ are spaced equidistantly, so this will also hold for the scaling coefficient A[k]. However, as $C_t$ increases towards infinity, the maximum value of the scaling coefficient $A_{max}$ will go to zero.

As $C_t$ becomes smaller, the term $\alpha \cdot C_s$ in the denominator becomes more dominant and $A_{max}$ will increase. Simultaneously, the dependence of the scaling coefficient A[k] on $\alpha$ becomes gradually more nonlinear such that there will be more quantization levels close to 1 and fewer close to 0. Most likely this leads to an increase of the quantization noise.

If $C_t$ decreases towards zero, it becomes negligible in the denominator so that:

$$A[k] \to 1 (C_t \to 0) \tag{7}$$

This is the largest scaling coefficient one can achieve with a passive structure, but it is now independent of $\alpha$. This means that all quantization levels for A[k] coincide and no more mixing can be achieved.

The optimum values for $C_s$ and $C_t$ depend on the given circumstances of an application, in which the mixer 101 is to be employed, such as noise, quantization noise, voltage gain as well as area and power consumption. In an embodiment, the capacitances $C_s$ and $C_t$ are comparable in size. In the case $C_s=C_t$, the dependence of A[k] on $\alpha$ is not so far from a straight line, and $A_{max}$ is equal to 0.5.

Figure 6:
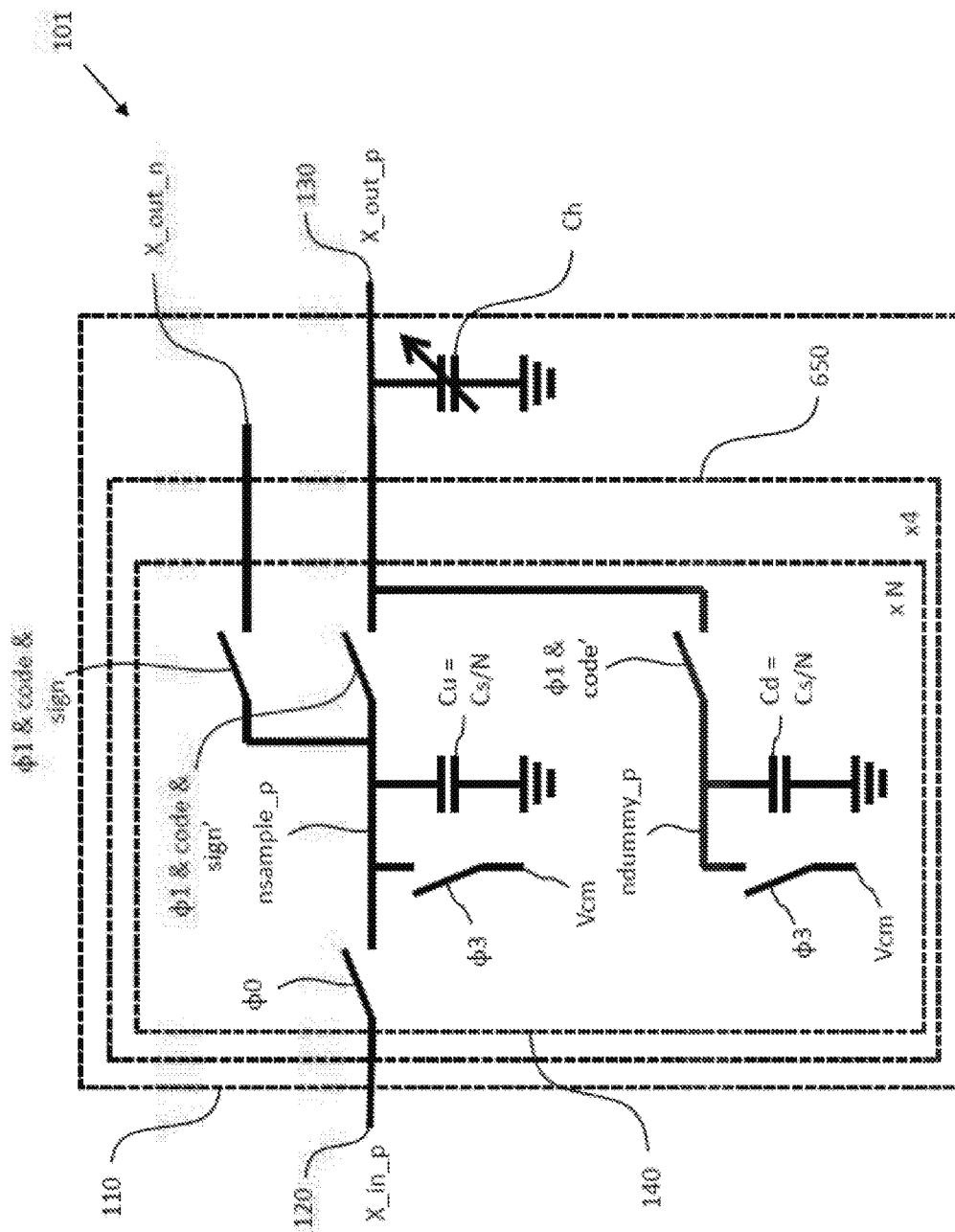
FIG. 6 shows a schematic diagram of a mixer that can be used in a communication apparatus according to an embodiment.

FIG. 6 shows a schematic diagram of a mixer 101 for generating an analog output signal $X_{OUT}$ from an analog input signal $X_{IN}$ using a mixing signal according to an embodiment. In the embodiment of FIG. 6 the mixer 101 is implemented differentially and for the sake of simplicity only one half of the differential mixer 101 is shown in FIG.

6 acting on the positive input signal $X_{IN,p}$ (designated as X_in_p) of the analog input signal $X_{IN}$ and generating the positive output signal $X_{OUT,p}$ (designated as X_out_p) of the analog output signal $X_{OUT}$. The mixer 101 comprises a scaler 110 being configured to sample the analog input signal at a plurality of discrete points in time k with a sampling frequency $f_{S,1}$ at an input terminal 120 of the mixer 101 to obtain a sampled analog input signal having a continuous signal value, and to generate the analog output signal at an output terminal 130 of the mixer 101 having a continuous signal value by scaling the sampled analog input signal on the basis of a plurality of scaling coefficients A[k]. i.e. $X_{OUT}$=A[k]·$X_{IN}$[k]. The scaling coefficients A[k] are a time-discrete representation of the mixing signal.

Generally, the main differences between the mixer embodiment shown in FIG. 6 and the mixer embodiment shown in FIG. 3 are that the transfer capacitor $C_t$ has been removed in the mixer 101 embodiment shown in FIG. 6 and that the unit cells 140 of the scaler 110 of the mixer 101 shown in FIG. 6 comprise a dummy unit capacitor $C_d$ in addition to the unit capacitor $C_u$, as will be described in more detail further below. In an embodiment, the capacitance of the dummy unit capacitor $C_d$ is essentially equal to the capacitance of the unit cell capacitor $C_u$, i.e. $C_d = C_u$.

Figure 7:
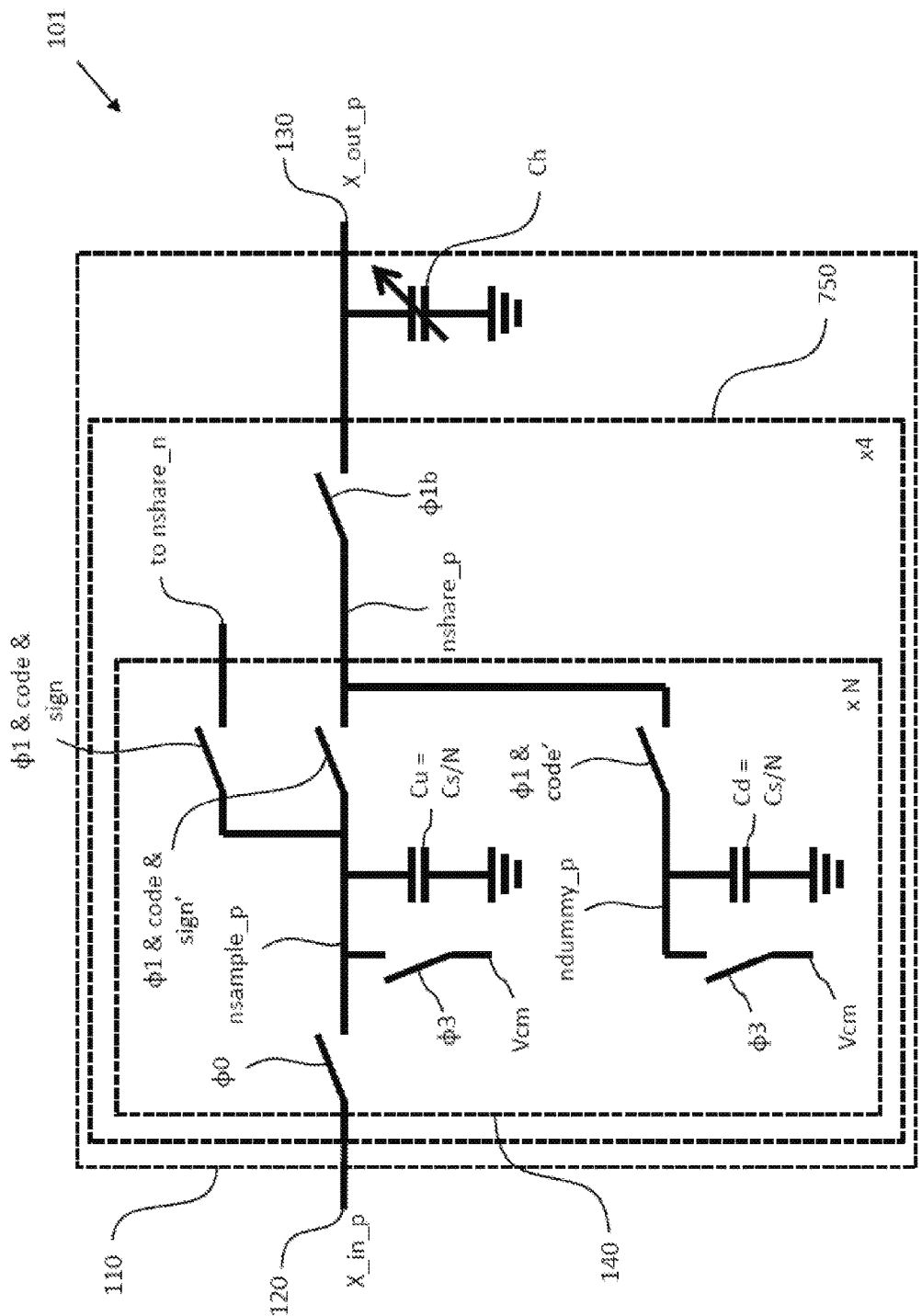
FIG. 7 shows a schematic diagram of a mixer that can be used in a communication apparatus according to an embodiment.

For describing the operation of the mixer embodiment 101 shown in FIG. 6 it will be helpful to first describe the slightly modified embodiment of the mixer 101 shown in FIG. 7. The mixer embodiment shown in FIG. 7 differs from the mixer embodiment shown in FIG. 6 in that the mixer embodiment shown in FIG. 7 comprises an additional output switch at the output of each block 750 of the scaler 110. The additional output switch at the output of each block 750 of the scaler 110 is referenced in FIG. 7 by "$\varphi_{1b}$" to indicate that the additional output switch of each block 750 of the scaler 110 is controlled by a further clock signal $\varphi_{1b}$. In an embodiment, the clock signal $\varphi_{1b}$ makes the transition from "low" to "high" at a later point in time than the clock signal $\varphi_1$ but returns back to "low" at the same point in time as the clock signal $\varphi_1$. For instance, the "high" phase of the clock signal $\varphi_{1b}$ can be half as long as the "high" phase of the clock signal $\varphi_1$.

During the "high" phase of the clock signal $\varphi_0$, all unit cells 140 of the mixer embodiment 101 shown in FIG. 7 sample the analog input signal $X_{IN,p}$ on their unit capacitor $C_u$, leading to a voltage $V_{IN}$ on each $C_u$ and a total charge $Q_s = C_s \cdot V_{IN}$ on $C_s$. The dummy capacitors $C_d$ have no charge, because they have been reset during the previous "high" phase of the clock signal $\varphi_3$ via the reset switch that is referenced in FIG. 7 by "$\varphi_3$" and connected with a respective dummy capacitor $C_d$.

During the "high" phase of the clock signal $\varphi_1$, only n (where n is defined by the digital control code) of the N unit cells 140 connect their unit capacitor $C_u$ to the node referred to as "nshare_p" in FIG. 7 (or the node referred as "nshare_n" in FIG. 7, if the sign is negative) via respective switches controlled by the clock signal $\varphi_1$, the digital control code n and the inverse of the sign bit. The remaining (N−n) unit cells 140 connect their "ndummy_p" node to the "nshare_p" node. Thus, a charge $\alpha \cdot Q_s$ (where $\alpha$=n/N as before) is now redistributed over a total capacitance n·$C_u$+(N−n)·$C_d$=$C_s$. This results in a voltage:

$$V_T = \frac{\alpha Q_s}{C_s} = \alpha V_{IN} \quad (8)$$

and hence a scaling factor A[k] (or voltage gain)

$$A[k]=\alpha \quad (9)$$

which is directly proportional to $\alpha$. It is clear that for the embodiments shown in FIGS. 6 and 7 the maximum value $A_{max}$ of the scaling coefficient is now equal to 1, while the dependence of A[k] on $\alpha$ is always linear.

When the charge has been redistributed, the clock signal $\varphi_{1b}$ goes up and the additional output switch at the output of each block 750 of the scaler 110 referenced in FIG. 7 by "$\varphi_{1b}$" connects the "nshare_p" node to the output terminal 130, while the switches controlled by the clock signal $\varphi_1$ are still closed. In this way, the total capacitance $C_s$ carrying a charge $\alpha \cdot Q_s$ is connected to the hold capacitor $C_h$, which carries a charge depending on previous samples from the other blocks 750. During the "high" phase of the clock signal $\varphi_3$, the unit capacitors $C_u$ and the dummy unit capacitors $C_d$ are reset.

Just as in the case of the mixer embodiment 101 shown in FIG. 3, the above described configuration provides an IIR lowpass filter with a DC gain of 1, where $C_t$ has now been replaced by $C_s$ in the transfer function:

$$H_{IIR}(z) = \frac{1}{1 - z^{-1}\frac{C_h}{C_s + C_h}} \quad (10)$$

The pole is located at:

$$f_p = \frac{4 f_{ref}}{2\pi} \cdot \ln\left(1 + \frac{C_s}{C_h}\right) \quad (11)$$

Since the sum of all the unit capacitors $C_u$ and the dummy unit capacitors $C_d$ connected to the hold capacitor $C_h$ is always equal to $C_s$, the pole frequency does not depend on $\alpha$. The input capacitance of the mixer 101 is also always equal to $C_s$ and, thus, independent of $\alpha$. This is beneficial for avoiding nonlinearities, in case the driving signal source has a nonzero output impedance.

Referring back to the mixer embodiment 101 shown in FIG. 6, it can be easily seen that the operation of the mixer embodiment 101 shown in FIG. 7 does not change, if the clocks $\varphi_1$ and $\varphi_{1b}$ go up at the same time. This is because the charge present on the n unit capacitors $C_u$ and on the hold capacitor $C_h$ is redistributed over a capacitance n·$C_u$+(N−n) ·$C_d$+$C_h$=$C_s$+$C_h$. For identical clock signals $\varphi_1$ and $\varphi_{1b}$ the additional output switch at the output of each block 750 of the scaler 110 referenced in FIG. 7 by "$\varphi_{1b}$" can be removed. This leads to the mixer embodiment 101 shown in FIG. 6, which is functionally the same as the mixer embodiment of FIG. 7 if ideal switches are used. However, using real switches the mixer embodiment 101 shown in FIG. 6 is preferable, because it does not have two switches in series and allows the charges to redistribute during the complete "high" phase of the clock signal $\varphi_1$ instead of the shorter "high" phase of the clock signal $\varphi_{1b}$.

Figure 8:
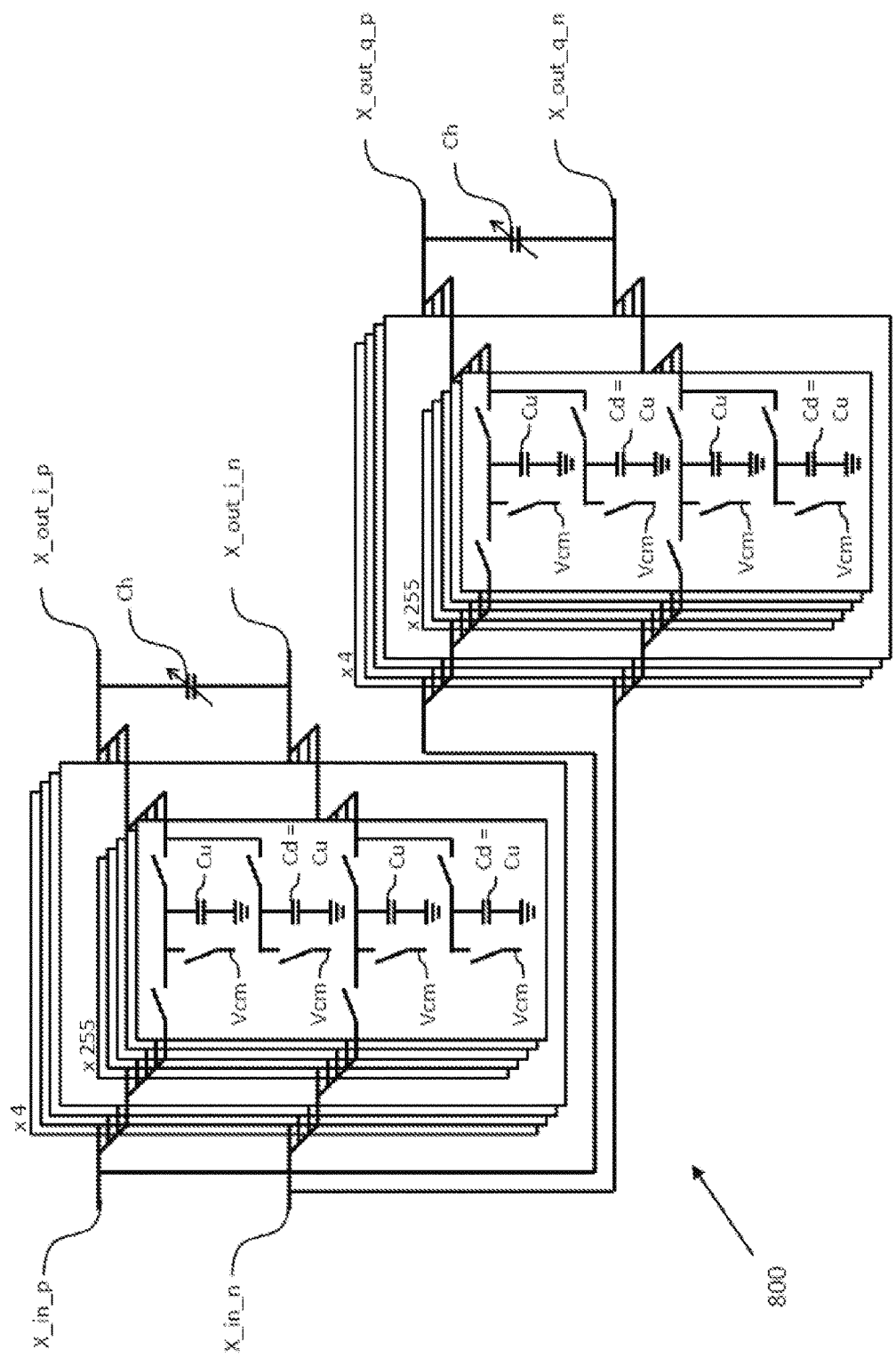
FIG. 8 shows a schematic diagram of a quadrature mixer that can be used in a communication apparatus according to an embodiment.

FIG. 8 shows a schematic diagram of a mixer 800 for generating an analog output signal from an analog input signal using a mixing signal according to an embodiment. In the embodiment of FIG. 8 the mixer 800 is implemented in form of a quadrature mixer by connecting two of the mixer embodiments 101 shown in FIG. 6 in parallel. For the sake of simplicity, the additional switches for implementing a negative sign scaling coefficient are not shown in FIG. 8.

Each mixer 101 of the quadrature mixer 800 is controlled by a different set of control codes n, which define respective mixing signals that are 90 degrees out of phase.

Figure 9A:
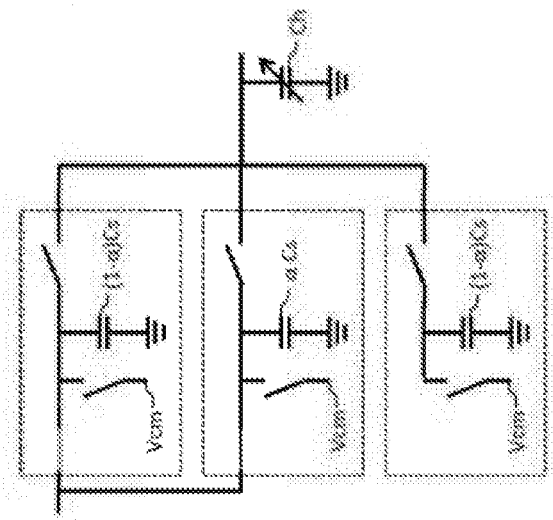
FIGS. 9A, 9B, and 9C schematically illustrate the operational principle implemented in the mixer embodiments shown in FIGS. 6, 7 and 8 that can be used in a communication apparatus according to an embodiment by showing selected components thereof during different clock phases.
Figure 9B:
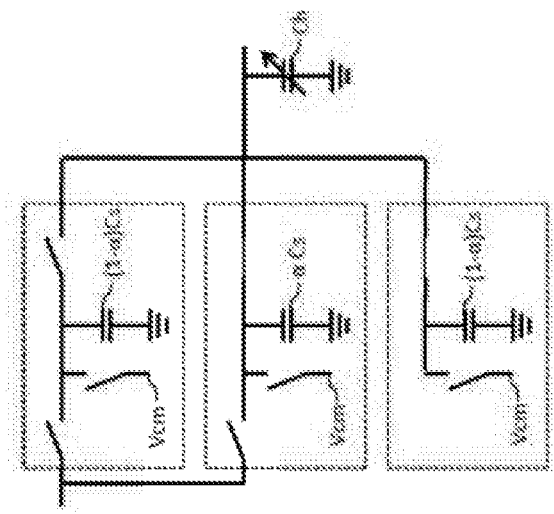
Figure 9C:
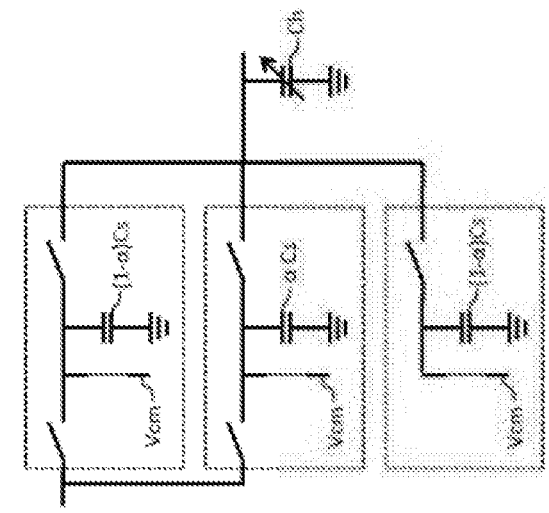

FIGS. 9A to 9C schematically illustrate the operational principle implemented in the mixer embodiments shown in FIGS. 6, 7 and 8 by showing selected components thereof. For illustration purposes the dummy unit capacitors $C_d$ have been separated into separate dummy unit cells. Each box in FIGS. 9A to 9C represents a variable number of unit cells or dummy unit cells depending on α.

FIG. 9A shows the "high" phase of the clock signal $\varphi_0$, where the input is sampled on the total capacitance $C_s$. FIG. 9B shows the "high" phase of the clock signal $\varphi_1$, where the charge is transferred to the dummy unit cells having a capacitance of $(1-\alpha)\cdot C_s$ and to the hold capacitor $C_h$. The dummy unit cells make sure that the pole of the IIR filter stays at the same frequency.

FIG. 9C shows the "high" phase of the clock signal $\varphi_3$, where a reset of all capacitors is made.

In the below, further variants of the mixer embodiment 101 shown in FIG. 6 will be described. Although the specific implementations differ, they have the same scaling factor $A[k]=\alpha$ and provide the same IIR filter as the mixer embodiment 101 shown in FIG. 6. Although not shown in the figures for the sake of simplicity, all implementations can have two mixer channels and four mixer blocks per channel.

FIGS. 10A to 10D schematically illustrate the operational principle implemented in a further mixer embodiment 101. As in the case of FIGS. 9A to 9C for illustration purposes only selected components of the further mixer embodiment 101 are shown in FIGS. 10A to 10D. Each box in FIGS. 10A to 10D represents a variable number of unit cells or dummy unit cells depending on α.

The mixer 101 shown in FIGS. 10A to 10D does not require any dummy capacitors and uses all four clock signals $\varphi_0$, $\varphi_1$, $\varphi_2$ and $\varphi_3$.

During the "high" phase of the clock signal $\varphi_0$, the input is sampled on the unit capacitors $C_u$ of all N unit cells 140, i.e. on a total capacitance $C_s$, leading to a voltage $V_{IN}$ on each of the unit capacitors $C_u$ and a total charge $Q_s=C_s\cdot V_{IN}$.

During the "high" phase of the clock signal $\varphi_1$. (N−n) of these unit cells 140 are reset while the unit capacitors $C_u$ of the other unit cells 140 remain at a voltage $V_{IN}$. The total charge is now only $\alpha*Q_s$.

During the "high" phase of the clock signal $\varphi_2$, all N unit cells 140 are connected to the hold capacitor $C_h$. Thus, the charge $\alpha\cdot Q_s$ plus the charge already present on the hold capacitor $C_h$ is redistributed over a total capacitance $C_s+C_h$. In this way, a scaling factor $A[k]=\alpha$ is realized and the same IIR filter as in the mixer embodiment shown in FIGS. 6 and 7 is implemented.

During the "high" phase of the clock signal $\varphi_3$, all unit capacitors $C_u$ are reset.

The main advantage of the mixer embodiment illustrated in FIGS. 10A-10D is the absence of both the transfer capacitor $C_t$ and the dummy unit cells (i.e. the dummy unit capacitors). However, with respect to the mixer embodiment illustrated in FIGS. 10A-10D the following should be taken into account. All four clock signals should be routed through the matrix of unit cells 140 in each block. This will lead to an increased power consumption and possibly even to an increased area necessary for the matrix of unit cells 140. Moreover, in addition to requiring the gating of the clock signal $\varphi_1$ with the digital control code n and the sign bits, in the mixer embodiment 101 illustrated in FIGS. 10A-10D the clock signal $\varphi_1$ also should be combined with the clock signal $\varphi_3$ in an OR gate. Under certain circumstances the delay caused by such gating can become problematic, because all four clock signals are used such that there is no buffer for delaying some of the clock signals.

FIGS. 11A to 11C schematically illustrate the operational principle implemented in a further mixer embodiment 101. As in the case of FIGS. 9A to 9C and FIGS. 10A to 10D for illustration purposes only selected components of the further mixer embodiment 101 are shown in FIGS. 11A to 11C. As in the case of FIGS. 9A to 9C the dummy unit capacitors $C_d$ have been separated into separate dummy unit cells. Each box in FIGS. 11A to 11C represents a variable number of unit cells or dummy unit cells depending on α.

Similar to the mixer embodiments 101 shown in FIGS. 6, 7, 8 and 9A to 9C, the mixer 101 shown in FIGS. 11A to 11C also comprises dummy unit capacitors $C_d$. However, in the mixer 101 shown in FIGS. 11A to 11C these dummy unit capacitors $C_d$ are connected not to the output terminal 130, but rather to the input terminal 120 via a dummy unit cell input switch. Consequently, in this embodiment clock gating is done on the dummy unit cell input switch.

During the "high" phase of the clock signal $\varphi_0$, the input signal is sampled on n unit capacitors $C_u$ and (N−n) dummy capacitors $C_d$ (with $C_d=C_u$) such that the total (sampling) capacitance is always equal to $C_s$. This results in a voltage $V_{IN}$ and a total charge $Q_s=C_s\cdot V_{IN}$. The dummy unit cells make sure that the input load is always equal to $C_s$.

During the "high" phase of the clock signal $\varphi_1$, all N unit capacitors $C_u$ (the n unit capacitors $C_u$ which sampled the input signal and the (N−n) unit capacitors $C_u$ which did not sample the input signal) connect to the hold capacitor $C_h$ such that also in this embodiment a total charge $\alpha\cdot Q_s$ plus the charge present on the hold capacitor $C_h$ is redistributed over the capacitance $C_s+C_h$. As in the previous embodiments, this leads to a scaling factor $A[k]=\alpha$ and the same IIR filter implementation.

In this mixer embodiment 101, the clock signal $\varphi_2$ is not used. During the high phase of clock signal $\varphi_3$ all capacitors $C_u$ and $C_d$ are reset.

With respect to the mixer embodiment 101 shown in FIGS. 11A to 11C, one has to appreciate that the clock gating now occurs on the input switch, which is the only timing-critical switch, since it determines at which point in time the input signal is sampled and, in case of a current input signal, how long it is integrated.

As already mentioned above, the above described mixer embodiments 101 can be implemented in form of a quadrature mixer providing for an in phase output signal and a quadrature output signal.

For instance, the quadrature mixer embodiment 500 shown in FIG. 5 and the quadrature mixer embodiment 800 shown in FIG. 8 have two identical and independent mixers 101 for the I and Q paths. During each clock cycle, each mixer 101 samples the input on a capacitance $C_s$, which results in a total charge $Q_s=C_s\cdot V_{IN}$. The only case in which all this charge will be used (i.e. connected to the hold capacitor $C_h$) is when α=1 (for instance at the peaks of the mixing signal in case of a sinusoidal mixing signal). In the more common case of α<1, part of the charge remains on the sampling capacitors until it is discarded in the reset phase without ever being involved in the charge redistribution process. Nevertheless, the total (sampling) capacitance $C_s$ needs to be the same during every clock cycle so that the signal source is always driving the same impedance.

During each clock cycle, the I and Q phases together take a charge $2\cdot Q_s$ from the source of the input signal and store it on a total capacitance of $2\cdot C_s$. However, there is no case in which all this charge will be used. As the I and Q mixing signals are 90 degrees out of phase, their peaks do not coincide. i.e. it is impossible that α of the I channel (hereinafter referred to as $α_i$) and α of the Q channel (hereinafter referred to as $α_q$) are equal to 1 at the same point in time.

It can easily be shown that:

$$\max(α_i+α_q)=\max_x(|\cos x|+|\sin x|)=\sqrt{2} \quad (12)$$

This means that in order to keep the input impedance of the mixers 101 of the I channel and the Q channels together during all clock cycles, it is sufficient to sample the input signal on a total capacitance of:

$$C_{TOT}=\sqrt{2}·C_s \quad (13)$$

Furthermore, it can be shown that $$\min(α_i+α_q)=\min_x(|\cos x|+|\sin x|)=1 \quad (14)$$

Figure 12:
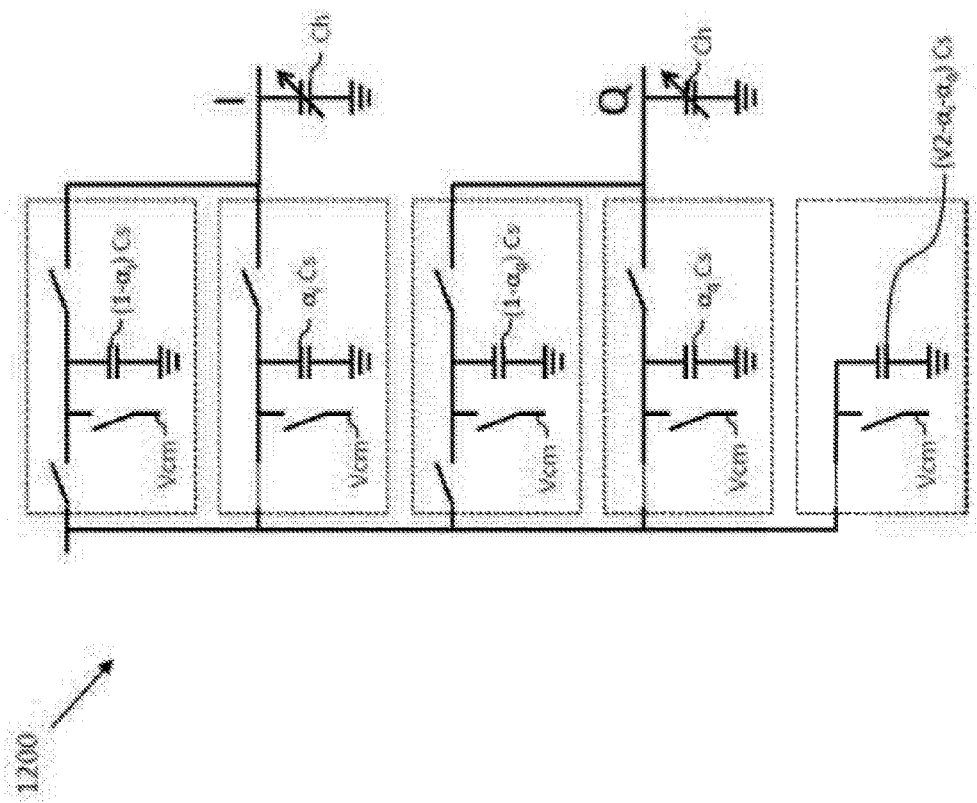
FIG. 12 shows a schematic diagram of a quadrature mixer that can be used in a communication apparatus according to an embodiment.

This finding leads to the quadrature mixer embodiment 1200 shown in FIG. 12, which is based on the above described mixer embodiments 101. Similar to the mixer embodiment shown in FIGS. 10A to 10D it also includes N unit capacitors $C_u$ in both the I channel mixer and the Q channel mixer. However, it only includes about $(\sqrt{2}-1)·N$ dummy capacitors $C_d$. Thus, the total capacitance is given by:

$$2NC_u+(\sqrt{2}-1)NC_d=(1+\sqrt{2})C_s≈2.4C_s. \quad (15)$$

In comparison to the mixer embodiment shown in FIGS. 10A to 10D, where for a quadrature implementation the total capacitance would be $2NC_u+2NC_d=4C_S$, a total capacitance of only $2.4·C_s$ translates into a substantially reduced area.

Moreover, in the quadrature mixer embodiment 1200 shown in FIG. 12 the input capacitance during the sampling phase has been reduced by a factor of $\sqrt{2}$, which facilitates the design of the signal source that drives the mixer.

Figure 13:
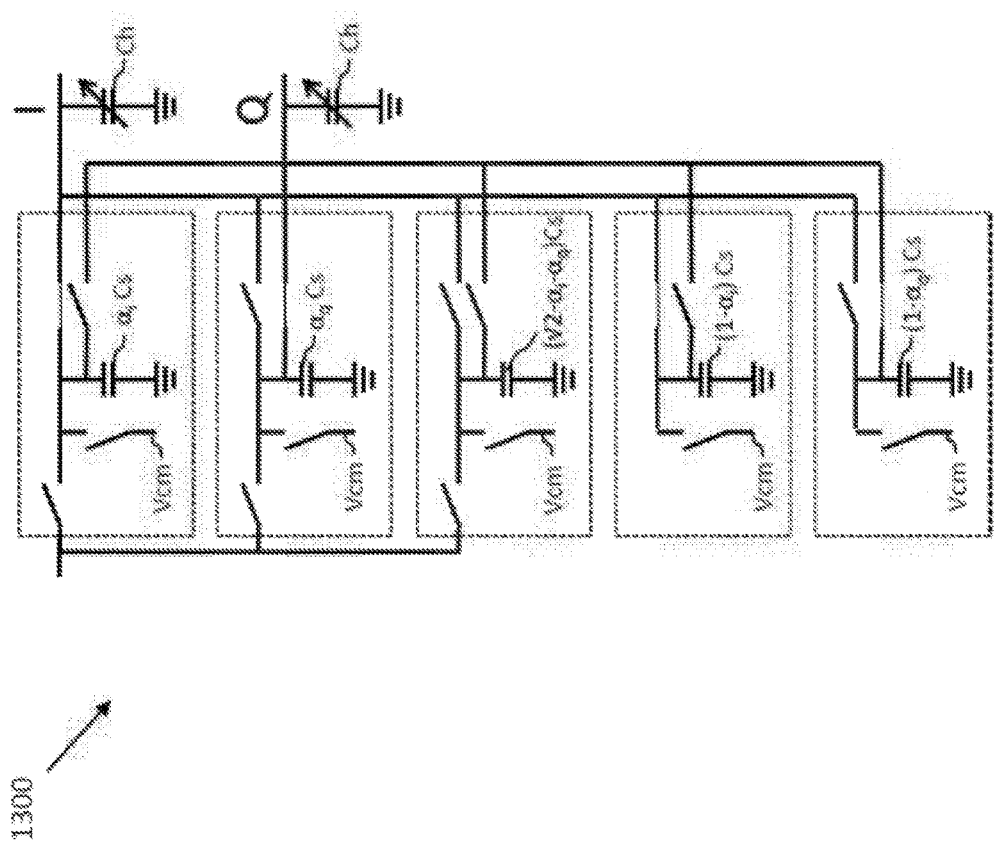
FIG. 13 shows a schematic diagram of a quadrature mixer that can be used in a communication apparatus according to an embodiment.

FIG. 13 shows a further quadrature mixer embodiment 1300 based on the above described mixer embodiments 101. Similar to the quadrature mixer embodiment 1200 of FIG. 12 the quadrature mixer embodiment 1300 of FIG. 13 is implemented for sharing unit cells 140 between the I channel and the Q channel of the quadrature mixer. However, different to the quadrature mixer embodiment 1200 of FIG. 12 in the quadrature mixer embodiment 1300 of FIG. 13 the clock gating is performed on the output switches based on the mixer embodiments 101 shown in FIGS. 6 and 7.

In the quadrature mixer embodiment 1300 shown in FIG. 13, the input signal is sampled on about $\sqrt{2}·N$ unit capacitors $C_u$ resulting in a total capacitance of about $\sqrt{2}·C_s$. During the "high" phase of the next clock signal, $n_i$ of these unit cells 140 are connected to the hold capacitor $C_h$ in the I channel and $n_q$ of these unit cells 140 are connected to the hold capacitor $C_h$ in the Q channel of the quadrature mixer embodiment 1300, wherein $0≤n_i≤N$, $0≤n_q≤N$ and $N≤n_i+n_q≤\sqrt{2}·N$. At the same time, dummy unit cells are included in both channels in order to achieve a total capacitance $C_s$ in each channel.

For the quadrature mixer embodiment 1300 shown in FIG. 13, only about $\sqrt{2}·N$ unit capacitors $C_u$ and about $(2-\sqrt{2})N$ dummy capacitors $C_d$ are required, which means that the total capacitance is only $2C_s$. Actually, this represents the lowest achievable total capacitance, because during the charge sharing phase each of the channels I and Q needs a total capacitance of $C_S$ to be connected to the hold capacitor $C_h$. Moreover, in the quadrate mixer embodiment 1300 shown in FIG. 13 the clock gating has been shifted from the timing-sensitive input switches to the output switches.

However, in comparison to the quadrature mixer embodiment 1200 shown in FIG. 12 the quadrature mixer embodiment 1300 shown in FIG. 13 requires additional switches so that the unit cells and the dummy cells can be connected to the output either of the I channel or of the Q channel. These additional switches can add more parasitic capacitance. Moreover, the signal routing can become more complicated.

In the below additional embodiments of the mixer 101 will be described that in comparison to the mixer embodiments shown in FIGS. 3 and 6 comprise differently configured unit cells 140 and/or blocks of unit cells 140. The unit cells discussed below can either be implemented using an architecture including a transfer capacitor $C_t$ or dummy unit cells in order to keep the total capacitance involved in sampling and charge transfer to $C_h$ equal to $C_s$.

As already described above, a unit cell 140 of the mixer 101 shown in FIG. 3 is controlled by three clock signals and one data bit based on the control code. This means that the sign bit and the three clock signals need to be routed to every single unit cell 140 in a given block 350 of unit cells 140 of the mixer 101 shown in FIG. 3. In addition, each unit cell 140 also requires one of the control code data bits. In an alternative embodiment, the clock signal $φ_1$ can be gated with the sign bit and its inverse outside of the matrix of unit cells 140 and then distributed thereover. In this case, two clock signals, i.e. $φ_0$ and $φ_3$, and two gated clock signals, i.e. "$φ_1$ & sign" and "$φ_1$ & sign'", need to be routed to every unit cell 140 in a given block 350 of unit cells 140 and, in addition, each unit cell 140 still has to be provided with one of the control code data bits. In both cases, this routing can cause significant parasitic capacitance and thus influence or even dominate both the power consumption of the clock signal and data drivers and the input impedance of the mixer 101 shown in FIG. 3. This situation might be improved by increasing the spacing between wires, but this will increase the size of the matrix of unit cells 140, which, in turn, can increase the capacitance to the substrate on which the mixer 140 is implemented.

Several options exist to reduce the number of signals routed through the matrix of a unit cell 140 of the mixer shown in FIG. 3. All these options require additional switches and have at least two switches in series during at least some of the "high" phases of the clock signals. In order to keep the on-resistance the same, switches that are in series need to be wider, which in turn increases their gate capacitance.

Figure 14:
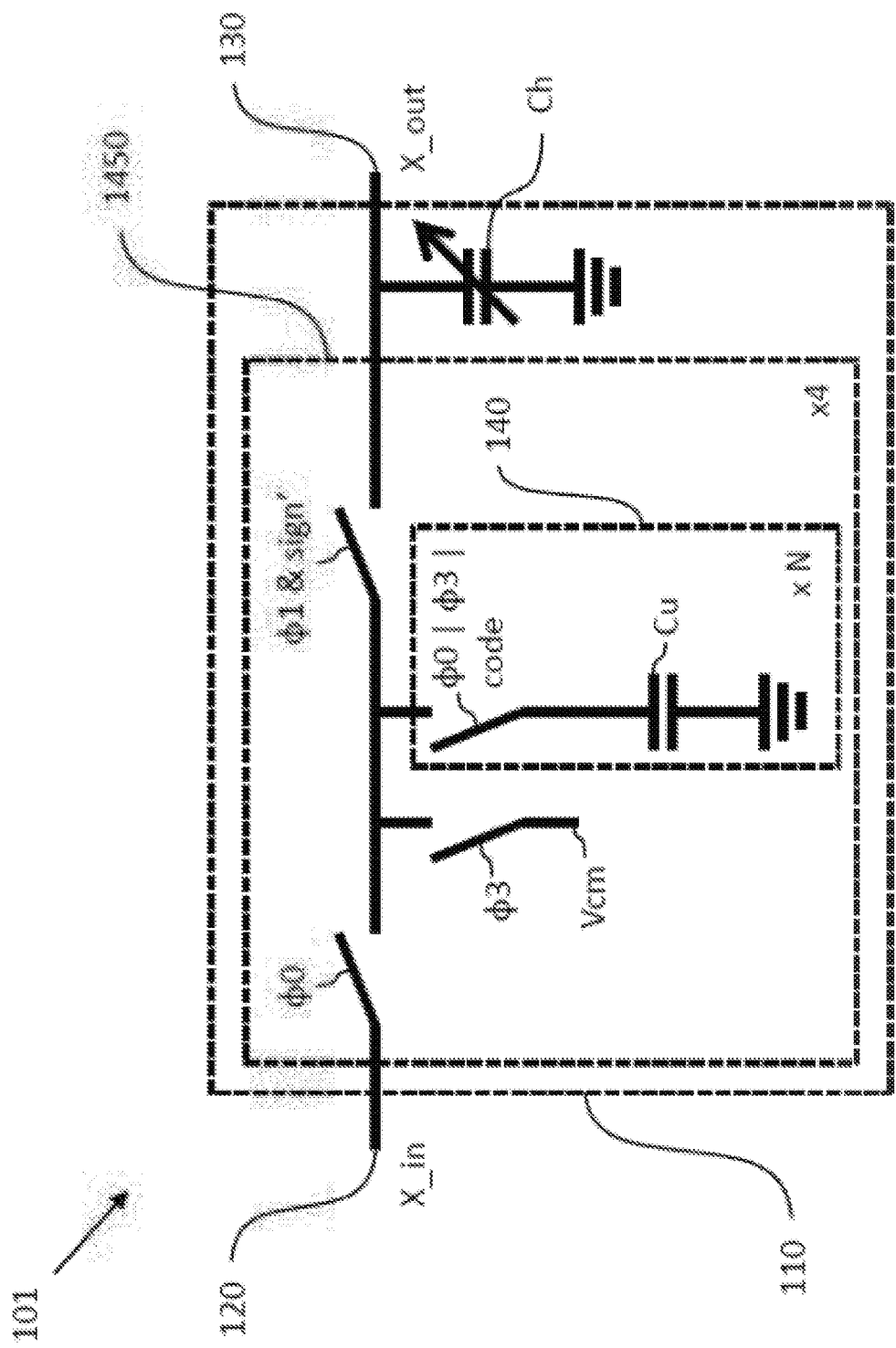
FIG. 14 shows a schematic diagram of a mixer that can be used in a communication apparatus according to an embodiment.

FIG. 14 shows a schematic diagram of a mixer 101 for generating an analog output signal $X_{OUT}$ (designated as X_out) from an analog input signal $X_{IN}$ (designated as X_in) using a mixing signal according to an embodiment. The mixer 101 comprises a scaler 110 being configured to sample the analog input signal $X_{IN}$ at a plurality of discrete points in time k with a sampling frequency $f_{S,1}$ at an input terminal 120 of the mixer 101 to obtain a sampled analog input signal $X_{IN}[k]$ having a continuous signal value, and to generate the analog output signal $X_{OUT}$ at an output terminal 130 of the mixer 101 having a continuous signal value by scaling the sampled analog input signal on the basis of a plurality of scaling coefficients A[k], i.e. $X_{OUT}=A[k]X_{IN}[k]$. The scaling coefficients A[k] are a time-discrete representation of the mixing signal.

The embodiment of the mixer 101 shown in FIG. 14 comprises in each unit cell 140 a further switch in series with the unit capacitor $C_u$. This configuration allows that all other switches can be shared by all N unit cells 140 in the block 1450 and taken out of the unit cell and, thus, out of the matrix. In this embodiment of the mixer 101 a unit cell 140 consists of only one switch and the unit capacitor $C_u$ and is controlled by only one gated clock signal and one data bit based on the control code. The gated clock signal "$\varphi_0|\varphi_3$", wherein "|" stands for the logical OR operation, shown as reference to the switch of the unit cell 140 in FIG. 14 can be generated outside the matrix and then routed to every unit cell 140 so it should be counted as only one clock signal.

For this embodiment the other clock signals, as well as the sign bit, are only necessary outside the matrix, i.e. outside the N unit cells 140. While the clock signals drive the same number of switches (which all should be twice as large, since during every "high" clock phase two switches are in series), their total load capacitance can still be smaller due to the fact that the load is concentrated in one place rather than being spread out over a large matrix so that routing capacitance can be significantly reduced.

For the embodiment of the mixer 101 shown in FIG. 14, it has to be taken into account that there will be some parasitic capacitance on the node where all switches connect. This parasitic capacitance might probably be quite large, since the node is spread out over the matrix of unit cells 140 and may therefore have a large routing capacitance. This parasitic capacitance is always present even if the control code n is set to 0, and it will always transfer some charge from the input terminal 120 to the output terminal 130, i.e. there is a parasitic charge path through the embodiment of the mixer 101 shown in FIG. 14. This poses a lower limit on the scaling coefficient or voltage gain A[k]. If this lower limit is low enough so that all required mixing signal samples can still be realized, this is no problem, but if the smallest mixing signal samples cannot be represented, this will lead to a distortion of the output signal.

This potential problem does not occur, for instance, in the unit cell 140 of the mixer 101 shown in FIG. 3. In case the control code n is zero in the embodiment of the mixer 101 shown in FIG. 3 none of the transfer switches will close and no charge is transferred to the transfer capacitor $C_t$ and the hold capacitor $C_h$.

Figure 15:
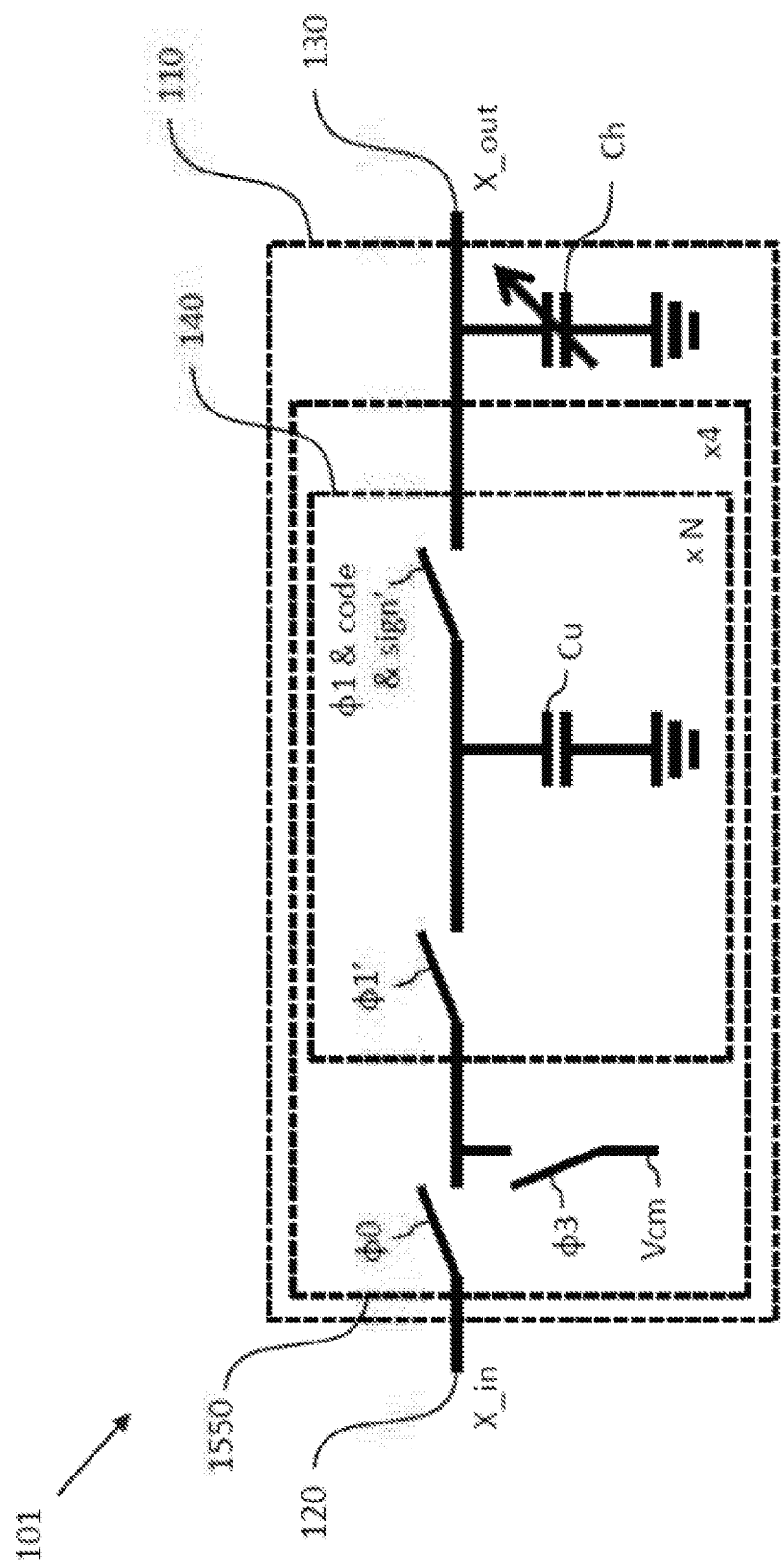
FIG. 15 shows a schematic diagram of a mixer that can be used in a communication apparatus according to an embodiment.

The above described potential problem does also not occur in the embodiment of the mixer 101 shown in FIG. 15 by having separate input and output switches. In case the control code n is zero in the embodiment of the mixer 101 shown in FIG. 15, the output switches will all stay open and no charge is transferred to the hold capacitor $C_h$. The additional input switch still allows putting the sampling and reset switches outside of the matrix, i.e. outside of the N unit cells 140 of the blocks 1550. Each unit cell 140 contains three switches (including the sign inversion switch which is not shown in FIG. 15) and requires one clock signal $\varphi_1$, one control code data bit and the sign bit. In an alternative embodiment, the clock signal $\varphi_1$ can be gated with the sign bit (and its inverse) at the top level and then distributed over the matrix of unit cells 140. In this case, one clock signal, two gated clock signals and one control code data bit are required, but this is likely to consume more power since the combined activity of the clock signals is higher than that of the sign bit.

Figure 16:
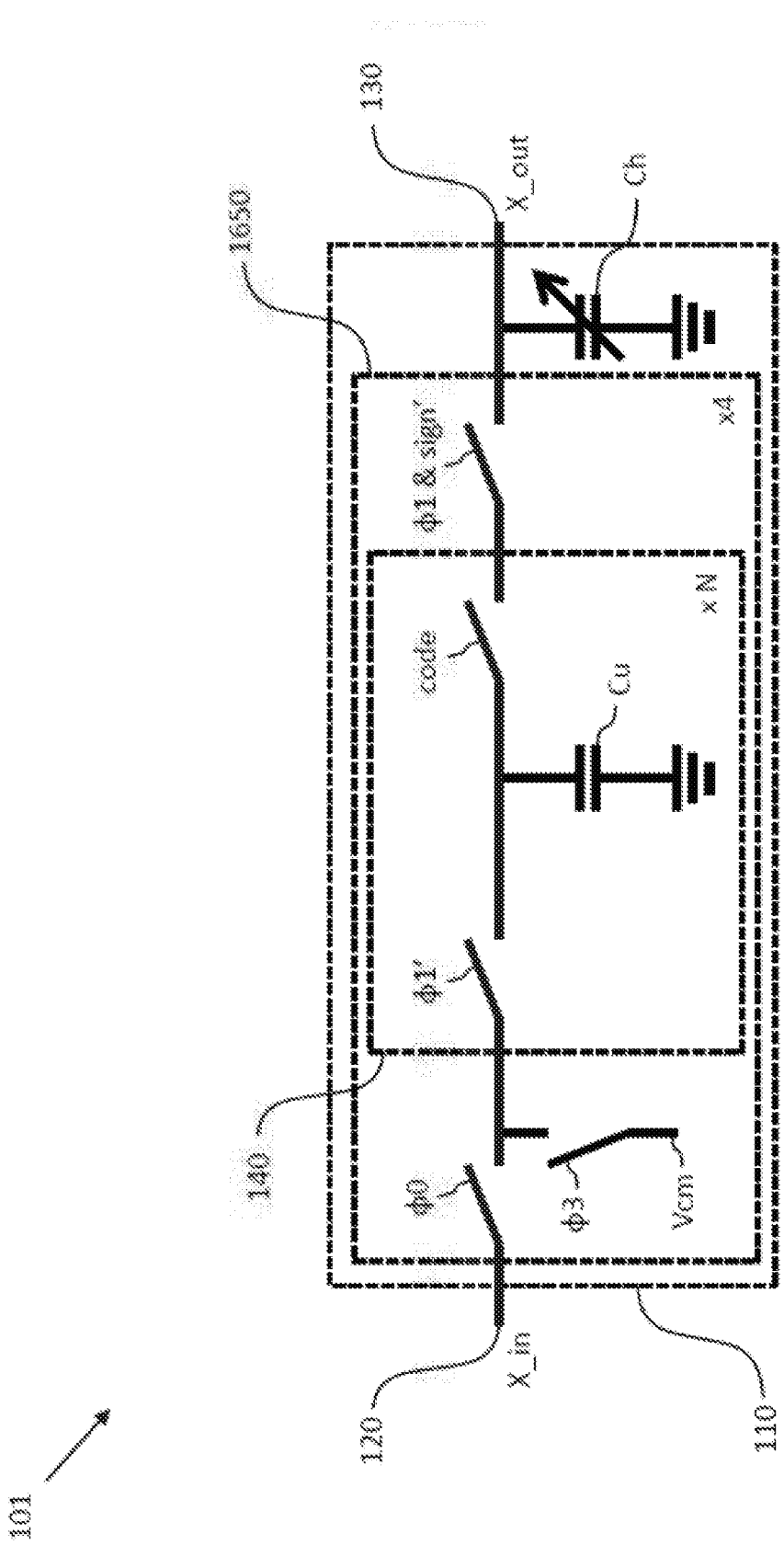
FIG. 16 shows a schematic diagram of a mixer that can be used in a communication apparatus according to an embodiment.

FIG. 16 shows a schematic diagram of a mixer 101 for generating an analog output signal $X_{OUT}$ (designated as X_out) from an analog input signal $X_{IN}$ (designated as X_in) using a mixing signal according to an embodiment.

The configuration of the N unit cells 140 of the blocks 1650 of the embodiment of the mixer 101 shown in FIG. 16 allows for a removal of the sign bit from the matrix of unit cells 140. In this embodiment the two output switches (for positive and negative sign, only the positive one is shown in FIG. 16) are moved outside of the unit cell 140, which is made possible by adding an extra switch controlled by the control code inside the unit cell 140. Thus, the unit cell 140 now contains two switches and requires one clock signal $\varphi_1'$ (wherein $\varphi_1'$ is the inverse of the clock signal $\varphi_1$) and one control code data bit.

Figure 17:
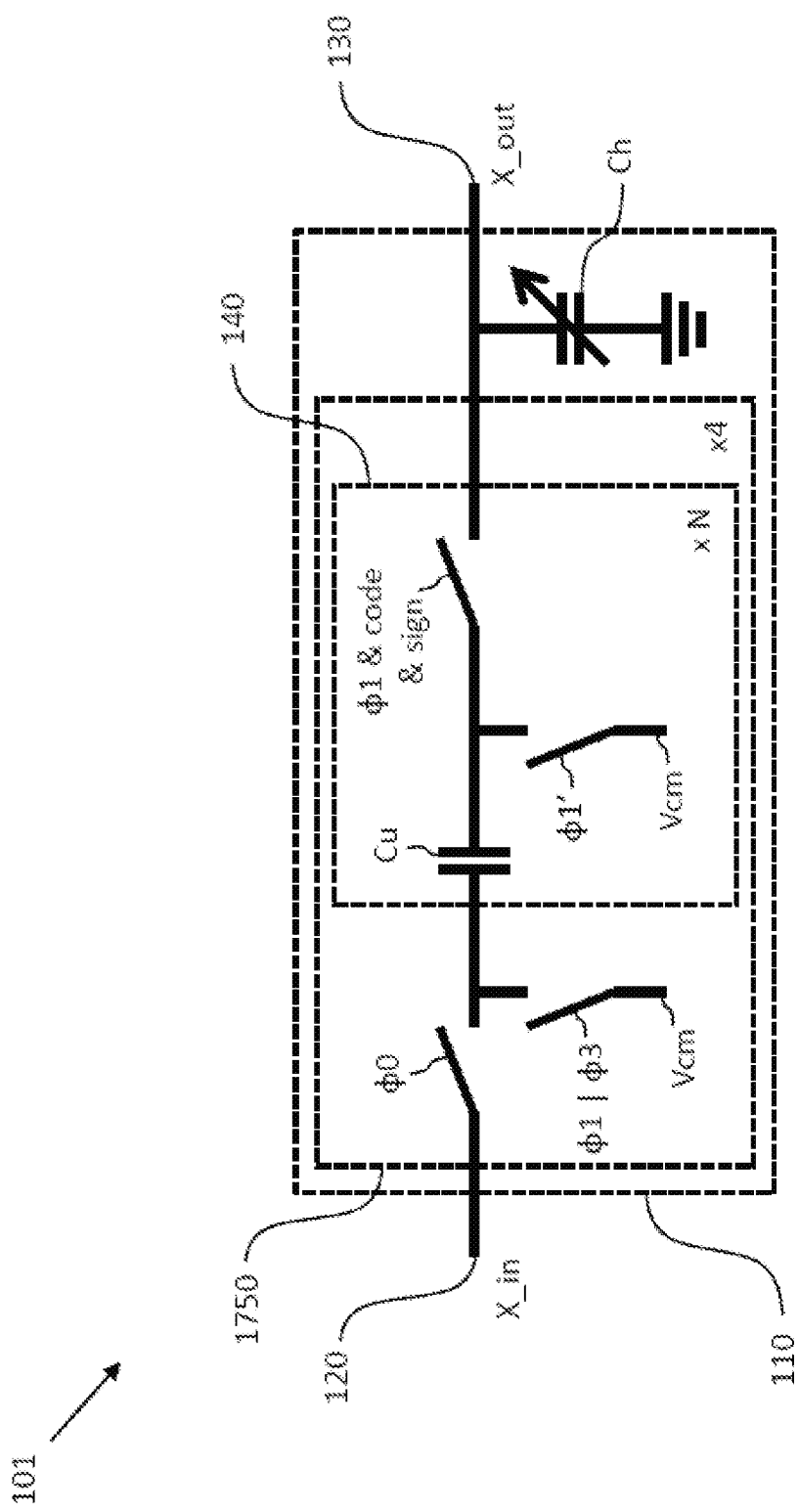
FIG. 17 shows a schematic diagram of a mixer that can be used in a communication apparatus according to an embodiment.

FIG. 17 shows a schematic diagram of a mixer 101 including blocks 1750 for generating an analog output signal $X_{OUT}$ (designated as X_out) from an analog input signal $X_{IN}$ (designated as X_in) using a mixing signal according to a further embodiment based on a modification of the embodiment of the mixer 101 shown in FIG. 15. In this embodiment the unit cell 140 is inverting, but this is generally not a problem, because the mixer 101 is implemented as a differential mixer. It can be shown that for the embodiment of the mixer 101 shown in FIG. 17 there is still no parasitic charge path. As in the case of the embodiment shown in FIG. 15, the unit cell 140 of the mixer 101 shown in FIG. 17 contains two switches and requires one clock signal pt, one control code data bit and the sign bit. However, as now there are two switches in series during each clock signal phase (one on each side of the unit cell capacitor $C_U$), the widths of all switches need to be doubled. Also, an additional clock signal "$\varphi_1|\varphi_3$" needs to be produced.

Figure 18:
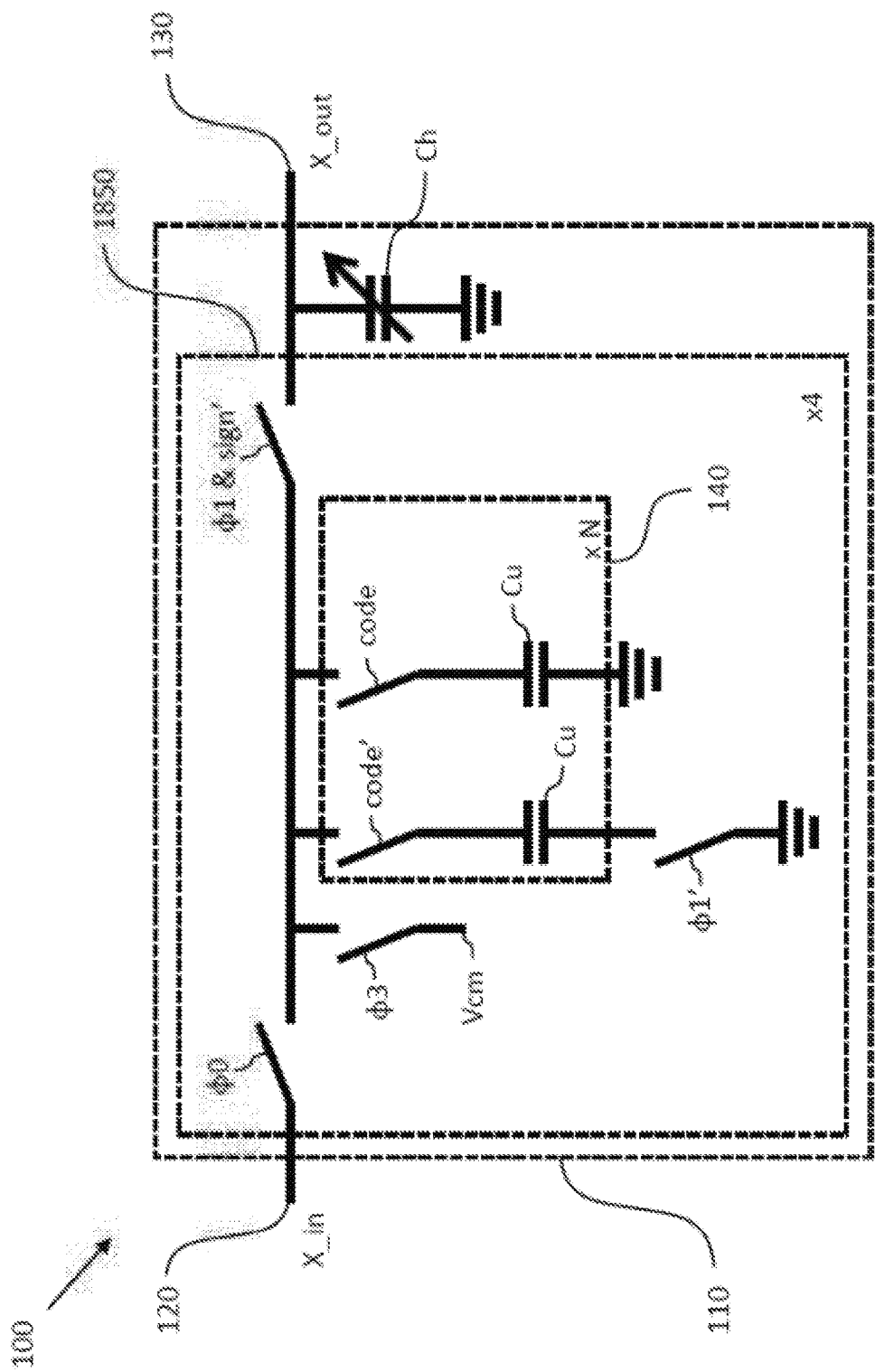
FIG. 18 shows a schematic diagram of a mixer that can be used in a communication apparatus according to an embodiment.

FIG. 18 shows a schematic diagram of a mixer 100 for generating an analog output signal $X_{OUT}$ (designated as X_out) from an analog input signal $X_{IN}$ (designated as X_in) using a mixing signal according to a further embodiment. The unit cell 140 in block 1850 of the mixer 100 shown in FIG. 18 provides the advantage of requiring no clock signals at all. In the embodiment of the mixer 100 shown in FIG. 18 all switches controlled by one of the clock signals have been moved outside of the matrix of unit cells 140. The only signal directed to a unit cell 140 is the control code bit. An effect of this is that the sampling capacitor is already disconnected during the sampling phase. For this reason, a dummy capacitor is added (on the left of the unit cell 140 in FIG. 1), which is disconnected by means of the clock signal $\varphi_1'$, i.e. the inverted clock signal $\varphi_1$, when the output switch is closed (by means of the clock signal $\varphi_1$).

The unit cell 140 of the embodiment of the mixer 100 shown in FIG. 18 requires the control code data bit to change during the unused clock phase $\varphi_2$. In that way, the capacitor that will be used for sampling is already connected during the "high" phase of the clock signal $\varphi_3$ so that it is correctly reset.

Figure 19:
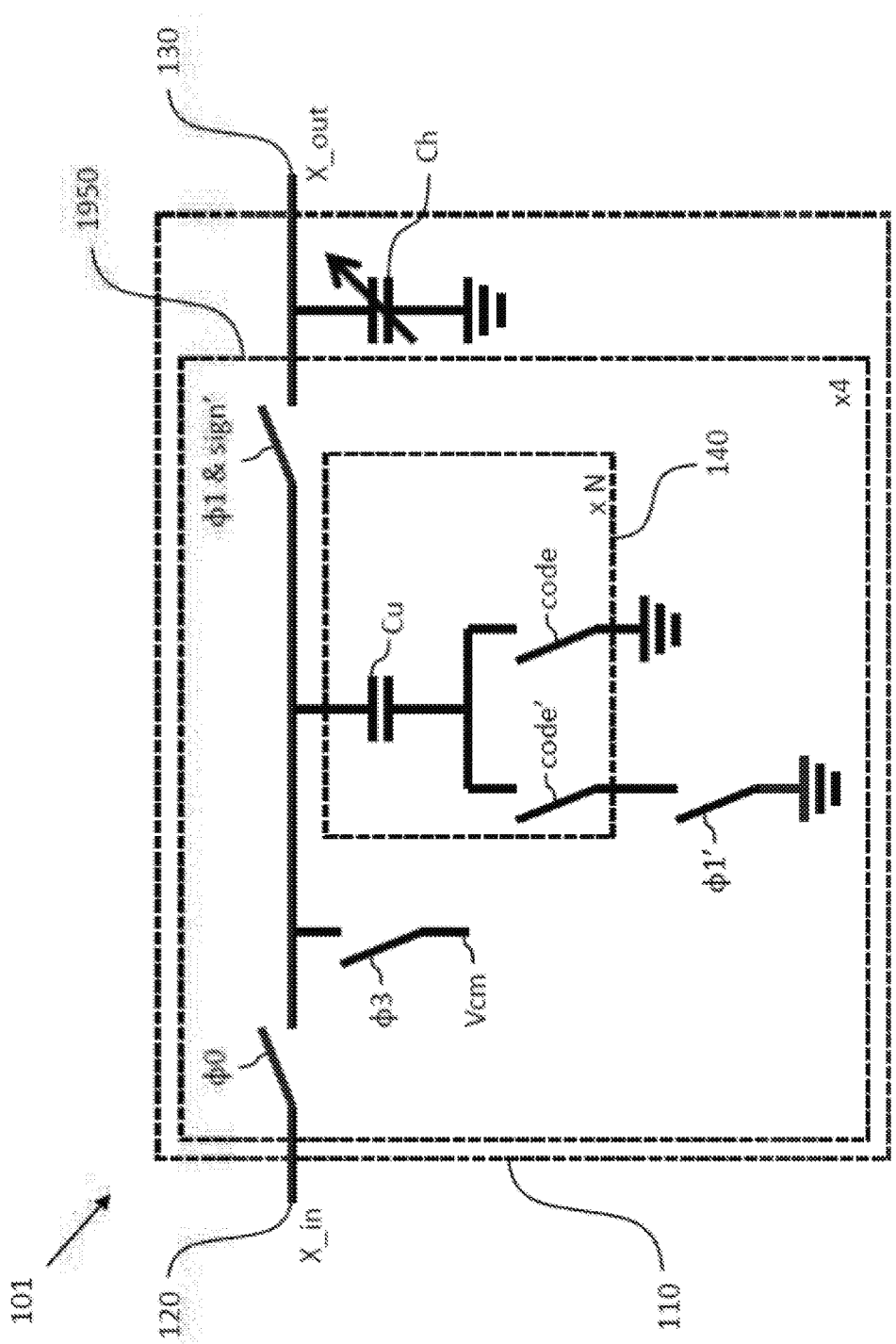
FIG. 19 shows a schematic diagram of a mixer that can be used in a communication apparatus according to an embodiment.

FIG. 19 shows a schematic diagram of a mixer 101 for generating an analog output signal $X_{OUT}$ (designated as X_out) from an analog input signal $X_{IN}$ (designated as X_in) using a mixing signal according to a further embodiment based on a modification of the embodiment of the mixer 100 shown in FIG. 18. The unit cell 140 in a block 1950 of the embodiment of the mixer 101 shown in FIG. 19 comprises only a single unit capacitor $C_u$. However, in this embodiment the parasitic charge path can be expected to transfer even more charge, since it now also includes the parasitic capacitance of the unit capacitor $C_u$, which is usually larger than the parasitics of the switches.

Figure 20:
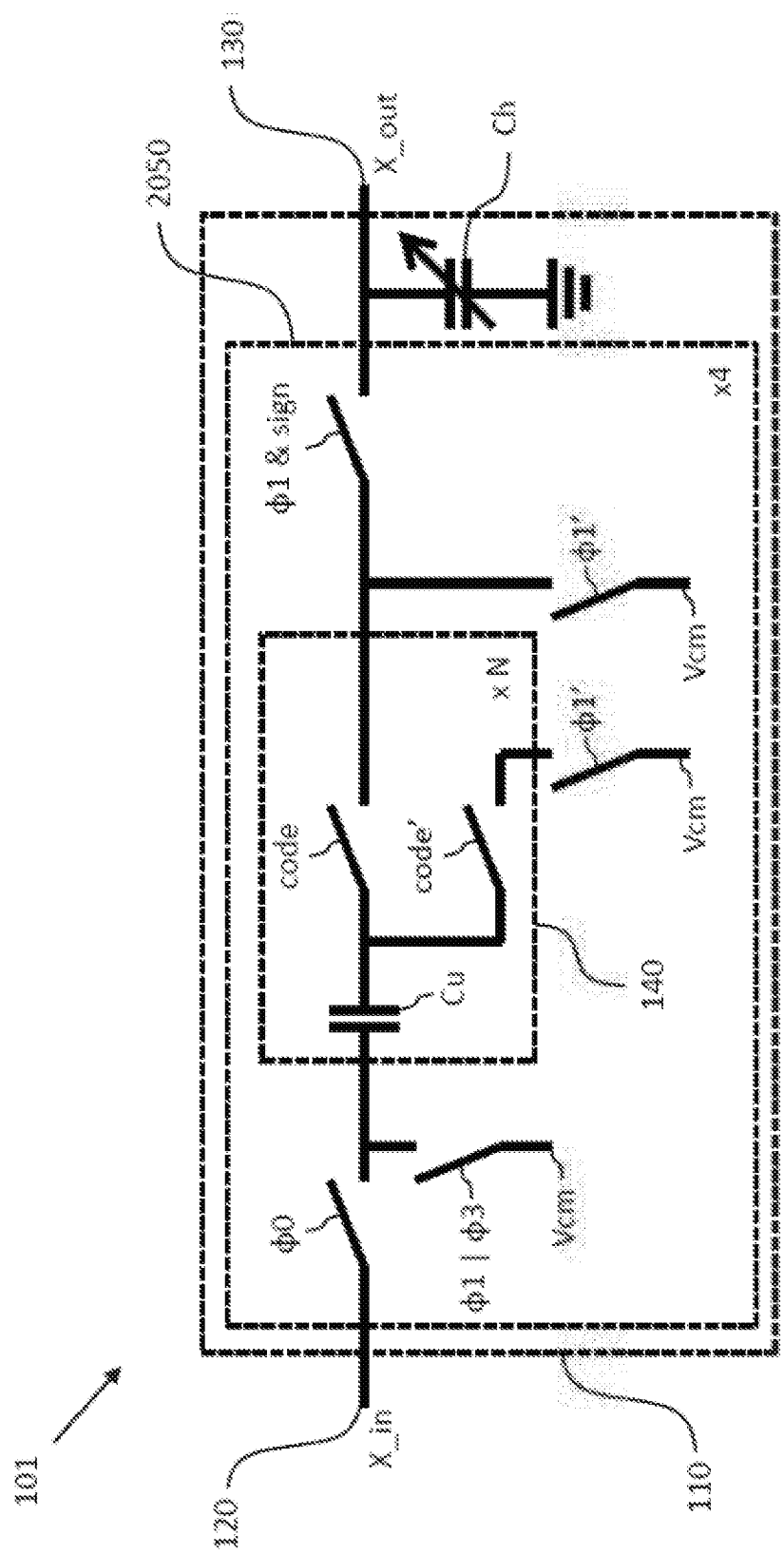
FIG. 20 shows a schematic diagram of a mixer that can be used in a communication apparatus according to an embodiment.

FIG. 20 shows a schematic diagram of a mixer 101 for generating an analog output signal $X_{OUT}$ (designated as X_out) from an analog input signal $X_{IN}$ (designated as X_in) using a mixing signal according to a further embodiment based on a modification of the embodiment of the mixer 101 shown in FIG. 19. The configuration of the unit cell 140 in blocks 2050 of the embodiment of the mixer 101 shown in FIG. 20 removes the parasitic charge path, while still requiring only one unit capacitor $C_u$. However, in this embodiment there are now three switches in series during any clock phase.

Figure 21:
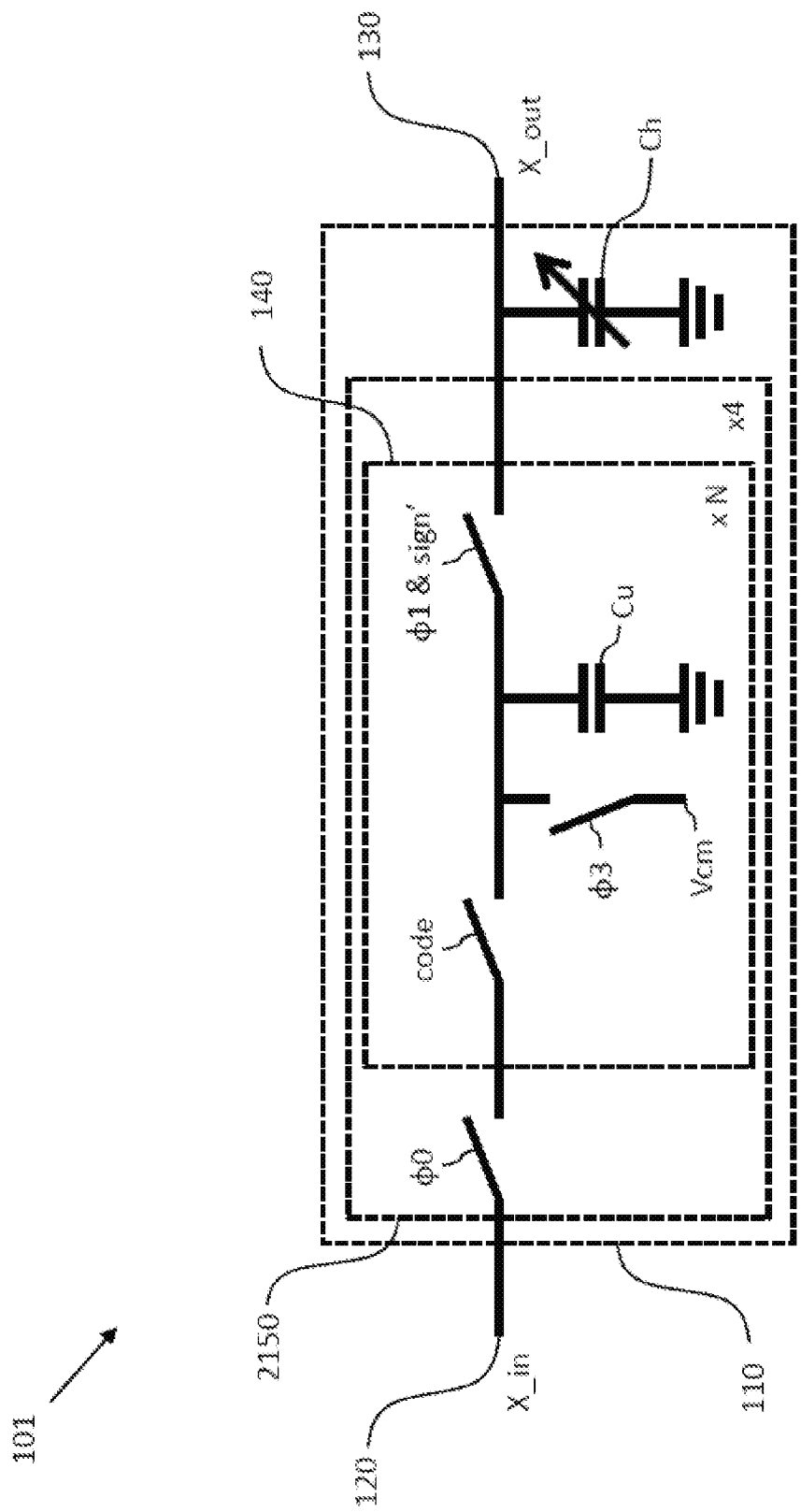
FIG. 21 shows a schematic diagram of a mixer that can be used in a communication apparatus according to an embodiment.

FIG. 21 shows a schematic diagram of a mixer 101 for generating an analog output signal $X_{OUT}$ (designated as X_out) from an analog input signal $X_{IN}$ (designated as X_in) using a mixing signal according to a further embodiment based on a modification of the embodiment of the mixer 101 shown in FIG. 3. The difference is that the control code is no longer controlling the output switch, but a duplicated version of the input switch. This is particularly interesting for the mixer embodiments 101 shown in FIGS. 11A-11C and 12, which have dummy unit cells connected to the input terminal 120. The unit cells 140 in blocks 2150 shown in FIG. 21 allow exploiting the benefits of the mixer embodiments 101 shown in FIGS. 11A-11C and 12 without having to gate the clock signal that controls the input switch. The first input switch is now directly controlled by a clock signal, which allows accurate timing of the edges. The second input switch is controlled only by a control code data bit, which can be set well before the clock edge of the sampling clock signal such that it does not cause any timing issues.

In the below, different effects of the choice of the mixing frequencies $f_{MIX,1}$ or $f_{MIX,2}$ will be described, which apply to essentially all of the mixer embodiments described above. In order to avoid any unnecessary repetitions in the below description $f_{MIX}$ will be used to refer to $f_{MIX,1}$ or $f_{MIX,2}$ and $f_S$ will be used to refer to $f_{S,1}$ or $f_{S,2}$.

The mixing frequency $f_{MIX}$, i.e. the first mixing frequency $f_{MIX,1}$, and/or the second mixing frequency $f_{MIX,2}$, is best chosen such that the ratio to the respective sampling frequency $f_S$ is a rational number, i.e.:

$$\frac{f_{MIX}}{f_s} = \frac{A}{B} \quad (16)$$

where A and B are integers. In this case, the mixing signal will be periodical when sampled at $f_s$ so that it can be stored in an LUT or periodical shift register of limited size of the mixer 101.

If the ratio is not a rational number, the sampled representation of the mixing signal will not be periodical even though the analog mixing signal is periodical. In this case, the mixing signal samples need to be calculated at runtime, which requires more computation resources and thus more area and power.

It can be shown that the period of the mixing signal sampled at $f_S$ is L samples, where L is given by:

$$L = \frac{B}{gcd(A, B)} \quad (17)$$

where gcd(A,B) is the greatest common divisor of x and y. Thus, in the general case, a LUT of L samples is required, which samples at $f_S$. However, if the mixer 101 is implemented as a polyphase mixer, where each phase samples at $f_{REF}=f_S/4$ and processes only every 4th sample, it is easier to include one LUT per mixer block such that the LUTs only need to sample at $f_{REF}$ as well. If L is a multiple of 4, the samples can be distributed over the 4 sub-LUTs so that each sub-LUT contains only L/4 samples. If L is a multiple of 2 but not of 4, each sub-LUT will contain L/2 samples, and if it is not a multiple of 2, each sub-LUT will contain the same L samples but in a different order. To summarize, each sub-LUT contains M samples, where M is given by:

$$M = \frac{L}{gcd(L, 4)} = \frac{B}{gcd(4A, B)} \quad (18)$$

In general, requiring $f_{MIX}$ to coincide with the input signal frequency can result in a quite large value for M since the minimal numbers A and B are large. However, usually a nonzero intermediate frequency (IF) is preferred and there is some flexibility in choosing the IF, and thus also in choosing $f_{MIX}$. In this case, $f_{MIX}$ can be chosen such that A and B are fairly small numbers and M can be kept low.

Due to the finite number of unit cells 140, mixing signal samples will have to be rounded, which causes quantization noise. This quantization noise will also be periodical with the LUT length M such that it will show up as spurs at discrete frequencies in the mixing signal spectrum rather than as a noise floor as one might expect. The spacing between the spurs is given by:

$$\Delta f_{spur} = \frac{f_s}{M} = \frac{gcd(4A, B)}{D} \cdot f_s, \quad (19)$$

wherein the spurs can occur at all frequencies:

$$f_{spur,k} = f_{MIX} + k \cdot \Delta f_{spur} \forall k \in \mathbb{Z} \quad (20)$$

Thus, the selection of the ratio A/B is a trade-off between the LUT length M (usually the least important effect) and the spur spacing $\Delta f_{spur}$ and the IF. Usually the best strategy is to maximize $\Delta f_{spur}$ while keeping the IF within predefined boundaries. The higher the spacing between the spurs and the desired signal, the easier it will be to filter out the spurs after mixing (they will then be at $f_{IF}+k \cdot \Delta f_{spur}$). The height of the local oscillator spurs can only be improved by adding more bits, i.e. more unit cells 140 to the mixer 101.

In an embodiment, the mixer 101 is configured to mix the input signal with a mixing signal having a frequency $f_{REF}$, for instance, for bands where the duplex distance is not too high. In the context of the above equation (16) this means that A=1 and B=4 so that:

$$\frac{f_{MIX}}{f_{REF}} = \frac{f_{MIX}}{f_s/4} = \frac{4A}{B} = 1.$$

It then follows that L=4 and M=1, and the local oscillator samples stored in the LUT reduce to the sequence {1, 0, −1, 0}. A large advantage of this is that these samples perfectly represent a sinusoid with amplitude 1 without any quantization noise. Thus, there will be no quantization noise spurs.

In this particular case, it is also possible to implement a mixing signal with an amplitude of √2 without any quantization noise, by replacing the LUT samples by the sequence {1, 1, −1, −1}. This will reduce the mixer loss by 3 decibels (dB) while still not introducing any quantization noise. This optimization is not possible in general since in general the LUT stores multiple periods of the mixing signal sampled at different points in time such that one of the samples will occur at or close to the peak of the mixing signal and thus needs to be larger than 1. This is not possible, as the highest possible value for the scaling coefficient A[k] is α=1.

When $f_{MIX}=f_{REF}$, all unit cells 140 in one block 350 (as shown in FIG. 3) of the mixer 101 are permanently on (for samples 1 and −1) or permanently off (for samples 0), and such a mixer 101 operates as a complicated implementation of a conventional passive mixer.

Several of the mixer embodiments 101 described above comprise four mixer blocks (or mixer phases) 350 of unit cells 140. However, as already mentioned above, having four mixer blocks is not essential for the mixer 101 to work, but just a way to achieve an effective sampling rate of $4f_{REF}$ using only 25% duty-cycle clock signals at $f_{REF}$.

For low frequencies $f_{REF}$ or fast transistor technologies, it can be possible to implement a mixer 101 with a single mixer block per channel (i.e. one block for the I channel and one for the Q channel). In this case, four 25% clock signals with clock frequency $fs=4f_{REF}$ are required. In this way, the different processing steps of the mixer 101 can all be completed during one $T_S$ period such that the same block of the mixer 101 can be used to process the next sample. Such a single block mixer 101 differs from a 4-block mixer 101 in the following respects.

The 4-block mixer 101 connects each block or phase to the input for a full $T_S$ period. Thus, with the exception of the moments when the clock signals are switching, the signal source always has to drive the same load. The single block mixer 101 only connects its sampling capacitor to the input during 25% of the sampling period $T_S$. Hence the signal source must be able to handle a strongly variable load.

The available settling time for sampling, charge-sharing and resetting is now $T_S/4$ instead of $T_S$ for the 4-block mixer 101. This means that to achieve equally good settling, all switches of the single block mixer 101 will have to be 4 times wider than in the 4-block mixer 101.

Because of the increased switches, the input capacitance per mixer block is 4 times higher. However, this is compensated by the fact that there is only one mixer block instead of 4. Thus the total clock load is the same, and since the clock frequency is 4 times higher, a 4 times higher power consumption can be expected.

Similarly, a mixer 101 with 2 mixer blocks per channel can be implemented, which uses four 25% clock signals at $2f_{REF}$. The implications are similar as for the single block mixer 101. The 2-block mixer 101 only connects one of its sampling capacitors to the input for 50% of the time, so the signal source must be able to handle a variable load. The switches of the 2-block mixer 101 have to be twice as large as in the 4-block mixer 101. The power consumption will be twice as high as in the 4-block mixer 101.

The higher power for mixers 101 with fewer blocks indicates an interesting tendency which can also be exploited in the other direction, by implementing a mixer 101 with e.g. 8 mixer blocks per channel. In this case eight 25% clock signals at $f_{REF}/2$ are needed, where the clock signal pulse of a clock signal phase overlaps with the pulses of the adjacent clock signal phases. Since the sampling clock signals overlap, the 8-block mixer 101 connects 2 of its blocks to the input simultaneously at any moment in time. Thus the source does not have to handle a variable load but the load will be higher than for the 4-block mixer 101. In addition, the parasitic input capacitance of the 8-block mixer 101 will be higher as now the parasitics of 8 blocks per channel are connected to the input. The switches need to be only half as large as in the 4-block mixer 101. The power consumption will be only half as high as in the 4-block mixer 101. This is an interesting way to reduce the power consumption at the expense of doubled area and input capacitance.

Alternatively, non-overlapping 12.5% clock signal phases can be used to control the sampling switches of the 8-block mixer 101 such that the settling time is the same as in the 4-block mixer 101 and the switches need to have the same size. In this way, the source that drives the input will have to drive the same load as in the 4-block mixer 101. Meanwhile, the other switches can be halved and controlled by overlapping 25% clock signals. Doing so still saves power but less than in the above architecture.

The person skilled in the art will appreciate that the above multi block mixer embodiments 101 can be further extended to a 16-block mixer, a 32-block mixers, and so on.

As the person skilled in the art will appreciate, for a given mixer implementation, the integers A and B which define the ratio between $f_{mix}$ and $f_s$ can be changed at will by storing different samples n[k] in the LUT. In addition, the reference or local oscillator frequency $f_{ref}$, and thus the sampling rate $f_s=4f_{ref}$ can also be changed by applying a different clock signal. As will be described in the below, the choice of these parameters have some important effects that lead to further beneficial embodiments of the present disclosure.

As already described above, in embodiments of the disclosure the mixing frequency $f_{mix}$ for the first mixer 101 and/or the second mixer 101' can be chosen as:

$$f_{mix} = \frac{A}{B} \cdot f_s.$$

If the input signal is located at a frequency $f_{rx}$, the corresponding output signal will be at the IF $f_{IF}$ with:

$$|f_{IF}| = |f_{rx} - f_{mix}|,$$

(assuming that both $f_{rx}$ and $f_{mix}$ are positive numbers).

If one of the above described quadrature mixer embodiments is used, the IF can be chosen to be positive or negative. If only one mixer channel is used, the signal will appear both at $f_{IF}$ and $-f_{IF}$, but may coincide with an unwanted image signal as in all non-quadrature mixers.

In an embodiment, the IF is chosen high enough such that:

$$|f_{IF}| > \frac{BW}{2},$$

where BW is the signal bandwidth at RF, in order for the IF signal to fit on one side of DC. In an additional or alternative embodiment, the IF is chosen low enough such that the IF signal fits within the bandwidth of any subsequent components of the communication apparatus 100 such as gain stages, filters, and an analog-to-digital converter (ADC).

The above formula for the mixing frequency $f_{mix}$ can also be expressed as:

$$AT_{mix} = BT_s,$$

where $T_{mix}=1/f_{mix}$ and $T_s=1/f_s$. This means that an LUT of B samples, sampled at $f_s$, can fit exactly A periods of the mixing signal. If A and B have common divisors, the LUT length can be divided by these divisors such that when sampling at $f_s$, the minimally required LUT length is:

$$L_{fs} = \frac{B}{\gcd(A, B)},$$

where gcd(A,B) is the greatest common divisor of A and B, as already has been described previously.

However, in a polyphase mixer implementation it is usually preferable to implement a separate LUT for each of the mixer phases such that the LUTs are sampled only at $f_{ref}=f_s/4$. In this case:

$$4AT_{mix}=4BT_s=BT_{ref},$$

which means that a LUT of B samples, sampled at $f_{ref}$, can fit exactly 4A periods of the mixing signal, and the minimally required LUT length when sampling at $f_{ref}$ is:

$$L_{fref} = \frac{B}{gcd(4A, B)}.$$

As the person skilled in the art will appreciate, the (first or second) mixing signal is quantized in the LUT to a discrete set of quantization levels, which causes quantization noise. Theoretically, the quantization noise is periodical with a period:

$$T_{q,id}=L_{fs} \cdot T_s$$

which means that it will not show up as white noise, but as a set of discrete spurious peaks (herein referred to as spurs) at multiples of the spur spacing:

$$\Delta f_{spur,id} = \frac{1}{T_{q,id}} = \frac{f_s}{L_{fs}} = f_s \cdot \frac{gcd(A, B)}{B}.$$

In reality, the mixer phases will be slightly different due to process variations, which means their quantization errors will be different for the same control code n. In this case, the period of the quantization noise is determined by $L_{fref}$ such that:

$$T_q = L_{fref} \cdot T_{ref}, \text{ and}$$

$$\Delta f_{spur} = \frac{1}{T_q} = \frac{f_{ref}}{L_{fref}} = f_{ref} \cdot \frac{gcd(4A, B)}{B} = f_s \cdot \frac{gcd(4A, B)}{4B}.$$

These spurs also mix with the RF input signal and will produce unwanted output spurs at frequencies:

$$f_{IF}+i \cdot \Delta f_{spur},$$

where i is any (positive or negative) real number. More importantly, the spurs may mix with unwanted input signals (also known as "blockers") located at:

$$f_{rx}+i \cdot \Delta f_{spur},$$

and mix those unwanted signals to $f_{IF}$ where they coincide with the desired signal. This means that the spurs must be low enough such that these blockers do not degrade the output signal too much.

It can be noted that the above formulas can be simplified if the fraction A/B is simplified. i.e. if one chooses A' and B' such that:

$$\frac{f_{mix}}{f_s} = \frac{A}{B} = \frac{A'}{B'}, \text{ and}$$

$$gcd(A', B') = 1.$$

In this case, the above formulas simplify to:

$$L_{fs} = B'$$

$$L_{fref} = \frac{B'}{gcd(B', 4)}$$

$$\Delta f_{spur,id} = \frac{f_s}{B'}$$

$$\Delta f_{spur} = f_{ref} \cdot \frac{gcd(B', 4)}{B'} = f_s \cdot \frac{gcd(B', 4)}{4B'},$$

the number A (or A') is no longer present in any of the formulas.

It is preferable to make $\Delta f_{spur}$ as high as possible since this puts the spurs as far away as possible from the desired signal and makes it easier to remove their mixing products using filters (before and/or after the mixer). This means that the number B' should be chosen as small as possible.

In an embodiment, the communication apparatus 100 is a CA receiver. For a CA receiver there may, depending on the CA scenario, be multiple transmit frequencies as well. In an embodiment, there may be multiple PLLs available in the transmitter such that different digital mixers in the CA receivers may use different transmission local oscillators frequencies as their $f_{ref}$. This way, a CA receiver without any PLLs can be realized with increased flexibility compared to the single-channel case.

In an embodiment, one could also choose to include one or more PLLs in the receiver. As long as the number of PLLs is lower than the number of receive mixers, there is still an area and power improvement compared to a traditional CA receiver which includes one PLL for every mixer. The improvement will be smaller than without receiving PLLs, but the flexibility is increased because the receiving PLL frequency (or frequencies) can be freely chosen without regard to the transmitter. This can be used to improve other performance metrics, such as the spur spacing described above.

In an embodiment, a CA receiver with multiple transmission PLLs can be implemented in a way very similar to the aforementioned single-receiver single-transmitter case. However, in such an embodiment there is some additional freedom in that for each receiver, one can now choose between all the transmission PLL frequencies, i.e. there is no need to use the one whose frequency is closest. By choosing a frequency that is further away from the receiving frequency, it is often possible to reduce the number B' in the $f_{mix}/f_s$ ratio, which results in higher spur spacing.

In an embodiment, it is also possible to use one transmission PLL frequency for multiple receivers. For example, if there are 3 receivers and 3 transmitters, and the corresponding frequencies are such that for i=1, 2, 3, the transmission frequency of transmitter i is closest to the receiving frequency of receiver i, there is no reason why the mixers in receivers 1, 2, and 3 could not use the transmission frequencies from mixers 2, 1, and 1, respectively, as their reference frequencies. In an embodiment, this additional freedom can be used to improve the trade-off between spur spacing and IF for some or all of the mixers in the CA receiver 100.

As the person skilled in the art will appreciate, including one or more receiving PLLs provides one or more additional reference frequencies, which in addition can be chosen only to optimize the receiver performance, without any relation to the transmit bands imposed by the communication standards. Such embodiments provide extra degrees of freedom, which again can be used to improve the trade-off between spur spacing and IF for some or all of the mixers in the CA receiver 100.

Having one or more receiving PLLs also makes it possible in an embodiment to not use the transmission PLL frequencies at all. This can be advantageous e.g. if the transmission PLLs are located far away from the receiver and routing their output frequencies to the receiver has a high cost.

As already briefly described above, in an embodiment the analog input signal $X_{IN}$ can be equal to the analog input signal $Y_{IN}$ and the communication apparatus 100 is configured to combine the analog output signal $Y_{OUT}$ of the second mixer 101' with the analog output signal $X_{OUT}$ of the first mixer 101, in particular to subtract the analog output signal $Y_{OUT}$ of the second mixer 101' from the analog output signal $X_{OUT}$ of the first mixer 101.

In an embodiment, where the communication apparatus 100 is implemented in the form of a CA receiver, each receiver path of the CA receiver can receive the same RF input signal, but mix it with a different mixing frequency. This means that one path potentially contains a lot of information about any unwanted components present in another path. As will be described in more detail further below, by intelligently combining outputs from different receiver paths in embodiments of the disclosure, some of these unwanted components can potentially be removed.

In an embodiment, where one or more receiver paths are not in use (e.g. a CA receiver that supports up to 5 bands, i.e. comprises 5 mixers, but is currently only receiving 3 bands), they can be configured at will to receive unwanted signals so they can be subtracted from the other receivers' output signals to improve signal quality.

In an embodiment, even receiver paths that are in use (i.e. that are receiving some signal band of their own) may still be used to improve other receivers' signal quality. For example, while one receiver is producing a desired output signal at IF, it may still produce other signals at other frequencies. These signals may also be present in the outputs of another receiver, where they happen to coincide with the desired signal. By combining the outputs of these two mixers, the undesired component can be removed and the desired signal is restored.

As already described above, the digital local oscillator signal, e.g. the first mixing signal and/or the second mixing signal, is both quantized and periodical, which implies that it contains quantization noise that shows up as spurious peaks in the spectrum, also known as spurs. This means that the input signal is not only mixed with the intended mixing signal, but also with each of the spurs. If a large unwanted signal, also known as a blocker, is present at some offset from the intended RF signal, mixing with one of the spurs may cause the blocker to end up at IF, where it would coincide with the desired signal. Since blockers can be much larger than the desired signal, the blocker may mask the signal completely even though the spurs are often quite small compared to the main mixing signal. This effect is illustrated by the following example. It uses arbitrary scaling for the signals such that magnitudes are in dB rather than absolute units such as decibel-milliwatts (dBm)/hertz (Hz).

Figure 22:
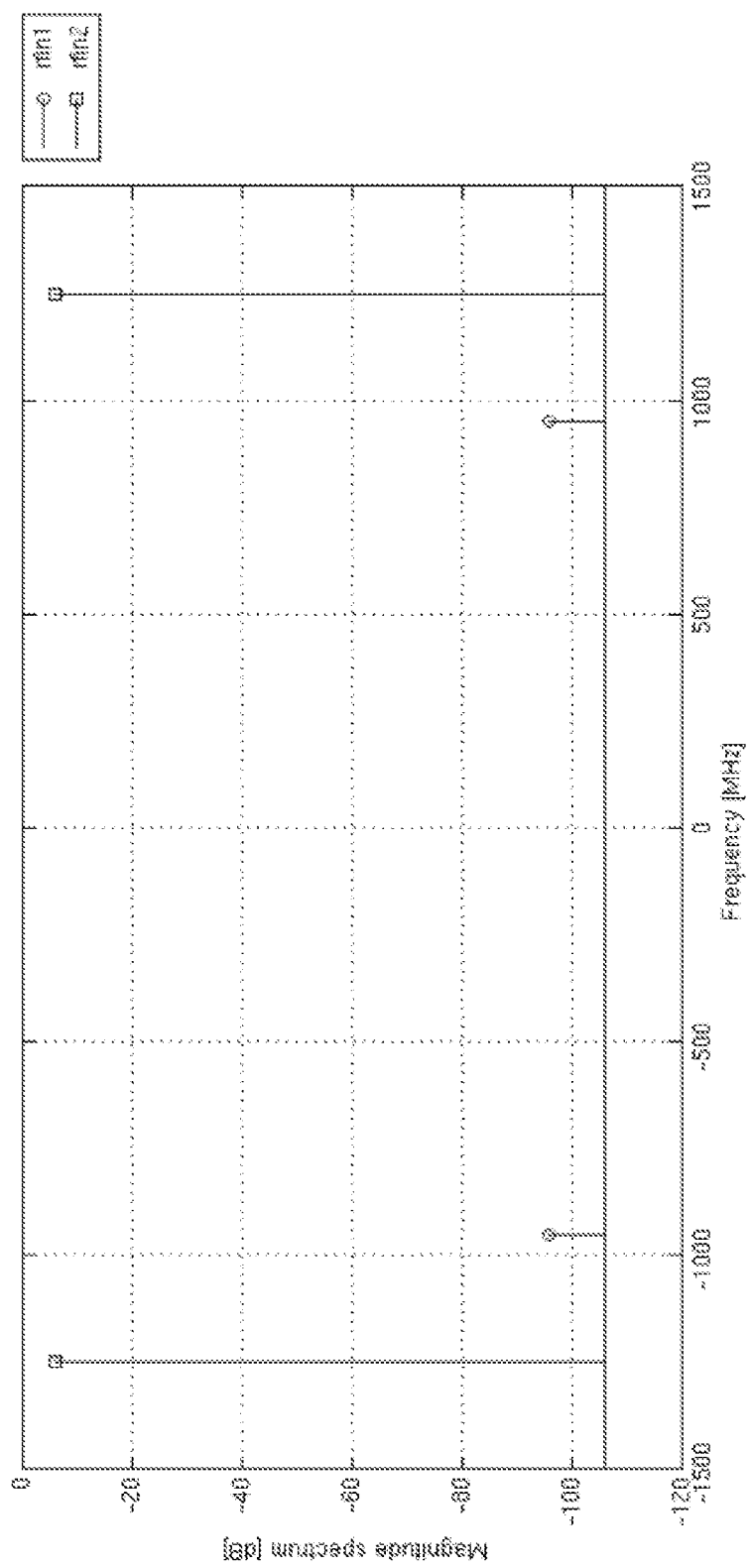
FIG. 22 shows an exemplary frequency spectrum of a radio frequency (RF) input signal to illustrate a communication apparatus according to an embodiment.

For this example, it is assumed that the desired RF signal is located at 950 megahertz (MHz) and has a magnitude of −96 dB. At 1250 MHz, there is an undesired blocker signal with a magnitude of −6 dB. Since the input signal is real, the same signal components occur at negative frequencies. The spectrum of this exemplary signal is shown in FIG. 22.

The signal is received using a mixer, such as the first mixer 101 or the second mixer 101' shown in FIG. 1, which has an $f_s$ of 8.4 gigahertz (GHz) and a ratio A'/B'=3/28. These results in:

$$f_{mix} = \frac{A'}{B'} \cdot f_s = 900 \text{ MHz, and}$$

$$\Delta f_{spur} = f_s \cdot \frac{gcd(B', 4)}{4B'} = f_s \cdot \frac{4}{112} = 300 \text{ MHz}.$$

Figure 23:
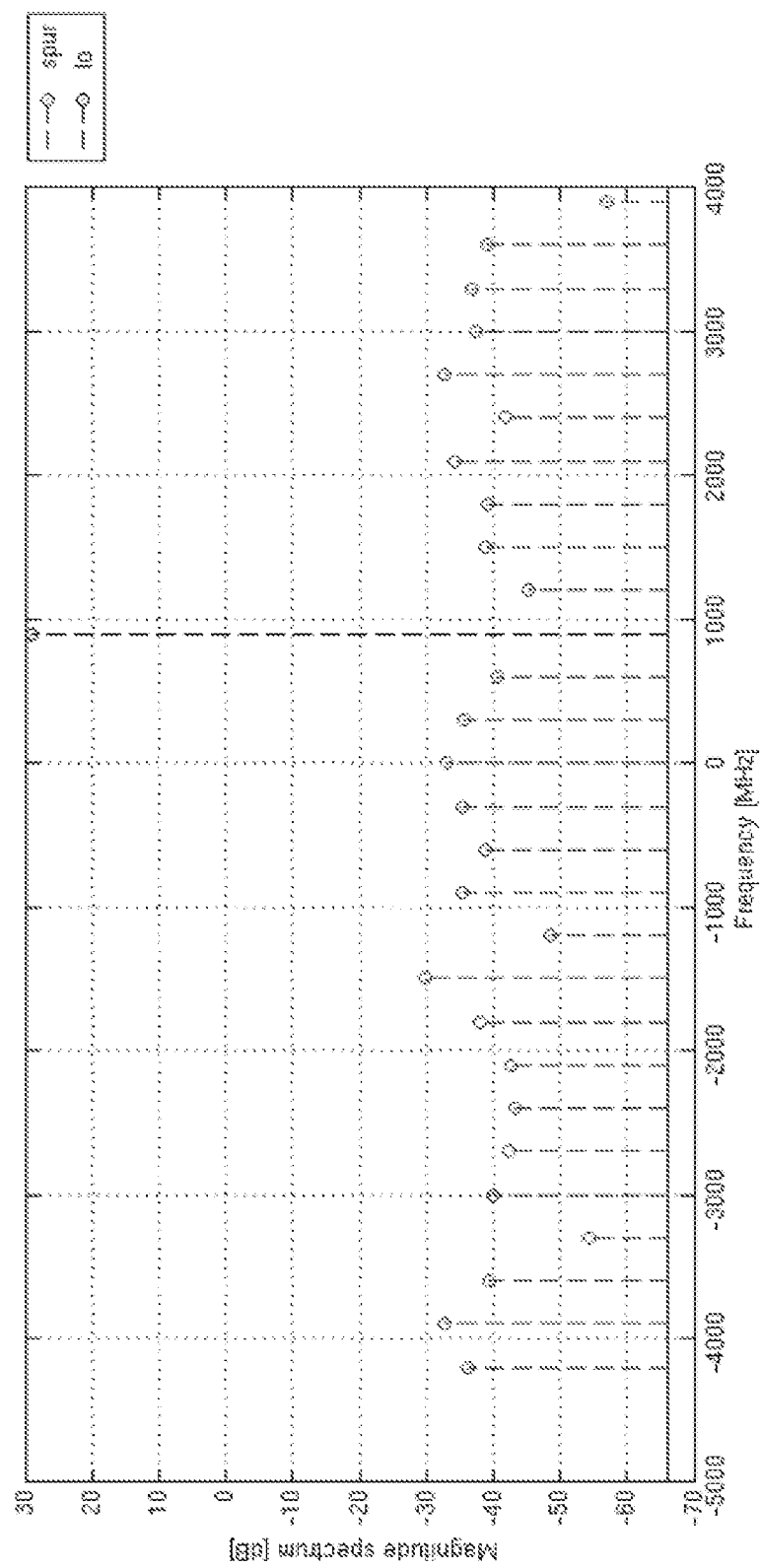
FIG. 23 shows an exemplary frequency spectrum of a local oscillator to illustrate a communication apparatus according to an embodiment.

If the mixer is a quadrature mixer whose mixing frequency is at $+f_{mix}$ (as opposed to $-f_{mix}$), the desired signal component at −950 MHz is mixed to −950 MHz+900 MHz=−50 MHz, which is the IF of the receiver. In this example the mixer, however, has quantization noise spurs with a spacing of 300 MHz spacing, as shown in FIG. 23. This means there is one spur at 1200 MHz. This spur mixes with the −1250-MHz blocker and also ends up at −50 MHz, where it distorts the signal.

Figure 24:
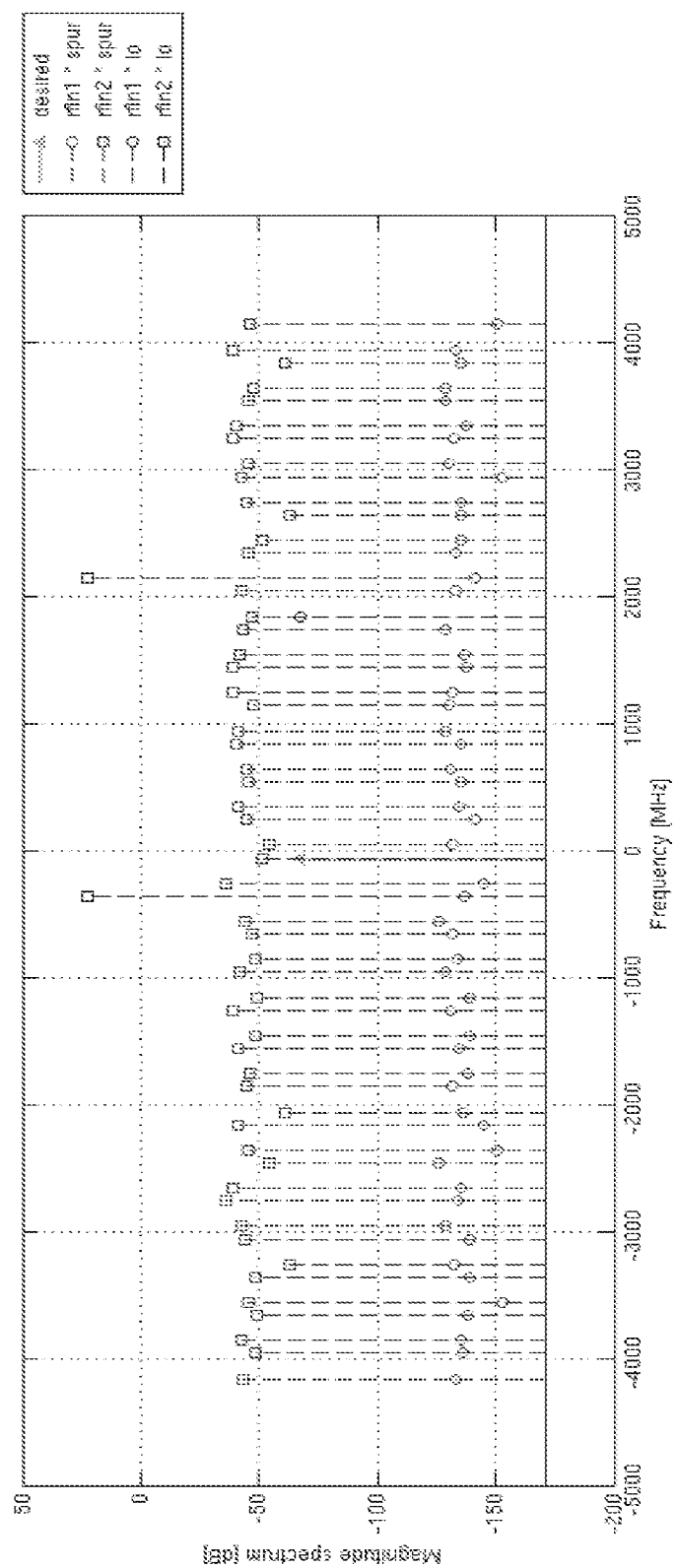
FIG. 24 shows an exemplary output frequency spectrum resulting from a convolution of the spectra shown in FIGS. 22 and 23.

In this example, the main local oscillator tone (i.e. mixing signal) is at 29 dB, while the spur at 1200 MHz has a magnitude of −45 dB. Thus, in the output spectrum, two signal components or tones appear at the IF of −50 MHz. Firstly, the desired signal, which has a magnitude of −96 dB+29 dB=−67 dB. Secondly, the product of the large input blocker with the 1200-MHz spur. This product has a magnitude of −6 dB−45 dB=−51 dB, which means it is 16 dB above the desired signal, making it impossible to demodulate the desired signal. This is illustrated in FIG. 24.

Figure 25:
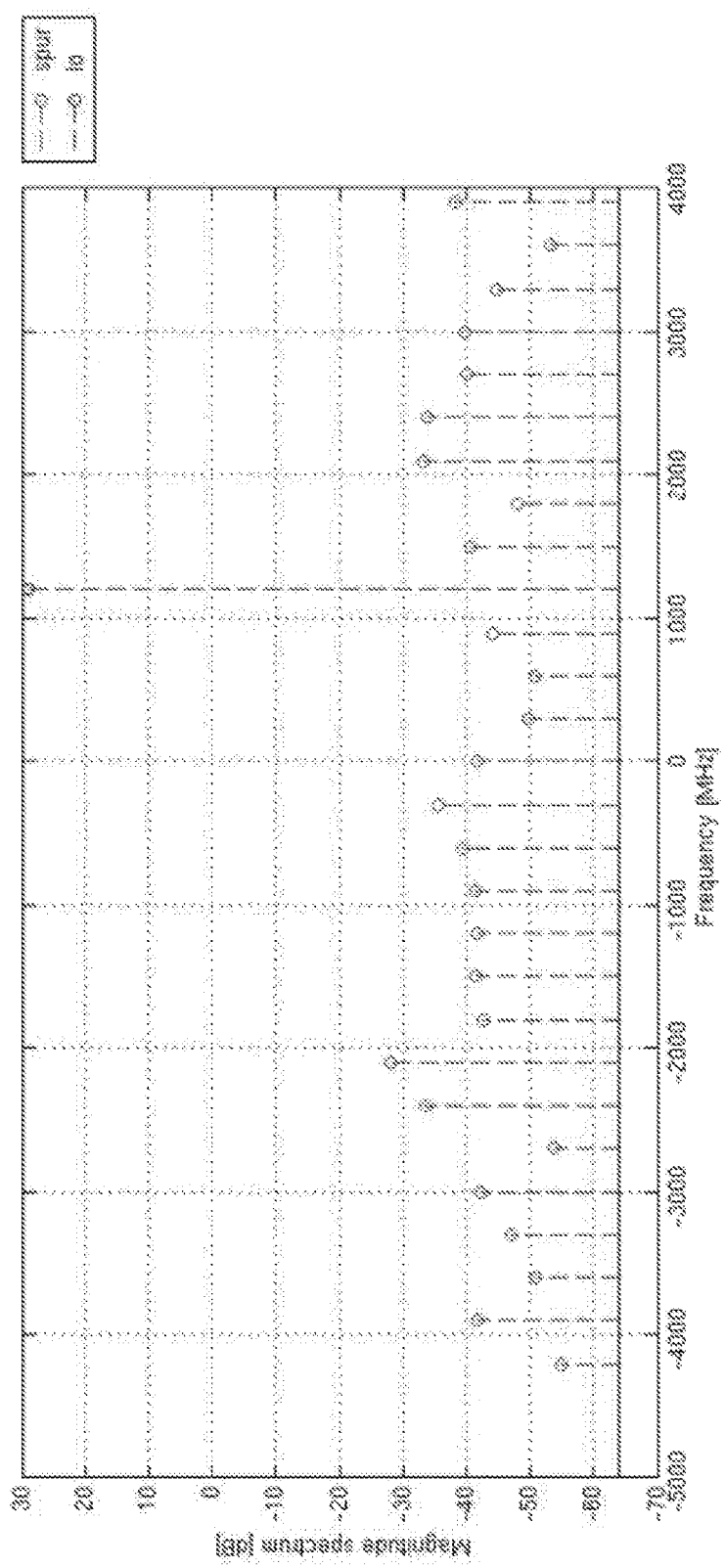
FIG. 25 shows an exemplary frequency spectrum of a local oscillator of an auxiliary mixer of a communication apparatus according to an embodiment.

In an embodiment, where the communication apparatus 100 comprises at least two mixers, such as the first mixer 101 and the second mixer 101' shown in FIG. 1, using the same sampling frequency $f_s$ but a separate lookup table (which allows using a different A/B ratio), one of these mixers, e.g. the second mixer 101' shown in FIG. 1, (called auxiliary mixer here) can be used to cancel the spur. To do this, the auxiliary mixer, e.g. the second mixer 101' shown in FIG. 1, is configured such that its $f_{mix}$ is at 1200 MHz, which is where the problematic spur of the other mixer, e.g. the first mixer 101, is located. This can be done by choosing:

$$\frac{A'}{B'} = \frac{f_{mix}}{f_s} = \frac{1}{7}$$

which leads to the mixing signal shown in FIG. 25.

Figure 26:
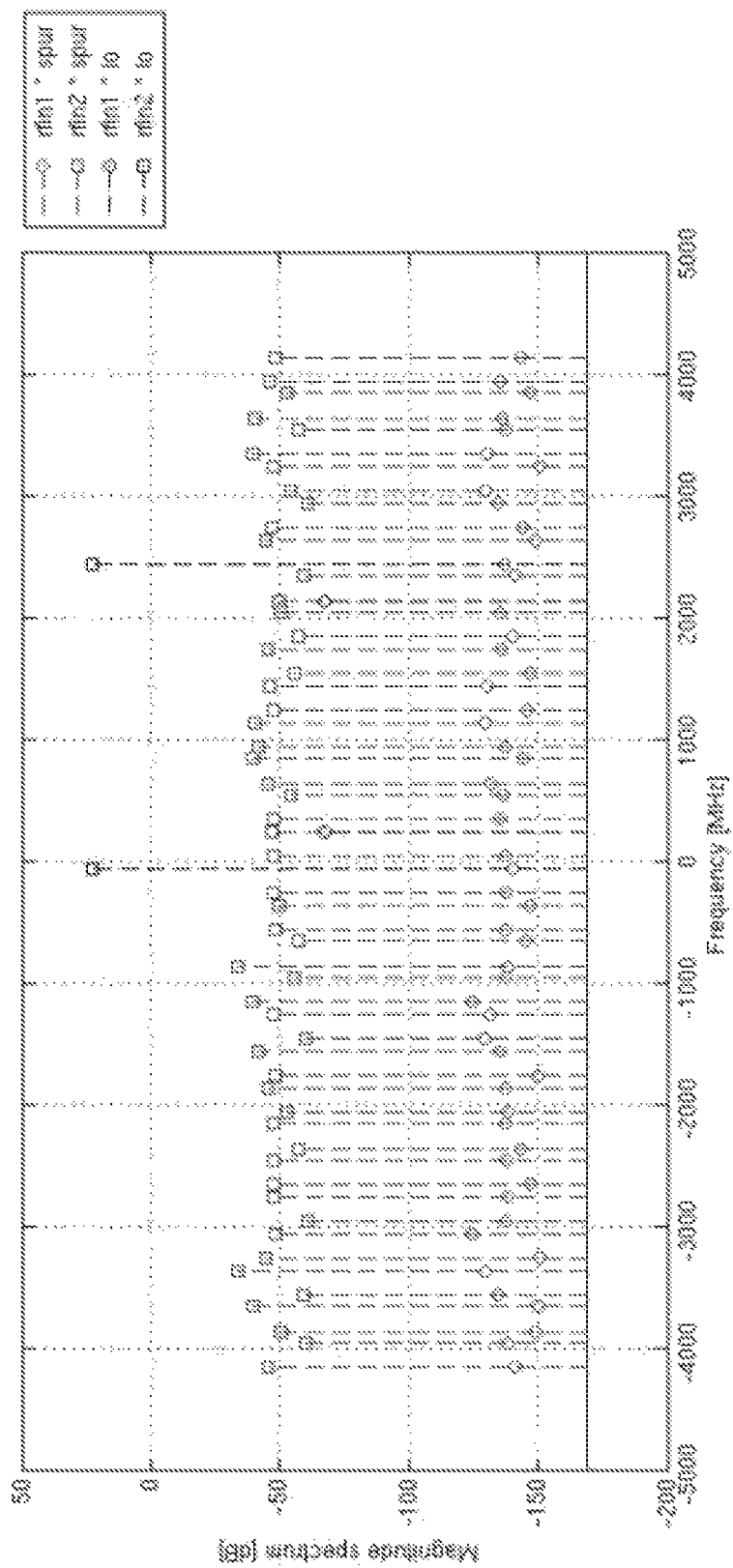
FIG. 26 shows an exemplary output frequency spectrum resulting from a convolution of the spectra shown in FIGS. 22 and 25.

The auxiliary mixer, e.g. the second mixer 101' shown in FIG. 1, also has its main local oscillator tone, i.e. its mixing frequency, at 29 dB, and has a spur at 900 MHz with a magnitude of −44 dB. The main local oscillator tone mixes with the input blocker and results in a signal component with a magnitude of −6 dB+29 dB=23 dB. The spur mixes with the desired input signal, resulting in a signal component with a magnitude of −96 dB−44 dB=−140 dB. Both signal components or tones are at −50 MHz as illustrated in FIG. 26.

If the output signal of the auxiliary mixer, e.g. the second mixer 101' shown in FIG. 1, is scaled down by 74 dB, the first tone or signal component will be at −51 dB while the second one will be at −214 dB. This means the first signal component or tone (namely the product of the input blocker with the main local oscillator tone) will have the same magnitude as the unwanted signal component or tone in the main mixer's output spectrum (which is also a mixing product of the input blocker). By subtracting the auxiliary mixer's output from the main mixer's output, both signal components or tones cancel out. The remaining signal components or tones are (a) the desired signal, which is at −67 dB, and (b) the $2^{nd}$ signal component or tone from the auxiliary mixer, which is at −214 dB, making it completely negligible compared to the desired signal. This allows the desired signal to be easily demodulated.

The scale factor that should be applied to make both output signals match (74 dB in the above example) depends on the A'/B' ratio as well as on the parasitic capacitances present in both mixers, e.g. the first mixer 101 and the second mixer 101' shown in FIG. 1, which are subject to intra-die variation. In an embodiment, the ratio can be determined using calibration.

In the example described above, both mixers, e.g. the first mixer 101 and the second mixer 101' shown in FIG. 1, had the same IF, which allows subtracting both outputs directly after the mixers, in the analog domain. In an embodiment, it is also possible to make both mixers have a different IF. In this embodiment, the output signal of the auxiliary mixer should be mixed to the correct frequency before it can be subtracted from the main mixer's output. This can be done using an additional mixer (which operates at a much lower frequency), but it can also be done in the digital domain, where the mixing operation is generally much less costly.

A known problem in any mixer is the mixing image. If a single-channel mixer is used, the mixing signal is real and has peaks at both $f_{mix}$ and $-f_{mix}$. If the desired signal is e.g. at some positive frequency $f_{rx}$ (and thus also at $-f_{rx}$), then it will be mixed to $f_{IF}=f_{rx}-f_{mix}$. However, there is also a frequency $f_{img}$ for which $f_{IF}=-f_{img}+f_{mix}$. Thus, any signal present at $f_{img}$ will also be mixed to $f_{IF}$ and corrupt the desired signal. In general, two solutions exist for this problem.

According to a first solution, the signal at $f_{img}$ can be filtered away before mixing. However, the distance between $|f_{rx}|$ and $|f_{img}|$ is only $2f_{IF}$, which is usually quite low compared to the RF frequency. This makes the filtering hard to realize.

According to a second solution, a quadrature mixer can be used, which has a complex mixing signal. This allows making sure that there is a peak at $-f_{mix}$ but not at $f_{mix}$ such that the desired signal is received at $f_{IF}$ while the image is only received at $-f_{IF}$. However, in practice there is usually some gain and/or phase mismatch between both mixers, such that a small but nonzero peak is still present at $f_{mix}$ and there is still some image at $f_{IF}$. The ratio between the peaks at $-f_{mix}$ and $f_{mix}$ is called the image rejection ratio.

In an embodiment, where an auxiliary mixer is available, such as the second mixer 101' shown in FIG. 1, it can be used to improve the image rejection in a way similar to the spur cancellation described above.

In an embodiment, the auxiliary mixer, e.g. the second mixer 101' shown in FIG. 1, is configured explicitly to receive the signal at $f_{img}$ so that it can be subtracted from the output of the main mixer, e.g. the first mixer 101 shown in FIG. 1.

In an embodiment, where the main mixer, e.g. the first mixer 101 shown in FIG. 1, is a quadrature mixer, it already has some image rejection, but by subtracting the image received by the auxiliary mixer, scaled by the image rejection of the first mixer, the remaining image is further attenuated (ideally cancelled completely) so that the image rejection is improved.

In an embodiment, where the main mixer, e.g. the first mixer 101 shown in FIG. 1, is a single-channel mixer, it has no image rejection, but the image can be cancelled by receiving it with the auxiliary mixer, e.g. the second mixer 101' shown in FIG. 1. In this embodiment, no scaling is required. However, if both mixers are mixing to the same IF, it should be noted that the image frequency of the auxiliary mixer will be equal to the $f_{mix}$ of the main mixer. Therefore, if the auxiliary mixer is also a single-channel mixer, it will not only cancel the image but also the signal. This can be addressed by two different embodiments. In a first embodiment, the auxiliary mixer, e.g. the second mixer 101' shown in FIG. 1, is a quadrature mixer. In a second embodiment, the auxiliary mixer, e.g. the second mixer 101' shown in FIG. 1, uses a different IF. Then the received image needs to be further mixed to the IF of the main mixer before subtracting it. This is usually best done in the digital domain. This solution works best if there is no significant signal at the image frequency of the auxiliary mixer (which is now a third frequency, unrelated to $f_{mix}$ and $f_{img}$). Otherwise the auxiliary mixer will just replace the image from the main mixer by its own image.

As already described above, in an embodiment the first mixing signal represented by the scaling coefficients A[k], which can be stored in an LUT of the first mixer 101', and/or the second mixing signal represented by the scaling coefficients B[k], which can be stored in an LUT of the second mixer 101', can be a sinusoidal function, a sum of multiple sinusoidal functions, a clipped sinusoidal function, a square wave function or another periodic waveform.

In an embodiment, the first mixing signal and/or the second mixing signal can be a sum of two or more sinusoids stored in the LUT. An LUT with multiple sinusoids can be used to receive multiple CA bands with one single mixer, saving area and power by not only eliminating one or more PLLs, but also the corresponding mixers. The price for this is a reduced amplitude for both sinusoids. Since the instantaneous mixer gain defined by the scaling coefficients A[k] is limited to the range [−1, 1], the sum of the amplitudes of all sinusoids stored in the LUT must be less than or equal to 1. Thus, all output signals will be smaller than when received with separate mixers.

The sinusoids should be chosen such that both CA bands are received at different IF frequencies, such that the received signals do not overlap. Furthermore, the bandwidth of the IF circuitry must be wide enough to handle all received signals simultaneously. Further downmixing and demodulation of all signals can then be done in the digital domain.

Also, it should be noted that LUT period and spur spacing are now determined by the least common multiple (1 cm) of the LUT lengths that would be required for each of the sinusoids separately. To keep the spur spacing high, it is best to use fractions with the same denominator, or whose denominators share many prime factors.

For example, if the LUT contains two sinusoids located at $2/7 \cdot f_s$ and $3/7 \cdot f_s$, the LUT length is 7 and the spur spacing will be $f_s/28$, as has been described above. However, if they are located at $2/7 \cdot f_s$ and $4/9 \cdot f_s$, the LUT length will be 1 cm (7, 9)=63, and the spur spacing will be $f_s/252$, which is 9 times lower, while the $2^{nd}$ sinusoid's frequency is only about 3% higher than it was in the first case. This illustrates that the frequencies should be selected with care.

In an embodiment, in line with the above situation the spur cancelling scheme described above in the context of an embodiment comprising a main mixer and an auxiliary mixer can also be implemented with a single mixer. In this case, the desired signal is received at a given IF frequency, and the blocker that mixes with one of the quantization noise spurs ends up at the same IF. The $2^{nd}$ mixer is removed, but instead a $2^{nd}$ sinusoidal mixing signal is added to the LUT, which receives the same blocker at a different IF frequency.

Both IF signals are then converted to digital (using one ADC which processes both signals as a single time-domain signal). In the digital domain, both signals can be separated using sharp filters, after which they can be mixed to the same frequency (usually DC) and subtracted from each other to make the unwanted mixing product cancel. Doing so saves a mixer, but in this specific case there is not such a high price to pay in terms of gain loss as in the previous example, where the received blocker had to be reduced by 74 dB to match the unwanted blocker corrupting the desired signal. When implementing the cancellation scheme with one mixer, it seems logical to scale the $2^{nd}$ local oscillator tone (the one that is added only to receive the blocker) by 74 dB compared to the first one (which receives the signal). This means the amplitude of the first local oscillator tone would only have to be reduced from 1 to $1-10^{-74/20}=0.9998$ to guarantee that the sum of the amplitudes remains below 1. This means that the gain loss on the desired signal would be negligible.

However, such drastic scaling might not be feasible in practice. By definition, it would make the $2^{nd}$ local oscillator tone the same order of magnitude as the quantization noise spurs. This means its amplitude is less than one quantization step, such that it cannot be accurately represented with the given quantization noise. An equivalent way of looking at it is the following. After creating the 2 desired tones (one at 0 dB and one at −74 dB), the signal is quantized, which adds random quantization noise spurs which are also around −74 dB in magnitude. One of these spurs will coincide with the $2^{nd}$ local oscillator tone, which will completely change the amplitude and phase since the desired tone and the quantization noise spur are comparable in magnitude.

In order to have some control over the phase and amplitude of the $2^{nd}$ local oscillator tone, it should be significantly larger than the quantization noise spurs, e.g. 20 to 40 dB larger. If it is 40 dB larger, it is still 34 dB lower than the $1^{st}$ local oscillator tone, which would mean that the amplitude of the $1^{st}$ tone needs to be reduced to 0.98, which is 0.18 dB lower than the maximal amplitude of 1. Even in this case, the gain loss is very limited. The remaining 40-dB reduction would then be done in the digital domain without loss of precision.

The $2^{nd}$ local oscillator tone can be made even larger, which will make the relative impact of the quantization error smaller. Thus, the larger the $2^{nd}$ local oscillator tone, the better the cancellation of the unwanted mixing product will be, but the smaller the $1^{st}$ local oscillator tone has to be. This means there is a trade-off between noise and in-band distortion. The optimum point in this tradeoff depends on the magnitude of the blocker and the spur that mixes it to IF.

An embodiment with an LUT with multiple sinusoids can also be used to mix one single RF band to multiple IF bands, each with reduced gain compared to the single-sinusoid case.

The requirement that the amplitude of the mixing signal (or the sum of the amplitudes of all local oscillator signals stored in one LUT) be less than or equal to 1 is not an absolute requirement in that actually the requirement is that all samples of this signal are less than 1. The following figures illustrate that this is not the same.

Figure 27:
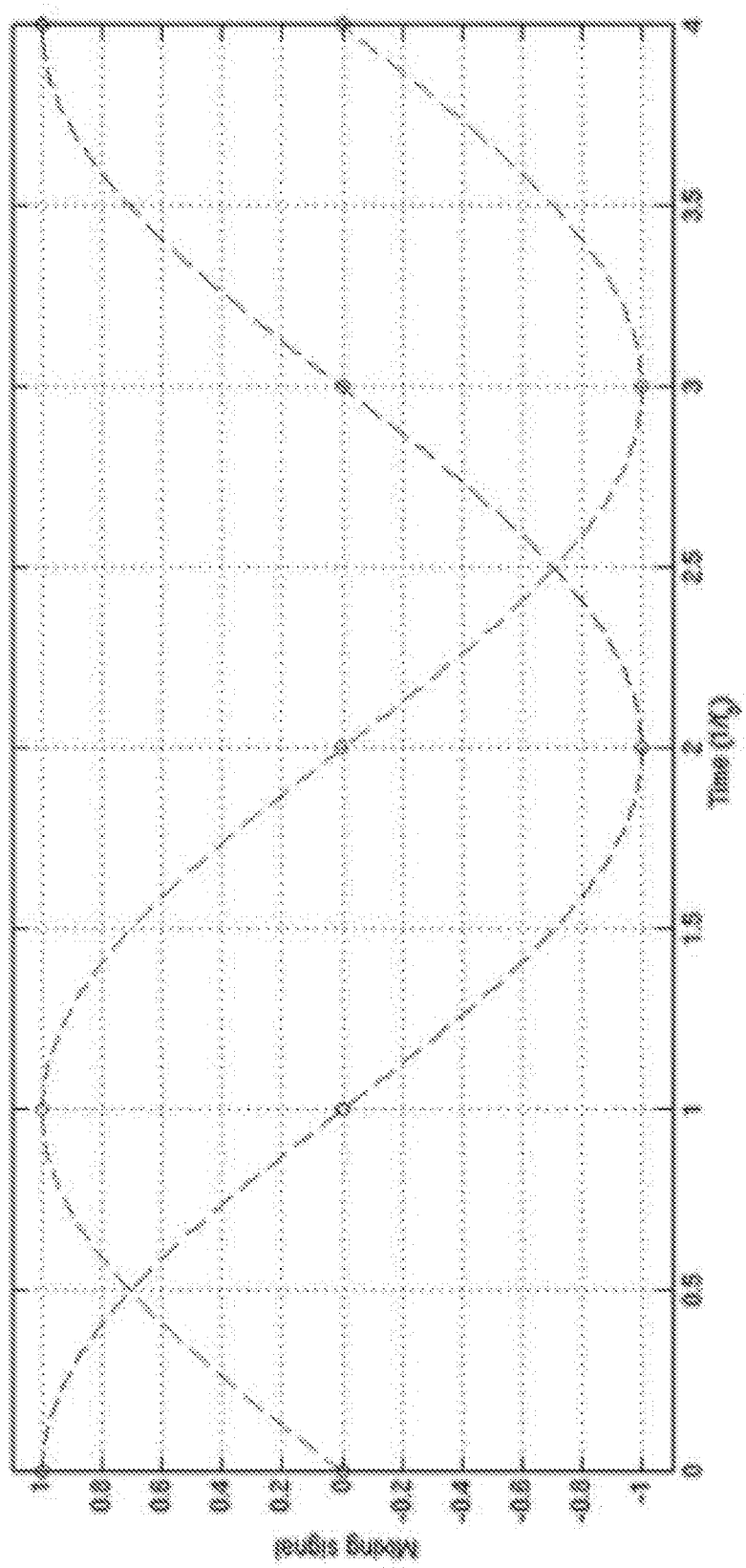
FIG. 27 shows "in phase" (I) and "in quadrature" (Q) local oscillator signals used in a communication apparatus according to an embodiment.

FIG. 27 shows I and Q mixing or local oscillator signals with amplitude 1, sampled at $4f_{mix}$, with zero phase offset. i.e. sampled at their peaks and zeros. The maximum absolute value of any of the samples is 1, which means the amplitude of the signals cannot be increased.

Figure 28:
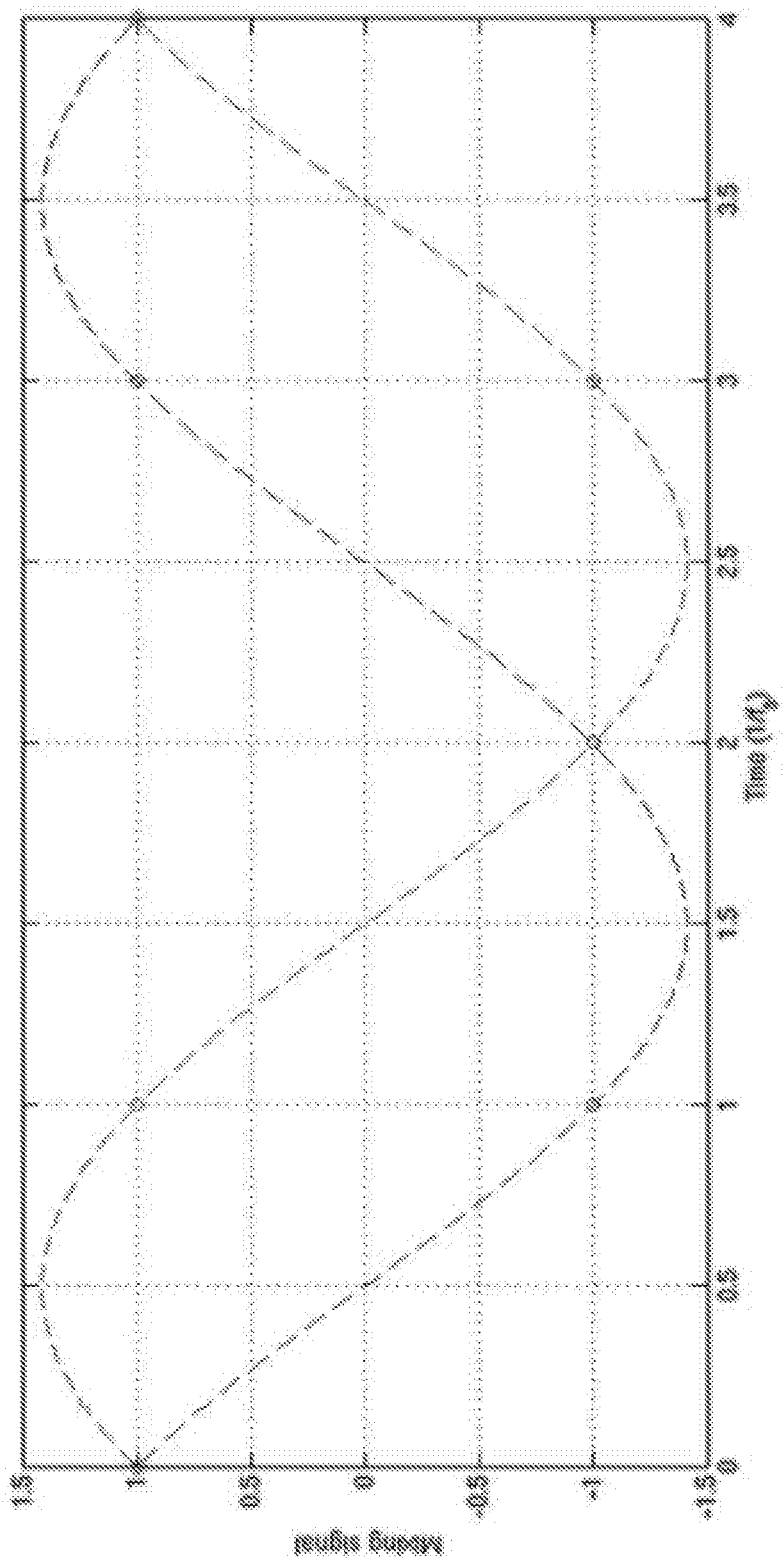
FIG. 28 shows differently sampled I and Q local oscillator signals used in a communication apparatus according to an embodiment.

FIG. 28 shows I and Q mixing signals that are sampled with 45 degrees phase offset, still at $4f_{mix}$. Since the sinusoids are no longer sampled at their peaks, their amplitudes can be increased until the maximal absolute value of any sample is 1, which is when the amplitude is equal to $\sqrt{2}$. Thus, in an embodiment a 3 dB extra gain is realized with the same hardware.

This extreme case occurs when the sampling rate is $4f_{mix}$. In the general case, several periods of the local oscillator signals can be stored in the LUT, and each period will be sampled at different points, leaving somewhat less freedom to move the sampling points. Therefore, in most cases the gain improvement is below 1 dB and often almost negligible. Nevertheless, in some specific cases some improvement can be achieved.

It should be noted that the sampling phase should be the same for the I and Q local oscillator signals, and they should also both have the same amplitude. An embodiment with a single-channel mixer has somewhat more flexibility since the peaks of only one sinusoid need to be avoided.

As already described above, the signals in the LUT are not limited to sinusoids only. Any signal can be stored in the LUT as long as it is periodical with a sufficiently short period and it can be reasonably well represented with the available quantization levels.

In an embodiment, a sinusoid with amplitude above 1 can be used as a mixing signal if it is clipped at ±1, i.e. if all samples that are above 1 are replaced by 1, and all samples below −1 are replaced by −1. This embodiment increases the amplitude of the fundamental component in the mixing signal but adds harmonic distortion at odd multiples of the mixing frequency $f_{mix}$.

Figure 29:
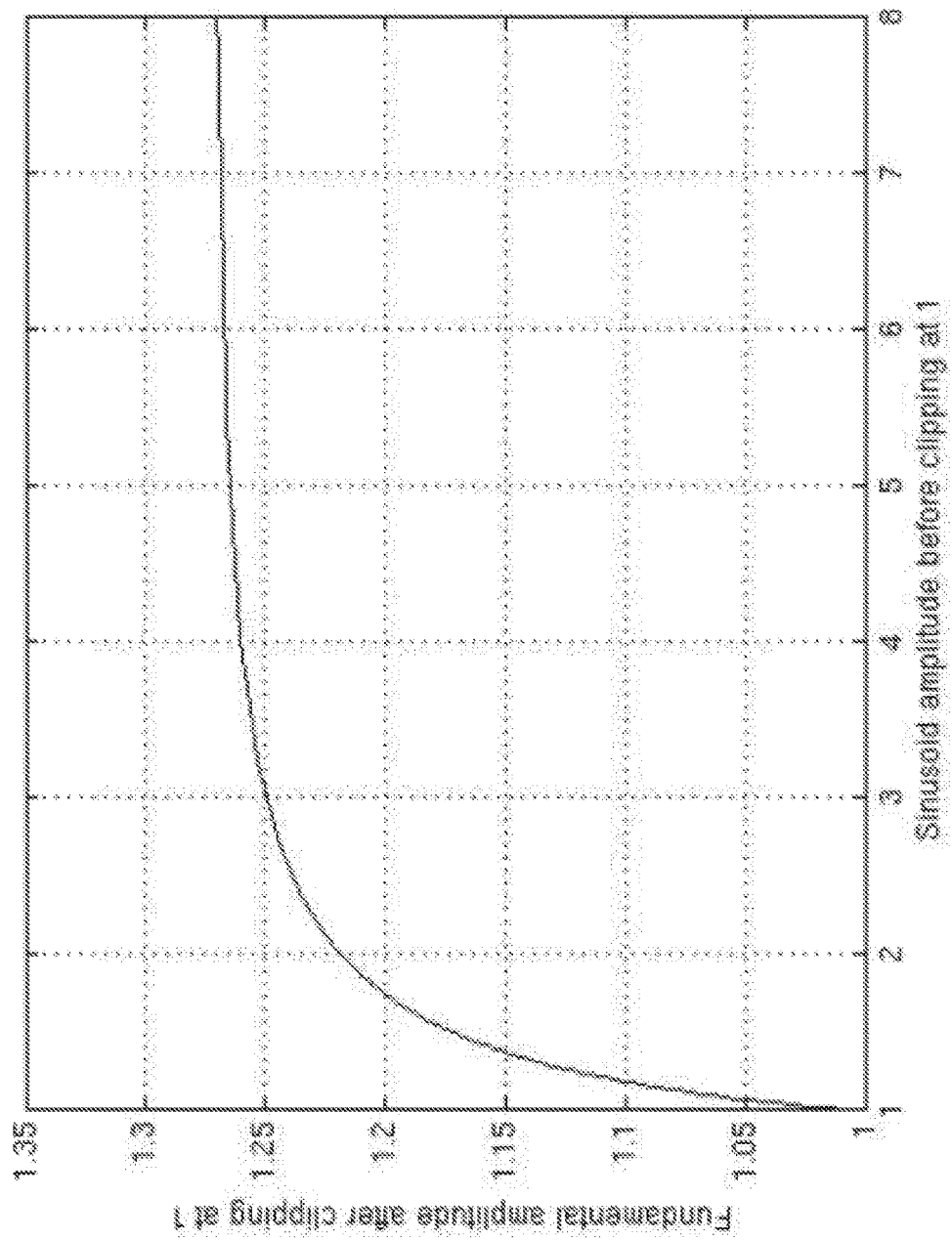
FIG. 29 shows a diagram illustrating the gain improvement using a clipped sinusoid as a mixing signal in a communication apparatus according to an embodiment.

FIG. 29 shows the amplitude of the fundamental component of a sinusoid clipped at ±1 as a function of the amplitude $a_0$ of the sinusoid before clipping. As $a_0$ increases, the clipped sinusoid converges to a square wave and the amplitude of its fundamental component converges to $4/\pi$, which is about 2 dB higher than the maximal amplitude that can be realized with a sinusoid.

Figure 30:
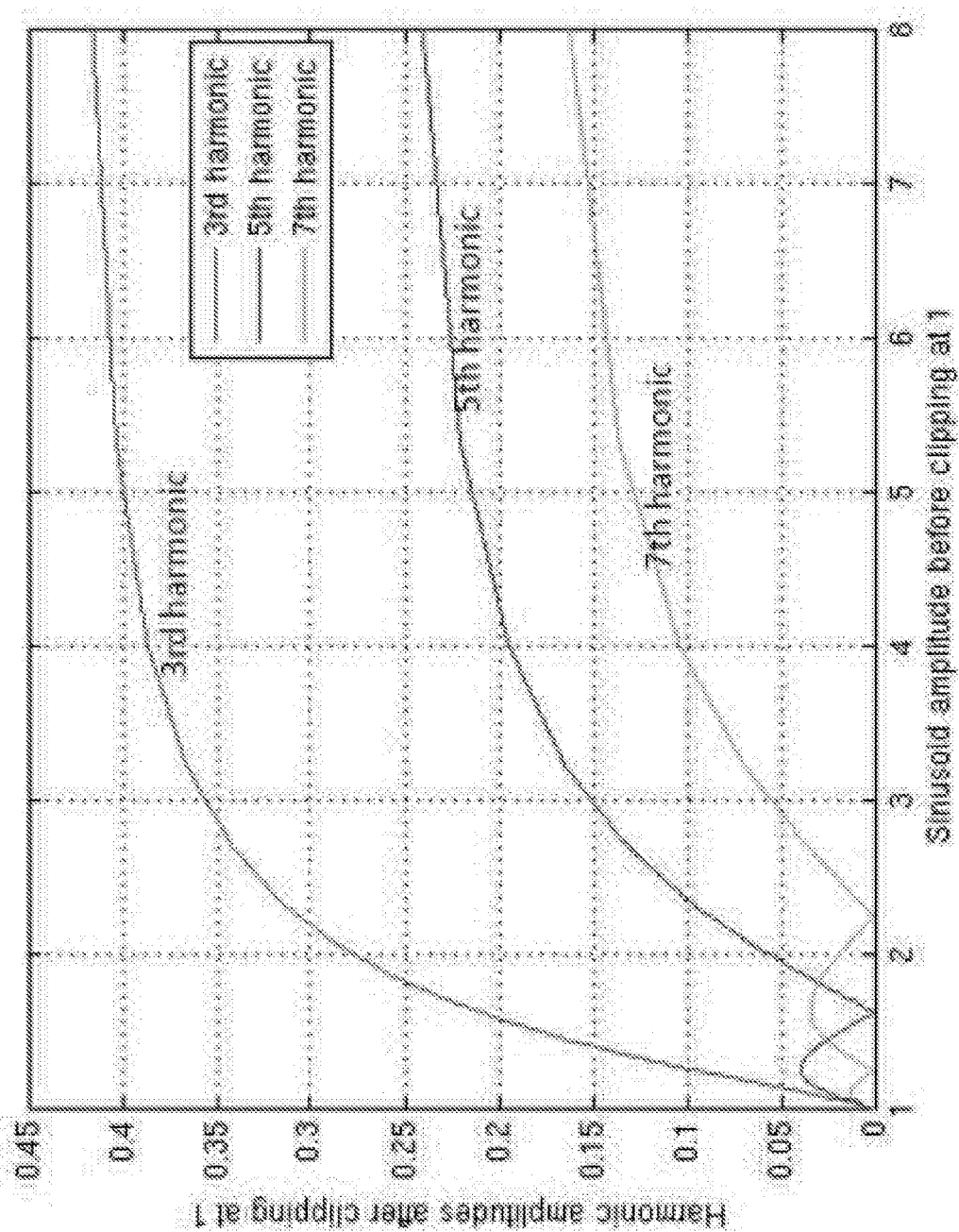
FIG. 30 shows a diagram illustrating the harmonics caused using a clipped sinusoid as a mixing signal in a communication apparatus according to an embodiment.

Apart from the increased gain, the following effects occur when increasing $a_0$. Firstly, harmonics occur at odd multiples of $f_{mix}$. Their amplitudes increases with $a_0$ as shown in FIG. 30. As the signal converges to a square wave, the amplitude of the $i^{th}$ harmonic (at $if_{mix}$) converges to $4/i\pi$. The main reason the harmonics can be a problem is because the sampling rate is usually not higher than 2 to 4 times $f_{mix}$, which means all the odd harmonics will alias back to lower frequencies, where they can cause linearity problems.

Secondly, the quantization noise spurs will go down since the clipped points coincide exactly with the highest quantization level (at least if there is no mismatch) so that on these points no quantization error is made. As the signal converges to a square wave (i.e. $a_0$ goes to infinity), the quantization noise spurs disappear entirely and only the aliased harmonics remain. However, because of aliasing, the harmonics may cause as many spurs as the quantization noise, and furthermore the harmonics are much higher than the quantization noise spurs. For a square wave, the i-th harmonic is only i times lower than the fundamental. This means that the $3^{rd}$, $5^{th}$ and $7^{th}$ harmonics are only 9.5, 14.0 and 16.9 dB below the fundamental, compared to at least 60-70 dB for the quantization noise spurs caused by a mixer with 8 bits plus a sign bit. It should be noted that the signal is still periodical so that any spurs (including aliased harmonics) can still only appear at multiples of $\Delta f_{spur}$.

In the time domain, the large error made using a square wave can be seen as follows. While only levels 1 and −1 are used so that no quantization noise will appear, the edges of the square wave will be at the wrong points in time due to sampling at a frequency $f_s$ which is not a multiple of the square wave mixing frequency $f_{mix}$. This causes the aliased harmonics which may be close to the signal. Thus, the price to pay for the 2 dB extra gain is quite high. Whether or not it is worth paying depends on the ratio $f_{mix}/f_s$ as well as on the blocker signals present at the RF input, and the noise and linearity specs for the receiver.

In embodiments, where $f_s$ is a multiple of $f_{mix}$, say $f_s=Bf_{mix}$, all aliased harmonics will coincide at frequencies $kf_{mix}$ where k=0, 1, 2, . . . , B if B is odd, or at k=1, 3, 5, . . . , B−1 if B is even. In this case, mixing with a square wave is quite advantageous since it provides a gain improvement of 2 dB and removes most of the spurs, leaving only those at multiples of $f_{mix}$, which are quite far away from the desired signal, such that blockers that might occur at those frequencies can be strongly attenuated by band-pass filtering before the mixer. In the time domain, the edges of the square wave will now be at the correct points in time. If a dedicated receiving PLL is available in a CA receiver, this special case can always be arranged for one of the bands that should be received.

In an embodiment, by increasing or decreasing the amplitude of the sinusoid before clipping, a trade-off can be made between noise and linearity. In an embodiment, this can be done using the following algorithm. Start from a square wave (i.e. $a_0=\infty$) and see if the linearity specs can be met. If so, the maximal gain and therefore the best possible noise performance is realized. If the linearity specs cannot be met, decrease $a_0$ until they are met. The noise performance will degrade as the mixer gain decreases.

Note that reducing $a_0$ below 1 is generally not useful. This will decrease the mixer gain (for $0 \le a_0 \le 1$ the mixer gain is linear with $a_0$) and increase quantization noise (since the highest quantization levels will no longer be used), without further improving linearity. This is because when $a_0 \le 1$, there is no clipping, and no harmonics occur.

As already described above, in an embodiment the scaling coefficients A[k] of the first mixer 101 are represented by a different number of bits in the LUT of the first mixer 101 than the scaling coefficients B[k] of the second mixer 101'.

When a square wave is stored in the LUT rather than a (clipped) sinusoid, the only quantization levels that are ever used are −1 and 1. This means that a 1-bit mixer (this bit is then equal to the sign bit) is sufficient to represent this square wave with the maximal possible accuracy (the accuracy is limited by the sampling rate, not by the number of bits). Thus, one or more mixers with only 1 bit may be included in a CA mixer. These will consume less power because they will be smaller in area, such that routing parasitics will be smaller. There are one or two reasons why the area will be smaller. Firstly, the switches and capacitors will not be segmented, which causes less area overhead due to routing and spacing between components. Secondly, if the total capacitance Cs is determined by matching (e.g. if 8 bits are required and the smallest possible capacitor that can be realized with reasonable matching is Cu, then Cs will be 255*Cu) then removing one bit will halve Cs. This is not the case if Cs is determined by noise requirements. Moreover, the switches and capacitors will not be segmented. This reduces their parasitic capacitances, since the relative parasitics are larger in small components than in larger ones. Finally, the LUT will need to store only 1-bit samples, compared to 9-bit samples for an (8+1)-bit mixer. Thus, the LUT itself will consume about 9× less power.

Since power is often dominated by muting parasitics and LUT clock power, these are important points.

Depending on the sampling rate, the bands to receive and the input blockers that are present at a given moment, it may not always be possible to use the 1-bit mixer(s). Therefore, they can probably not replace multi-bit mixers but can be implemented in addition to the multi-bit mixers according to embodiments of the disclosure. This means an area increase, but this price is usually worth paying to have a power improvement in some cases.

This concept can be generalized to multiple mixers with different numbers of bits. When realizing the same $f_{mix}/f_s$ ratio with fewer bits, the quantization noise spurs will be higher. This way, linearity can be traded off versus power consumption, which is an interesting feature.

Thus, in case of a communication apparatus 100 implemented in form of a CA receiver that has to receive up to 5 bands with one dedicated receiving PLL, one could choose not to just implement five (8+1)-bit mixers, but a more extended and diverse set of mixers, for example, one passive mixer (since one can choose the PLL frequency to coincide with the mixing frequency for one of the bands), three or four (8+1)-bit mixers, two (6+1)-bit mixers, two (3+1)-bit mixers and one 1-bit mixer.

Such an embodiment of the communication apparatus 100 comprises 9 or 10 mixers, but if Cs is limited by matching, the mixers with fewer bits will be much smaller than the (8+1)-bit mixers such that the total area may even be smaller than with five (8+1) mixers. Even if Cs was noise-limited, some of the mixers may still be made smaller.

Now in a scenario where N bands have to be received (with $1 \le N \le 5$), in an embodiment one can select N mixers that are as small as possible while still meeting noise and linearity specifications. Then the remaining mixers are either turned off, or they can be used to improve the performance of the other mixers, e.g. using the spur cancellation described above. If this spur cancellation scheme is implemented with only few bits for the auxiliary mixer, cancellation will be less good but there will still be some improvement, while the impact on power consumption is much lower.

It is also possible to extend this differentiation concept in the other direction, i.e. to more bits. For example, in an embodiment one could include one mixer with 10+1 bits which is usually turned off and is only turned on in case some very large blocker is present which happens to coincide with one of the quantization noise spurs. Then the spur can be decreased using a more accurate mixer. While the area penalty for this is quite large, the power penalty is only paid when the mixer is used.

As already described above, in an embodiment the communication apparatus 100 further comprises a frequency divider being configured to reduce the reference frequency $f_{REF}$ provided by the local oscillator 150 to obtain a reduced reference frequency, wherein the first mixer 101 is configured to derive the first sampling frequency $f_{S,1}$ from the reduced reference frequency and/or wherein the second mixer 101' is configured to derive the second sampling frequency $f_{S,2}$ from the reduced reference frequency.

Thus, for instance, in embodiment, where the communication apparatus 100 is implemented in form of a CA receiver, where one or more reference frequencies $f_{ref,k}$ are present, one is not limited to using one of these frequencies for each of the mixers of the CA receiver. Since frequency dividers (esp. with a factor that is a power of 2) are relatively cheap to implement, one can also use $f_{ref,k}/2$, $f_{ref,k}/4$, etc. This way, when one of the mixing frequencies $f_{mix,i}$ is low enough, a lower reference frequency can be used. This reduces the power consumption by the same factor as the reference frequency at the expense of increased aliasing of e.g. blockers, and increased quantization noise spurs (they become larger because several spurs coincide due to aliasing).

There is no absolute requirement for $f_s$ to be larger than $2f_{mix}$ as one might expect from the Nyquist sampling criterion. This criterion only requires that $f_s$ be larger than the signal bandwidth at RF. If $f_s < 2f_{mix}$, the RF signal will be down-converted using a combination of mixing and aliasing.

Subsampling reduces the power consumption at the expense of increased aliasing and higher quantization noise spurs.

Subsampling is especially interesting for high-frequent communication band such as the 5G bands in the 6-GHz range. Here, sampling above twice the mixing frequency (i.e. around 12 GHz) is quite expensive in terms of power consumption.

Furthermore, the above described charge sharing implementation of a mixer works particularly well if the resistance of the switches in combination with the capacitors has a resistance-capacitance (RC) constant that is low enough to allow the voltages on both sides of each switch to settle and become equal during one clock cycle. This means that the required width for the switches is proportional to the highest sampling rate that needs to be achieved. If one accepts subsampling for the highest frequency, this highest sampling rate can be reduced which offers a quadratic improvement in power consumption for the following reasons. The power consumption is directly proportional to the clock frequency. The power consumption is also proportional to the capacitive load on the clock inputs. This load increases linearly with the size of the switches (even though it also includes other terms such as routing parasitics and the load presented by the LUTs).

The devices described herein may be implemented as optical circuit within a chip or an integrated circuit or an application specific integrated circuit (ASIC). The disclosure can be implemented in digital and/or analogue electronic and optical circuitry.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include." "have," "with," or other variants thereof are used in either the detailed description or the claims, such terms are intended to be inclusive in a manner similar to the term "comprise." Also, the terms "exemplary." "for example" and "e.g." are merely meant as an example, rather than the best or optimal. The terms "coupled" and "connected." along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the present disclosure has been described with reference to one or more particular embodiments, those skilled in the art recognize that many changes may be made thereto without departing from the scope of the present disclosure. It is therefore to be understood that within the scope of the appended claims and their equivalents, the disclosure may be practiced otherwise than as described herein.

What is claimed is:

1. A communication apparatus, comprising:
    a first mixer configured to generate an analog output signal ($X_{OUT}$) from an analog input signal ($X_{IN}$) in a first band using a first mixing signal, the first mixer comprising a first scaler configured to:
        sample the $X_{IN}$ at a plurality of discrete points in time (k) with a first sampling frequency ($f_{S,1}$) to obtain a sampled analog input signal ($X_{IN}[k]$) having a continuous signal value; and
        generate the $X_{OUT}$ having a continuous signal value by scaling the $X_{IN}[k]$ on a basis of a plurality of scaling coefficients (A[k]), the A[k] being a time-discrete representation of the first mixing signal;
    a second mixer configured to generate another analog output signal ($Y_{OUT}$) from another analog input signal ($Y_{IN}$) in a second band using a second mixing signal, the second mixer comprising a second scaler configured to:
        sample the $Y_{IN}$ at the k with a second sampling frequency ($f_{S,2}$) to obtain another sampled analog input signal ($Y_{IN}[k]$) having a continuous signal value; and
        generate the $Y_{OUT}$ having a continuous signal value by scaling the $Y_{IN}[k]$ on a basis of a plurality of scaling coefficients (B[k]), the B[k] being a time-discrete representation of the second mixing signal, the $X_{IN}$ and the $Y_{IN}$ being carrier aggregated, and intermediate frequencies (IFs) of the first mixing signal and the second mixing signal being different; and
    a local oscillator coupled to the first mixer and the second mixer and configured to provide a reference frequency ($f_{REF}$),
    the first mixer being further configured to derive the $f_{S,1}$ from the $f_{REF}$, and
    the second mixer being further configured to derive the $f_{S,2}$ from the $f_{REF}$.

2. The communication apparatus of claim 1, wherein the $f_{S,1}$ and the $f_{S,2}$ are an integer multiple of the $f_{REF}$, and each of the $f_{S,1}$ and the $f_{S,2}$ being equal to four times the $f_{REF}$.

3. The communication apparatus of claim 1, wherein the $f_{S,1}$ is an integer multiple of the $f_{REF}$, and the $f_{S,1}$ being equal to four times the $f_{REF}$.

4. The communication apparatus of claim 1, wherein the $f_{S,2}$ is an integer multiple of the $f_{REF}$, and the $f_{S,2}$ being equal to four times the $f_{REF}$.

5. The communication apparatus of claim 1, further comprising a receiver coupled to the first mixer and the second mixer, the local oscillator being a dedicated local oscillator of the receiver, and the local oscillator being an oscillator of a phase-locked loop of the receiver.

6. The communication apparatus of claim 1, further comprising a transmitter coupled to the first mixer and the second mixer, the local oscillator being a dedicated local oscillator of the transmitter, and the local oscillator being an oscillator of a phase-locked loop of the transmitter.

7. The communication apparatus of claim 1, wherein the A[k] and the B[k] are a time-discrete representation of a sinusoidal function, a sum of a plurality of sinusoidal functions, a clipped sinusoidal function, a square wave function, or another periodic waveform.

8. The communication apparatus of claim 1, wherein the A[k] is a time-discrete representation of a sinusoidal function, a sum of a plurality of sinusoidal functions, a clipped sinusoidal function, a square wave function, or another periodic waveform.

9. The communication apparatus of claim 1, wherein the B[k] is a time-discrete representation of a sinusoidal function, a sum of a plurality of sinusoidal functions, a clipped sinusoidal function, a square wave function, or another periodic waveform.

10. The communication apparatus of claim 1, wherein the A[k] is associated with data stored in a memory of the first mixer, and the B[k] is associated with data stored in a memory of the second mixer.

11. The communication apparatus of claim 1, wherein the $X_{IN}$ is equal to the $Y_{IN}$, and the communication apparatus is further configured to combine the $Y_{OUT}$ of the second mixer with the $X_{OUT}$ of the first mixer by subtracting the $Y_{OUT}$ of the second mixer from the $X_{OUT}$ of the first mixer.

12. The communication apparatus of claim 1, wherein the first mixing signal is associated with a first mixing frequency ($f_{MIX,1}$), the second mixing signal being associated with a second mixing frequency ($f_{MIX,2}$), a ratio of the $f_{MIX,1}$ and the $f_{S,1}$ is given by $f_{MIX,1}/f_{S,1}=A/B$, a ratio of $f_{MIX,2}$ and the $f_{S,2}$ is given by $f_{MIX,2}/f_{S,2}=A'/B'$, and the A, the B, the A', and the B' being integers.

13. The communication apparatus of claim 12, wherein the $f_{S,1}$ is equal to the $f_{S,2}$.

14. The communication apparatus of claim 12, wherein the $f_{MIX,1}$ differs from the $f_{MIX,2}$.

15. The communication apparatus of claim 1, wherein the A[k] of the first mixer is represented by a different number of bits than the B[k] of the second mixer.

16. The communication apparatus of claim 1, further comprising a frequency divider coupled to the first mixer and the second mixer and configured to reduce the $f_{REF}$ of the local oscillator, the first mixer being further configured to derive the $f_{S,1}$ from the reduced $f_{REF}$, and the second mixer being further configured to derive the $f_{S,2}$ from the reduced $f_{REF}$.

17. The communication apparatus of claim 1, further comprising a frequency divider coupled to the first mixer and the second mixer and configured to reduce the $f_{REF}$ of the local oscillator, the first mixer being further configured to derive the $f_{S,1}$ from the reduced $f_{REF}$, or the second mixer being further configured to derive the $f_{S,2}$ from the reduced $f_{REF}$.

18. The communication apparatus of claim 1, wherein the first mixer comprises an input terminal and an output terminal coupled to the first scaler of the first mixer, the first scaler of the first mixer comprising a plurality of unit cells coupled in parallel to the input terminal, each unit cell comprising a unit cell capacitor, the unit cell capacitor of an $i^{th}$ unit cell having a capacitance ($C_{ui}$), a sum of capacitances of the plurality of unit cells defining a total capacitance ($C_s$), each unit cell comprising a charge transfer switch for coupling the unit cell capacitor of each unit cell to the output terminal, and the first scaler of the first mixer being further configured to control the charge transfer switch of each unit cell for scaling the $X_{IN}$[k] on the basis of the A[k].

19. The communication apparatus of claim 1, wherein the second mixer comprises an input terminal and an output terminal coupled to the second scaler of the second mixer, the second scaler of the second mixer comprising a plurality of unit cells coupled in parallel to the input terminal, each unit cell comprising a unit cell capacitor, the unit cell capacitor of an $i^{th}$ unit cell having a capacitance ($C_{ui}$), a sum of capacitances of the plurality of unit cells defining a total capacitance ($C_s$), each unit cell comprising a charge transfer switch for coupling the unit cell capacitor of each unit cell to the output terminal, and the second scaler of the second mixer being configured to control the charge transfer switch of each unit cell for scaling the $Y_{IN}$[k] on the basis of the B[k].

20. A method for generating an analog output signal ($X_{OUT}$) from an analog input signal ($X_{IN}$) in a first band using a first mixing signal and an analog output signal ($Y_{OUT}$) from an analog input signal ($Y_{IN}$) in a second band using a second mixing signal, the $X_{IN}$ and the $Y_{IN}$ being carrier aggregated, and the method comprising:
providing, by a local oscillator, a reference frequency ($f_{REF}$);
sampling, by a first scaler, the $X_{IN}$ at a plurality of discrete points in time (k) with a first sampling frequency ($f_{S,1}$) to obtain a sampled analog input signal ($X_{IN}$[k]) having a continuous signal value;
generating, by the first scaler, the $X_{OUT}$ having a continuous signal value by scaling the $X_{IN}$[k] on a basis of a plurality of scaling coefficients (A[k]), the A[k] being a time-discrete representation of the first mixing signal, and the $f_{S,1}$ being derived from the $f_{REF}$;
sampling, by a second scalar, the $Y_{IN}$ at the k with a second sampling frequency ($f_{S,2}$) to obtain a sampled analog input signal ($Y_{IN}$[k]) having a continuous signal value; and
generating, by the second scaler, the $Y_{OUT}$ having a continuous signal value by scaling the $Y_{IN}$[k] on a basis of a plurality of scaling coefficients (B[k]), the B[k] being a time-discrete representation of the second mixing signal, the $f_{S,2}$ being derived from the $f_{REF}$, and intermediate frequencies (IFs) of the first mixing signal and the second mixing signal being different.

* * * * *